(12) United States Patent
Joe et al.

(10) Patent No.: US 8,822,054 B2
(45) Date of Patent: *Sep. 2, 2014

(54) BATTERY SYSTEM FOR SECONDARY BATTERY COMPRISING BLENDED CATHODE MATERIAL, AND APPARATUS AND METHOD FOR MANAGING THE SAME

(71) Applicant: LG Chem, Ltd., Seoul (KR)

(72) Inventors: Won-Tae Joe, Daejeon (KR);
Geun-Chang Chung, Daejeon (KR);
Sun-Young Cha, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/969,108

(22) Filed: Aug. 16, 2013

(65) Prior Publication Data

US 2013/0337301 A1    Dec. 19, 2013

Related U.S. Application Data

(63) Continuation of application No. PCT/KR2013/002149, filed on Mar. 15, 2013.

(30) Foreign Application Priority Data

Apr. 13, 2012  (KR) .................. 10-2012-0038779
Mar. 15, 2013  (KR) .................. 10-2013-0028120

(51) Int. Cl.
*H01M 10/48*       (2006.01)
*G01R 31/36*       (2006.01)
*H01M 10/052*      (2010.01)
*H02J 7/00*        (2006.01)

(52) U.S. Cl.
CPC .......... *G01R 31/3624* (2013.01); *Y02E 60/122* (2013.01); *H01M 10/48* (2013.01); *Y02E 60/12* (2013.01); *Y02T 10/7011* (2013.01); *H01M 10/052* (2013.01); *H02J 7/007* (2013.01)
USPC ................... 429/90; 429/92; 320/134

(58) Field of Classification Search
USPC .............. 429/90, 91, 92, 93, 94; 320/134
See application file for complete search history.

(56) References Cited

U.S. PATENT DOCUMENTS

| | | | |
|---|---|---|---|
| 2004/0232884 A1 | 11/2004 | Vaillancourt et al. | |
| 2011/0282604 A1 | 11/2011 | Nagai et al. | |
| 2011/0311872 A1 | 12/2011 | Oh et al. | |
| 2012/0100430 A1 | 4/2012 | Park et al. | |
| 2013/0174370 A1* | 7/2013 | Saruwatari et al. | 15/300.1 |

FOREIGN PATENT DOCUMENTS

| | | |
|---|---|---|
| JP | 2007-250299 A | 9/2007 |
| JP | 2011-238570 A | 11/2011 |
| KR | 10-2008-0068593 A | 7/2008 |
| KR | 10-2011-0097718 A | 8/2011 |

\* cited by examiner

*Primary Examiner* — Mark F Huff
*Assistant Examiner* — Monique Wills
(74) *Attorney, Agent, or Firm* — Birch, Stewart, Kolasch & Birch, LLP

(57) ABSTRACT

Disclosed is a battery system for a secondary battery including a blended cathode material, and an apparatus and method for managing a secondary battery having a blended cathode material. The blended cathode material includes at least a first cathode material and a second cathode material. The first and second cathode materials have different operating voltage ranges. When the secondary battery comes to an idle state or a no-load state, the battery system detects a voltage relaxation occurring by the transfer of operating ions between the first and second cathode materials.

26 Claims, 16 Drawing Sheets

(a)　　　　　(b)　　　　　(c)

BATTERY SYSTEM FOR SECONDARY BATTERY COMPRISING BLENDED CATHODE MATERIAL, AND APPARATUS AND METHOD FOR MANAGING THE SAME

CROSS-REFERENCE TO RELATED APPLICATION

The present application is a continuation of International Application No. PCT/KR2013/002149 filed on Mar. 15, 2013, which claims priority to Korean Patent Application No. 10-2012-0038779 and 10-2013-0028120 filed in the Republic of Korea on Apr. 13, 2012 and Mar. 15, 2013, respectively, the disclosures of which are incorporated herein by reference.

TECHNICAL FIELD

The present disclosure relates to a battery system for a secondary battery comprising a blended cathode material, and an apparatus and method for managing a secondary battery having a blended cathode material.

BACKGROUND ART

A battery generates electric energy by oxidation and reduction reactions and is widely used in various ways. For example, a battery is applied to portable devices such as cellular phones, laptops, digital cameras, video cameras, tablet computers, and electric tools; electric-driven apparatuses such as electric bikes, motor cycles, electric vehicles, hybrid vehicles, electric ships, and electric airplanes; power storage devices used for storing power generated by new regeneration energy or surplus energy; uninterrupted power supplies for stably supplying power to various information communication devices such as server computers and base stations for communication, and so on.

A battery includes three basic components: an anode containing material which is oxidized while emitting electrons during discharge, a cathode containing material which is reduced while accepting electrons during discharge, and an electrolyte allowing the transfer of operating ions between the anode and the cathode.

Batteries may be classified into primary batteries which are not reusable after discharge, and secondary batteries which allow repeated charge and discharge since their electrochemical reaction is at least partially reversible.

The secondary batteries include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries and so on, as well known in the art. Among them, lithium secondary batteries are drawing the most attention due to their high energy density, high battery voltage and long life cycle in comparison to other secondary batteries.

The lithium secondary battery has a distinctive feature in that intercalating and deintercalating reactions of lithium ions occur at a cathode and an anode, respectively. In other words, during discharge, lithium ions are deintercalated from the anode material included in the anode, transferred to the cathode through an electrolyte, and intercalated into the cathode material included in the cathode. During charging, the above processes are performed in reverse order.

In the lithium secondary battery, since the material used as the cathode material greatly influences the performance of the secondary battery, various attempts are being made to provide cathode materials having low production costs and large energy capacity while maintaining high-temperature stability.

DISCLOSURE

Technical Problem

The present disclosure is designed to solve the problems of the prior art, and therefore the present disclosure is directed to revealing an electrochemical reaction mechanism of a blended cathode material which may remedy shortcomings of individual cathode materials by blending at least two kinds of cathode materials.

The present disclosure is also directed to providing a system, apparatus and method, which allows reliable prediction of electrochemical behaviors of the secondary battery containing the blended cathode material by revealing the electrochemical reaction mechanism of the blended cathode material to the level of mathematical modeling.

Technical Solution

In the present disclosure, a blended cathode material includes at least a first cathode material and a second cathode material which have different operating voltage ranges. The first and second cathode materials have different concentrations of operating ions reacting therewith according to the change of voltage and allow voltage relaxation by transferring the operating ions between the first and second cathode materials when coming to an idle state or a no-load state in an intrinsic voltage range. The blended cathode material may be used as a cathode material of a secondary battery which is charged or discharged in a voltage range including the intrinsic voltage range.

Here, the operating ions mean ions performing an electrochemical reaction with the first and second cathode materials when a secondary battery having the blended cathode material is being charged or discharged. The operating ions may vary depending on the kind of the secondary battery. For example, the operating ions may be lithium ions in the case of a lithium secondary battery.

The electrochemical reaction includes oxidation and reduction reactions of the first and second cathode materials accompanied with charging or discharging of the secondary battery and may vary according to an operating mechanism of the secondary battery. In an embodiment, the electrochemical reaction may mean that operating ions are intercalated into or deintercalated from the first cathode material and/or the second cathode material. In this case, the concentration of operating ions intercalated into the first and second cathode materials or the concentration of operating ions deintercalated from the first and second cathode materials may vary according to the change of voltage of the secondary battery. In other words, the first and second cathode materials have different operating voltage ranges as to the operating ions. For example, under the condition where the secondary battery is discharged, at a certain voltage range, operating ions may be preferentially intercalated into the first cathode material rather than the second cathode material, and at another voltage range, it may be the opposite. As another example, under the condition where the secondary battery is charged, at a certain voltage range, operating ions may be preferentially deintercalated from the second cathode material rather than the first cathode material, and at another voltage range, it may be the opposite.

The above idle state means a state in which a high discharge current is drawn from a secondary battery toward a main load of equipment on which the secondary battery is loaded is interrupted, and a minimal discharge current required for an electronic device included in the equipment is drawn from the secondary battery. If the secondary battery comes to an idle state, the discharge current drawn from the secondary battery is very low. When the secondary battery comes to an idle state, the magnitude of the current drawn from the secondary battery may be constant, substantially constant or variable.

For example, the idle state may refer to cases in which (i) a small discharge current is supplied to a computer unit or an audio instrument loaded in an electric vehicle, even though the secondary battery does not supply a discharge current to a motor just after a driver starts the electric vehicle, when a secondary battery is loaded in the electric vehicle; (ii) a driver driving an electric vehicle momentarily stops the electric vehicle at a traffic signal or parks the electric vehicle at a parking lot; (iii) a processor of the information communication device shifts to a sleep mode in order to save energy when an information communication device on which a secondary battery is loaded does not operate for a predetermined time without turning off.

The no-load state means a state in which the capacity of the secondary battery does not substantially change since the secondary battery stops charging or discharging.

The voltage relaxation means a phenomenon in which a potential difference is generated between the first and second cathode materials when the secondary battery comes to an idle state or a no-load state, where the potential differences cause the transfer of operating ions between the cathode materials so that the potential difference decreases as time passes.

Here, the voltage relaxation occurs when the secondary battery including the blended cathode material and being discharged in the intrinsic voltage range shifts to an idle state or a no-load state. If the secondary battery is discharged in the intrinsic voltage range, among the first and second cathode materials, the reaction capacity of the cathode material that more preferentially reacts with operating ions become almost exhausted, and so the other cathode material starts to react with the operating ions.

Under this condition, if the secondary battery shifts to an idle state or a no-load state, operating ions present near the surfaces of the first cathode material and the second cathode material are diffused toward the center of the corresponding cathode material at various diffusion speeds, thereby generating a potential difference between the cathode materials. The generated potential difference causes the transfer of operating ions between the cathode materials and as a result brings a voltage relaxation which eliminates the potential difference of the cathode materials.

Considering the phenomenon of the voltage relaxation, the idle state or the no-load state may also be defined by the following viewpoint. In other words, if a discharge current is drawn from a secondary battery, operating ions are intercalated into the cathode materials. However, if the magnitude of the discharge current is sufficiently small, even though operating ions are intercalated into the cathode materials, the transfer of the operating ions between the cathode materials for the voltage relaxation may maintain.

Therefore, a state in which the flow of a small discharge current does not disturb the occurrence of a voltage relaxation between cathode materials and a state in which a discharge current does not flow may be defined as an idle state or a no-load state, respectively.

In one embodiment, when the secondary battery comes to an idle state or a no-load state, a small current less than 1 c-rate may be drawn from the secondary battery.

In another embodiment, when the secondary battery comes to an idle state or a no-load state, a small current less than 0.5 c-rate may be drawn from the secondary battery.

In still another embodiment, when the secondary battery comes to an idle state or a no-load state, a small current less than 0.1 c-rate may be drawn from the secondary battery.

The magnitude of the small current drawn from the secondary battery may vary according to the kind of a device on which the secondary battery is loaded. For example, in the case the secondary battery is loaded on a hybrid or plugged hybrid vehicle (HEV or PHEV), the c-rate is relatively high, while in the case the secondary battery is loaded on an electric vehicle, the c-rate is relatively low.

The intrinsic voltage range may vary according to various factors such as the kind of first and second cathode materials, the magnitude of charge or discharge current of the secondary battery, a state of the secondary battery when the secondary battery comes to an idle state or a no-load state, or the like.

Here, the 'state' of the secondary battery means an amount of available electric energy stored in the secondary battery and may be 'State Of Charge', without being limited thereto. The State Of Charge is known in the art as a parameter of SOC, and hereinafter the term 'state' means 'State Of Charge or SOC' unless stated otherwise.

The 'state' may express its value quantitatively by using parameters "SOC" and "z". The SOC parameter is used when expressing the 'state' as a percentage value of 0-100%, and the z parameter is used when expressing the 'state' as a numerical value of 0-1.

The intrinsic voltage range may be expressed as a state of the secondary battery in view of the doctrine of equivalents. Therefore, if a secondary battery causes voltage relaxation in a specific state range, it is obvious that the secondary battery operating in the state range is operating in an intrinsic voltage range.

In the present disclosure, the voltage relaxation phenomenon exhibited by the first and second cathode materials in the intrinsic voltage range may occur between the cathode materials satisfying at least one of the following conditions.

For example, the voltage relaxation may occur if, when $dQ/dV$ distribution of the first and second cathode materials is measured, locations and/or intensities of main peaks exhibited in the $dQ/dV$ distribution of the cathode materials are different from each other. Here, the $dQ/dV$ distribution, as well known in the art, means capacity characteristics of the cathode material in accordance with voltages. Therefore, cathode materials whose main peaks exhibited in the $dQ/dV$ distribution have different locations and/or different intensities may be regarded as having different operating voltage ranges. The difference in locations of the main peaks may vary according to the kind of the first and second cathode materials, and for example the locations of the main peaks may be different from each other by 0.1 to 4V.

As another example, the voltage relaxation may occur if, when a discharge resistance is measured at SOCs of 0-100% with respect to the secondary battery including the blended cathode material, a discharge resistance profile has a convex pattern (so-called a protruding shape).

As another example, the voltage relaxation may occur if, when discharge resistance of each SOC is measured with respect to the secondary battery including the blended cathode material, a discharge resistance profile has at least two inflection points before and after the convex pattern.

As another example, the voltage relaxation may occur if the secondary battery including the blended cathode material has a charge or discharge profile with at least one voltage plateau. Here, the voltage plateau means a voltage range where an inflection point is present and a voltage change is so small before and after the inflection point that the voltage looks substantially constant.

In the present disclosure, materials useable as the first and second cathode materials are not specially limited if they may cause voltage relaxation in the intrinsic voltage range.

In an embodiment, the first cathode material may be an alkali metal compound expressed by a general chemical formula $A[A_xM_y]O_{2+z}$ wherein A includes at least one of Li, Na and K; M includes at least one element selected from the group consisting of Ni, Co, Mn, Ca, Mg, Al, Ti, Si, Fe, Mo, V, Zr, Zn, Cu, Al, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the alkali metal compound maintains electrical neutrality.

Alternatively, the first cathode material may be an alkali metal compound expressed by $xLiM^1O_2$-$(1-x)Li_2M^2O_3$ wherein $M^1$ includes at least one element with an average oxidation state of +3; $M^2$ includes at least one element with an average oxidation state of +4; and $0 \leq x \leq 1$, and selectively coated with a carbon layer, an oxide layer and a fluoride layer, which is disclosed in U.S. Pat. No. 6,677,082, U.S. Pat. No. 6,680,143 or the like.

In another embodiment, and the second cathode material may be lithium metal phosphate expressed by a general chemical formula $Li_aM^1_xFe_{1-x}M^2_yP_{1-y}M^3_zO_{4-z}$, wherein $M^1$ includes at least one element selected from the group consisting of Ti, Si, Mn, Co, V, Cr, Mo, Fe, V, Cr, Mo, Ni, Nd, Al, Mg and Al; $M^2$ includes at least one element selected from the group consisting of As, Sb, Si, Ge, V and S; $M^3$ includes at least one element selected from a halogen group containing F; $0<a\leq 2$, $0 \leq x \leq 1$, $0 \leq y \leq 1$, $0 \leq z \leq 1$; and a, x, y, z, and stoichiometric coefficients of the components included in $M^1_x$, $M^2_y$, and $M^3_z$ are selected so that the lithium metal phosphate maintains electrical neutrality, or $Li_3M_2(PO_4)_3$, wherein M includes at least one element selected from the group consisting of Ti, Si, Mn, Co, V, Cr, Mo, Ni, Al, Mg and Al.

In another embodiment, the first cathode material may be an alkali metal compound expressed by $Li[Li_aNi_bCo_cMn_d]O_{2+z}$ ($a \geq 0$; $a+b+c+d=1$; at least one of b, c and d is not zero; $-0.1 \leq z \leq 2$). In addition, the second cathode material may be at least one selected from the group consisting of $LiFePO_4$, $LiMn_xFe_yPO_4$ ($0<x+y\leq1$) and $Li_3Fe_2(PO_4)_3$.

In another embodiment, the first cathode material and/or the second cathode material may include a coating layer. The coating layer may include a carbon layer, or an oxide layer or a fluoride layer containing at least one selected from the group consisting of Ti, Si, Mn, Co, V, Cr, Mo, Fe, Ni, Nd, Al, Mg, Al, As, Sb, Si, Ge, V and S.

In the present disclosure, a blending ratio of the first and second cathode materials may be suitably adjusted according to an electrochemical design condition considering the use of a secondary battery to be manufactured, an electrochemical characteristic of cathode materials required for causing a voltage relaxation between the cathode materials, an intrinsic voltage range where voltage relaxation occurs, or the like.

In addition, the number of cathode materials capable of being included in the blended cathode material is not limited to two. In an embodiment, the blended cathode material may include three kinds of cathode materials different from each other, for example a blended cathode material including $LiMn_2O_4$, $Li[Li_aNi_xCo_yMn_zO_2$ [$a \geq 0$; $x+y+z=1$; at least one of x, y and z is not zero] and $LiFePO_4$. In another embodiment, the blended cathode material may have four kinds of cathode materials different from each other, for example a blended cathode material including $LiNiO_2$, $LiMn_2O_4$, $Li[Li_aNi_xCo_yMn_zO_2$ [$a \geq 0$; $x+y+z=1$; at least one of x, y and z is not zero] and $LiFePO_4$. In addition, in order to improve properties of the blended cathode material, other additives such as a conducting agent and a binder may be added to the blended cathode material without special restriction. Therefore, a blended cathode material including at least two cathode materials capable of causing voltage relaxation at an idle state or a no-load state in the intrinsic voltage range should be interpreted as being within the scope of the present disclosure regardless of the number of cathode materials or the presence of other additives, as obvious to those skilled in the art.

The blended cathode material may be used as a cathode material of a secondary battery loaded on various kinds of electric-driven apparatuses driven by electric energy, and the kind of the electric-driven apparatus is not specially limited.

In an embodiment, the electric-driven apparatus may be a mobile computer device such as a cellular phone, a laptop, and a tablet computer; or a hand-held multimedia device such as a digital camera, a video camera, and an audio/video regenerating device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy, or an uninterrupted power supply for supplying power to various information communication devices such as server computers and mobile communication devices in times of emergency such as a blackout.

In the present disclosure, the secondary battery may be charged or discharged in a voltage range including the intrinsic voltage range where the blended cathode material causes voltage relaxation.

The secondary battery may further include an electrolyte having operating ions. The electrolyte is not specially limited if it has operating ions and may cause an electrochemical oxidation or reduction reaction at the cathode and the anode by means of the operating ions.

The secondary battery may further include a package for sealing the cathode, the anode and the separator. The package is not specially limited if it has chemical and physical stability and mechanical durability.

The appearance of the secondary battery is determined by the structure of the package. The structure of the package may be selected from various structures known in the art and may have structures such as a cylindrical shape, a rectangular shape, a pouch shape, a coin shape or curved shapes thereof, representatively.

According to the present disclosure, the secondary battery may be electrically coupled or connected to a control unit which monitors a voltage characteristic exhibited due to the voltage relaxation. The control unit may detect the occurrence of the voltage relaxation by using the voltage characteristic and optionally estimate a state of the secondary battery corresponding to the voltage relaxation.

In one embodiment, after the secondary battery comes to an idle state or a no-load state while being discharged, the control unit may monitor whether the voltage variance amount of the secondary battery measured during a predetermined measurement time belongs to a critical voltage range which is capable of corresponding to the voltage relaxation. The critical voltage range may vary depending on the blended cathode material and may be set in the range of 50 to 400 mV, without being limited thereto.

If the voltage variance amount belonging to the critical voltage range is monitored, the control unit may indirectly detect that the voltage relaxation occurs in the blended cathode material included in the secondary battery, and optionally quantitatively estimate the state of the secondary battery corresponding to the voltage change of the secondary battery during the measurement time.

In another embodiment, the control unit may monitor whether an inflection point supporting the voltage relaxation occurs in the voltage profile measured after the secondary battery comes to an idle state or a no-load state while being discharged, and/or whether the time taken until the occurrence of the inflection point belongs to a critical time range, and/or whether a slope of the voltage profile at the inflection point belongs to a critical slope range.

When the measured voltage profile has an inflection point, the voltage of the secondary battery may exhibit two voltage rises before and after the inflection point. In this case, the voltage relaxation may be alternatively called two-stage voltage relaxation.

The control unit may indirectly detect the occurrence of the voltage relaxation in the blended cathode material included in the secondary battery and optionally quantitatively estimate a state of the secondary battery corresponding to the voltage change of the secondary battery monitored during the measurement time, if the occurrence of an inflection point is detected in the measured voltage profile, which supports the occurrence of the voltage relaxation, and/or if a voltage profile slope at an inflection point belonging to a critical slope range and/or an inflection point within a critical time range is detected.

In another embodiment, the control unit may monitor whether at least two voltage rises are detected before and after an inflection point which supports the occurrence of voltage relaxation at the voltage profile measured after the secondary battery comes to an idle state or a no-load state while being discharged, and/or whether the voltage variance amount calculated by adding the at least two voltage rises belongs to the critical voltage range, and/or whether the time taken until the occurrence of each voltage rise belongs to the critical time range.

In the measured voltage profile, if at least two voltage rises are detected before and after the inflection point, and/or if the voltage variance amount calculated by adding the at least two voltage rises belongs to the critical voltage range, and/or if the time taken until the occurrence of each voltage rise belongs to the critical time range, the control unit may indirectly detect that voltage relaxation occurs in the blended cathode material included in the secondary battery and may optionally quantitatively estimate a state of the secondary battery corresponding to the voltage change of the secondary battery monitored during the measurement time.

The control unit may be a battery management system (BMS) which may be electrically coupled to a secondary battery, or a control element included in the BMS.

The BMS may be interpreted as meaning a typical BMS in the art, but in the functional point of view, any system capable of performing at least one function disclosed in this specification may be included in the scope of the BMS.

The present disclosure may also provide a secondary battery managing apparatus which may detect the voltage relaxation, connected or coupled to the secondary battery, and optionally estimate a state of the secondary battery corresponding to the voltage relaxation.

The secondary battery managing apparatus may include a BMS electrically connected to the secondary battery in order to estimate a state of the secondary battery.

The BMS may include a sensor configured to measure a current and a voltage of the secondary battery during operation of the secondary battery, and a control unit configured to prepare a voltage profile and optionally a current profile from the measured current and voltage of the secondary battery, detect a voltage relaxation by using the voltage profile, and optionally estimate a state of the secondary battery corresponding to the voltage relaxation.

In another embodiment, the BMS may include a sensor configured to measure a current and a voltage of the secondary battery during operation of the secondary battery, and a control unit configured to detect voltage relaxation of the secondary battery from the change of the measured voltage and optionally estimate a state of the secondary battery corresponding to the voltage relaxation.

The sensor may measure a voltage and a current of the secondary battery for a predetermined measurement time when the secondary battery comes to an idle state or a no-load state while being discharged.

Here, the voltage may mean a voltage between the cathode and the anode of the secondary battery, and the current may mean a discharge current drawn from the secondary battery.

The BMS may include a predefined voltage estimating model. The voltage estimating model may be used for estimating a voltage profile of a secondary battery according to time when the secondary battery comes to an idle state or a no-load state while being discharged.

The BMS may include the voltage estimating model as a software algorithm which is executable by a processor. For example, the voltage estimating model may be composed with program codes and stored in a memory device or executed by the processor.

The control unit may estimate a voltage profile when the secondary battery is in an idle state or a no-load state, by using the voltage estimating model when the voltage relaxation is detected.

In an embodiment, the voltage estimating model may estimate the voltage profile according to time by using the discrete time equations below.

$V_{cell} = V_{cathode}[k] - V_{anode}[k]$ $V_{cathode}[k] = f(V_{c1}[k], V_{c2}[k], i_{cell}[k], R_{0\_relax}, \ldots)$ $V_{anode}[k] = g(V_a[k], i_{cell}[k], \ldots)$ $V_{c1}[k] = OCV_{c1}(z_{c1}[k]) + V_{impedance\_c1}[k]$ $V_{c2}[k] = OCV_{c2}(z_{c2}[k]) + V_{impedance\_c2}[k]$ $V_a[k] = OCV_a(z_a[k]) + V_{impedance\_a}[k]$ In the equations, k is a time index, which is a time parameter which starts from 0 and then increases by 1 whenever a preset time $\Delta t$ passes if the voltage profile starts being estimated.

The $z_{c1}[k]$ is a parameter which decreases from 1 to 0 in inverse proportion to the capacity ratio of already intercalated operating ions into the first cathode material in comparison to a gross capacity of operating ions capable of being intercalated into the first cathode material. Therefore, the $z_{c1}[k]$ may be regarded as a parameter corresponding to the state (SOC) of the first cathode material.

The $z_{c2}[k]$ is a parameter which decreases from 1 to 0 in inverse proportion to the capacity ratio of already intercalated operating ions into the second cathode material in comparison to a gross capacity of operating ions capable of being intercalated into the second cathode material. Therefore, the $z_{c2}[k]$ may be regarded as a parameter corresponding to the state (SOC) of the second cathode material.

The $z_{c1}[k]$ and $z_{c2}[k]$ have a relationship with $z_{cell}[k]$ which is a state of the secondary battery, as follows.

$$z_{cell}[k]=z_{c1}[k]Q^*_{c1}+z_{c2}[k]Q^*_{c2}$$

In this equation, $Q^*_{c1}$ represents a state ratio of the first cathode material, occupied in the state (SOC) of the secondary battery, when $z_{c1}[k]$ becomes 1, namely when operating ions are intercalated into the first cathode material as much as possible. The $Q^*_{c1}$ corresponds to a value obtained by dividing the gross capacity (Ah) of operating ions capable of being intercalated into the first cathode material by the gross capacity (Ah) of operating ions capable of being intercalated into the blended cathode material. Similarly, $Q^*_{c2}$ represents a state ratio of the second cathode material, occupied in the state (SOC) of the secondary battery, when $z_{c2}[k]$ becomes 1, namely when operating ions are intercalated into the second cathode material as much as possible. The $Q^*_{c2}$ corresponds to a value obtained by dividing the gross capacity (Ah) of operating ions capable of being intercalated into the second cathode material by the gross capacity (Ah) of operating ions capable of being intercalated into the blended cathode material.

The $Q^*_{c1}$ and $Q^*_{c2}$ may vary within the range of 0 to 1 according to a operating voltage range of the secondary battery and may be easily calculated through experiments.

The $z_a[k]$ is a parameter which decreases from 1 to 0 in inverse proportion to the capacity ratio of operating ions already deintercalated from the anode material in comparison to a gross capacity of operating ions capable of being deintercalated from the anode material. Therefore, the $z_a[k]$ may be regarded as a parameter corresponding to the state (SOC) of the anode material and is substantially identical to the state $z_{cell}[k]$ of the secondary battery.

The $V_{c1}[k]$ is a voltage component formed by the first cathode material and includes two voltage components, namely an open-circuit voltage component $OCV_{c1}(z_{c1}[k])$ varying according to $z_{c1}[k]$ and an impedance voltage component $V_{impedance\_c1}[k]$ formed by the impedance originating from an electrochemical characteristic of the first cathode material.

The $V_{c2}[k]$ is a voltage component formed by the second cathode material and includes two voltage components, namely an open-circuit voltage component $OCV_{c2}(z_{c2}[k])$ varying according to $z_{c2}[k]$ and an impedance voltage component $V_{impedance\_c2}[k]$ formed by the impedance originating from an electrochemical characteristic of the second cathode material.

The $V_a[k]$ is a voltage component formed by the anode material and includes two voltage components, namely an open-circuit voltage component $OCV_a(z_a[k])$ varying according to $z_a[k]$ and an impedance voltage component $V_{impedance\_a}[k]$ formed by the impedance originating from an electrochemical characteristic of the anode material.

The $i_{cell}[k]$ is a parameter representing current of the secondary battery, which exhibits a discharge current when the secondary battery is being discharged and has a value of 0 or near to 0 when the secondary battery comes to an idle state or a no-load state.

The $R_{0\_relax}$ is a parameter representing a resistance component which disturbs the transfer of operating ions when voltage relaxation occurs between the first and second cathode materials, and its value increases as more operating ions are intercalated into a cathode material (donor) which gives operating ions, when voltage relaxation starts at the secondary battery, and decreases as a cathode material (receiver) which receives operating ions has a greater capacity where operating ions are capable of being intercalated. Therefore, assuming that the first cathode material and the second cathode material are respectively an operating ion receiver and a donor, the $R_{0\_relax}$ may be expressed as a function defined by a relative ratio of the capacity of operating ions already intercalated into the second cathode material in comparison to the capacity of operating ions capable of being intercalated into the first cathode material. This assumption is applied identically to the following disclosure. Since the $R_{0\_relax}$ is a parameter which is considered when the secondary battery comes to an idle state or a no-load state while being discharged in the intrinsic voltage range where the voltage relaxation occurs, if the voltage relaxation does not occur, the $R_{0\_relax}$ may not be considered as a parameter of the function f.

The function f may be obtained from a condition that a part of operating ions, deintercalated from the anode material and moving toward the cathode when the secondary battery is being discharged, is moved to the first cathode material and a remaining part of the operating ions move to the second cathode material and a condition that the $V_{c1}[k]$ and the $V_{c2}[k]$ are identical.

The function g may be obtained from a condition that a discharge current of the secondary battery is proportional to a difference between $V_a[k]$ and $V_{anode}[k]$ when the secondary battery is being discharged and is inversely proportional to the magnitude of impedance present at the anode material.

According to the conditions above, a secondary battery including a blended cathode material may be equivalently analyzed as a circuit model, and the voltage estimating model may be derived from the circuit model.

The circuit model may include an anode material circuit unit corresponding to the anode material and a cathode material circuit unit corresponding to the blended cathode material and connected to the anode material circuit unit in series, and the cathode material circuit unit may include a first cathode material circuit unit and a second cathode material circuit unit connected to each other in parallel.

According to the circuit model, the $V_{impedance\_c1}[k]$, the $V_{impedance\_c2}[k]$ and the $V_{impedance\_a}[k]$ are respectively voltage components formed by impedance respectively present at the first cathode material circuit unit, the second cathode material circuit unit and the anode material circuit unit.

The impedance may include a single circuit element or a plurality of circuit elements selected from the group consisting of one or more resistance component, one or more capacity component, one or more inductor component, and their combinations according to electrochemical characteristics of the first and second cathode materials and the anode material. The impedance may include an RC circuit and/or a resistor, as an example. When the impedance includes the RC circuit and the resistor, the RC circuit and the resistor may be connected in series.

The $V_{impedance\_c1}[k]$, the $V_{impedance\_c2}[k]$ and the $V_{impedance\_a}[k]$ may be calculated from an impedance voltage calculation equation which may be derived from a general circuit theory. Circuit elements included in the impedance may be connected in series and/or in parallel according to electrochemical properties of the first and second cathode materials and the anode material. In the case an RC circuit is included in the impedance, voltage formed by the RC circuit may be regarded as varying according to time by a discrete time equation as follows.

$$V[k+1] = V[k]e^{-\frac{\Delta t}{RC}} + R\left(1 - e^{-\frac{\Delta t}{RC}}\right)i[k]$$

When analyzing electrochemical behaviors of the secondary battery where the voltage relaxation occurs by using the circuit model, the $R_{0\_relax}$ may be considered as a serial resistance component present between the first cathode material circuit unit and the second cathode material circuit unit. In this case, the $R_{0\_relax}$ may be considered as a serial resistance component separately present between the first cathode material circuit unit and the second cathode material circuit unit or a serial resistance component included in the impedance present at the first cathode material circuit unit and/or the second cathode material circuit unit.

The $OCV_{c1}$, $OCV_{c1}$ and $OCV_a$ are operators which convert states $z_{c1}[k]$, $z_{c2}[k]$ and $z_a[k]$ of the first cathode material, the second cathode material and the anode material into open-circuit voltage components of the first cathode material, the second cathode material and the anode material.

The operator may be a look-up table which allows reciprocal reference between the 'state' and the 'open-circuit voltage' or a look-up function where a relationship between the 'state' and the 'open-circuit voltage' is defined as a mathematical function.

The look-up table or the look-up function may be obtained by measuring an open-circuit voltage according to the change of state after making a half cell by using the first cathode material, the second cathode material and the anode material.

Regardless of the fact that the resistance component $R_{0\_relax}$ is included in the circuit model, whenever k increases, the voltage estimating model updates $z_{c1}[k]$, $z_{c2}[k]$ and $z_a[k]$ to $z_{c1}[k+1]$, $z_{c2}[k+1]$ and $z_a[k+1]$, respectively, by the ampere-counting method (see the equations below) during the time $\Delta t$, updates the $V_{impedance\_c1}[k]$, the $V_{impedance\_c2}[k]$ and the $V_{impedance\_a}[k]$ to $V_{impedance\_c1}[k+1]$, the $V_{impedance\_c2}[k+1]$ and the $V_{impedance\_a}[k+1]$, respectively, by using an impedance voltage calculation equation derived from the circuit theory, and estimates $V_{cell}[k+1]$ by calculating $V_{cathode}[k+1]$ and $V_{anode}[k+1]$ by using the updated values.

$z_{c1}[k+1] = z_{c1}[k] + i_{c1}[k]\Delta t/Q_{c1}$ $z_{c2}[k+1] = z_{c2}[k] + i_{c2}[k]\Delta t/Q_{c2}$ $z_a[k+1] = z_a[k] - i_a[k]\Delta t/Q_a = z_a[k] - i_{cell}[k]\Delta t/Q_a$ In the equations, $i_{c1}[k]$ represents a current flowing through the first cathode material circuit unit while operating ions are being intercalated into the first cathode material and may be calculated from the open-circuit voltage component $OCV_{c1}(z_{c1}[k])$ and the impedance voltage component $V_{impedance\_c1}[k]$ of the first cathode material. Similarly, the $i_{c2}[k]$ represents a current flowing through the second cathode material circuit unit while operating ions are being intercalated into the second cathode material and may be calculated from the open-circuit voltage component $OCV_{c2}(z_{c2}[k])$ and the impedance voltage component $V_{impedance\_c2}[k]$ of the second cathode material. In addition, the $i_a[k]$ represents a current flowing through the anode material circuit unit as operating ions are deintercalated from the anode material and is identical to the current $i_{cell}[k]$ of the secondary battery, and the $i_{cell}[k]$ may be measured whenever k increases. In addition, $Q_{c1}$ and $Q_{c2}$ are respectively parameters representing gross capacities (Ah) of the first cathode material and the second cathode material where operating ions may be intercalated, and $Q_a$ is a parameter representing a gross capacity (Ah) of the anode material where operating ions may be deintercalated therefrom. The $i_{c1}[k]$ and the $i_{c2}[k]$ have negative values when the secondary battery is being discharged and have positive values when the secondary battery is being charged. In addition, the $i_a[k]$ and the $i_{cell}[k]$ have positive values when the secondary battery is being discharged and have negative values when the secondary battery is being charged.

The voltage profile estimated by the voltage estimating model exhibits different change patterns depending on the initial conditions $V_{impedance\_c1}[0]$, $V_{impedance\_c2}[0]$, $V_{impedance\_a}[0]$, $z_{c1}[0]$, $z_{c2}[0]$ and $z_a[0]$ as well as the magnitude of $R_{0\_relax}$ which is considered when voltage relaxation occurs in the secondary battery.

However, since $i_{cell}[0]$ has a value of 0 or near to 0 just after the secondary battery comes to an idle state or a no-load state, the voltage components $V_{impedance\_c1}[0]$, $V_{impedance\_c2}[0]$ and $V_{impedance\_a}[0]$ formed by the impedance present at the first and second cathode materials circuit unit and the anode material circuit unit may be assumed to have a small value near to 0. In addition, $z_a[0]$ substantially corresponds to $z_{cell}[0]$ just after the secondary battery comes to an idle state or a no-load state. Therefore, by regarding the voltage $V_{cell}[0]$ measured just after the secondary battery comes to an idle state or a no-load state as an open-circuit voltage and using the look-up table or the look-up function where a relationship between the open-circuit voltage and the state of the secondary battery is defined in advance through experiments, the state of the secondary battery corresponding to the voltage $V_{cell}[0]$ may be obtained and allocated to the initial condition $z_a[0]$.

Therefore, the changing pattern of the voltage profile estimated by the voltage estimating model may be regarded as being dependant on the initial conditions $z_{c1}[0]$ and $z_{c2}[0]$ as well as the magnitude of $R_{0\_relax}$. In addition, since the magnitude of $R_{0\_relax}$ has relations with the amount of operating ions intercalated into the first and second cathode materials just after the secondary battery comes to an idle state or a no-load state as described above, it may be understood that the changing pattern of the voltage profile estimated by the voltage estimating model will change mainly according to the initial conditions $z_{c1}[0]$ and $z_{c2}[0]$.

In an embodiment, if the occurrence of voltage relaxation is detected from the voltage profile measured after the secondary battery comes to an idle state or a no-load state, the control unit may obtain a plurality of estimated profiles with respect to the voltage of the secondary battery by repeatedly applying the voltage estimating model to each combination $(z_{c1}[0], z_{c2}[0], R_{0\_relax})_p$ while varying the values allocated to the initial conditions $z_{c1}[0]$ and $z_{c2}[0]$ and the value of $R_{0\_relax}$ estimated therefrom. At this time, the initial conditions $V_{impedance\_c1}[0]$, $V_{impedance\_c2}[0]$, $V_{impedance\_a}[0]$, and $z_a[0]$ may be set under the above conditions. Meanwhile, when changing the $z_{c1}[0]_p$ and $z_{c2}[0]_p$, it is possible to fix one and change the other or to change both of them. When any one of the $z_{c1}[0]_p$ and $z_{c2}[0]_p$ is fixed, the fixed value is preferably set near a border value where the voltage relaxation starts occurring. The border value may be set as a value calculated in advance through experiments.

In addition, the control unit may identify an approximate estimated profile matched with the measured voltage profile, namely having a smallest error, from a plurality of estimated profiles, and estimate a state of the secondary battery by using the initial conditions $z^*_{c1}[0]$ and $z^*_{c1}[0]$ which have been used for obtaining the approximate estimated profile.

$$z_{cell} = z^*_{c1}0]Q^*_{c1} + z^*_{c1}0]Q^*_{c2}$$

In another embodiment of the present disclosure, the control unit may calculate a characteristic exhibited in the voltage profile when voltage relaxation is detected as at least one reference parameter, and estimate a state of the secondary battery corresponding to the calculated reference parameter with reference to the look-up table where a relationship between the reference parameter and the state of the secondary battery are defined in advance through experiments.

The reference parameter may include any parameter if it may define a shape of the voltage profile having an inflection point. For example, the reference parameter includes a voltage at the inflection point occurring in the voltage profile, a time taken until the inflection point occurs, a voltage variance amount obtained by adding voltage changes before and after the inflection point, a slope of the voltage profile (a first-order differential value) calculated at the inflection point, a value obtained by integrating the voltage profile between a specific point before the inflection point and a specific point after the inflection point, a first-order differential value or second-order differential value of the voltage profile calculated at a specific point before the inflection point and/or a specific point after the inflection point, or their combinations. The reference parameter is an element defining the shape of the voltage profile having an inflection point. Therefore, the greater the number of reference parameters, the more accurate the shape of the voltage profile may be defined.

According to another aspect of the present disclosure, the relationship between at least one reference parameter included in the look-up table and the state of the secondary battery may be converted into a look-up function by numerical analysis. The look-up function means a function which uses at least one reference parameter and a state of the secondary battery corresponding thereto as an input parameter and an output parameter, respectively.

In this case, the control unit may calculate a characteristic exhibited in the voltage profile when voltage relaxation is detected as at least one reference parameter, and estimate a state of the secondary battery corresponding to the calculated reference parameter by putting the reference parameter as an input parameter to the look-up function where the relationship between the reference parameter and the state of the secondary battery is defined in advance.

According to another embodiment of the present disclosure, the control unit may analyze the voltage measured by the sensor in real time, and then, if the calculated inflection point parameter corresponds to a condition under which voltage relaxation is detected, the control unit may estimate a state of the secondary battery by using the calculated inflection point parameter at that time, a voltage measured when the condition under which voltage relaxation is detected is established, a time when the voltage is measured, or the like.

For example, whenever a voltage is measured by the sensor, the control unit may receive the voltage value from the sensor and calculate a first-order differential value or a second-order differential value of the voltage value with respect to the measurement time as an inflection point parameter, and then, if a condition under which the first-order differential value becomes maximum or the second-order differential value becomes zero is established, the control unit may determine the maximum value of the first-order differential value and/or the time taken until the condition is established and/or a voltage when the condition is established as a reference parameter and estimate a state of the secondary battery by using the determined reference parameter.

Here, the inflection point parameter represents a parameter by which an inflection point may be identified in real time in the changing pattern of a voltage, and the above descriptions are just examples. Therefore, any parameter by which an inflection point occurring in the changing pattern of the voltage measured by the sensor 120 may be identified in real time may be determined as the inflection point parameter.

According to another aspect of the present disclosure, the control unit may update the state of the secondary battery, estimated before the secondary battery comes to an idle state or a no-load state, to the state of the secondary battery, estimated by the above method.

According to another aspect of the present disclosure, the control unit may be electrically connected to a display unit and display the state of the secondary battery estimated at an idle state or a no-load state as a graphic interface through the display unit.

The graphic interface is an interface visually displaying the state of the secondary battery, and its kind is not specially limited. The graphic interface may adopt displaying the state of the secondary battery with the length of a bar graph, displaying the state of the secondary battery with gauge pointers, displaying the state of the secondary battery with numerals, or the like, without being limited thereto.

According to another aspect of the present disclosure, the control unit may be electrically connected to a storage unit and may maintain the voltage data and/or the current data provided by the sensor and the estimated state of the secondary battery in the storage unit.

Here, the maintaining work means storing and updating data in the storage unit. The control unit may output the state of the secondary battery, which is maintained in the storage unit, as a graphic interface through the display unit.

The present disclosure may also provide a method for managing a secondary battery including a cathode having a first cathode material and a second cathode material, which includes different operating voltage ranges, an anode, and a separator.

The secondary battery managing method includes obtaining a current and a voltage of the secondary battery during operation of the secondary battery over a predetermined amount of time; preparing a voltage profile and optionally a current profile from the measured current and voltage of the secondary battery; detecting a voltage relaxation during operation of the secondary battery, said voltage relaxation being induced by the transfer of operating ions between the first and second cathode active materials when the secondary battery comes to an idle state or a no-load state; and if a voltage relaxation is detected, estimating a state of charge (SOC) using the voltage profiles of the secondary battery.

The present disclosure may also provide a method for manufacturing the secondary battery described above. The secondary battery manufacturing method may include at least a process of preparing the blended cathode material where at least first and second cathode materials are blended. The first and second cathode materials are selected to have different operating voltage ranges and allow voltage relaxation by transferring the operating ions between the first and second cathode materials when the secondary battery comes to an idle state or a no-load state in an intrinsic voltage range.

The kind and blending ratio of the first and second cathode materials may be determined according to the kind of the secondary battery, and available commercial cathode materials may be used without restriction. In addition, in order to improve electrochemical characteristics of the blended cathode material, cathode materials other than the first and second cathode materials may be added to the blended cathode material without restriction.

The secondary battery manufacturing method may further include a process of forming slurry containing the blended cathode material and other additives, for example a conducting agent, a binder and an organic solvent.

The secondary battery manufacturing method may further include a process of forming a cathode material coating layer on a metallic current collector by coating at least one surface of the metallic current collector with the slurry and then drying and compressing the same.

The secondary battery manufacturing method may further include a process of forming an anode and a process of packaging the secondary battery.

The secondary battery manufacturing method may further include a process of activating (formation) the secondary battery to be capable of being charged or discharged in a voltage range including the intrinsic voltage range.

Meanwhile, the technical spirit of the present disclosure may be similarly applied to a case in which the cathode has a single cathode material and the anode has two or more anode materials.

In this case, the voltage relaxation may occur when a secondary battery comes to an idle state or a no-load state while being charged. Here, the no-load state means a state in which a charge current is 0, and the idle state is defined above.

In an embodiment, the anode of the secondary battery may include first and second anode materials having different operating voltage ranges, and the first anode material may be activated at a lower voltage range (or, at a low level of SOC) than the second anode material. In other words, if the secondary battery has a low voltage, operating ions may be mainly intercalated into the first anode material, while if the secondary battery has a high voltage, operating ions may be mainly intercalated into the second anode material.

In this case, if the SOC of a secondary battery in a charge mode starts increasing from 0%, operating ions are mainly intercalated into the first anode material. In addition, if the SOC of the secondary battery increases until the capacity of the first anode material to which operating ions may be intercalated is mostly used, the resistance of the first anode material rapidly increases, and operating ions start being intercalated into the second anode material. Moreover, if the secondary battery comes to an idle state or a no-load state after operating ions are intercalated into the second anode material to some extent, a potential difference is created between the first anode material and the second anode material, which may cause a voltage relaxation in which the operating ions intercalated into the second anode material are transferred to the first anode material.

Generally, if the charging process stops, the voltage of the secondary battery represent a decreasing pattern while converging toward the open-circuit voltage. However, if a voltage relaxation occurs, the voltage of the secondary battery converges toward the open-circuit voltage while exhibiting a voltage decreasing pattern including an inflection point.

Therefore, if a voltage profile of a secondary battery is measured when the secondary battery comes to an idle state or a no-load state while being charged, a voltage relaxation may be detected from the measured voltage profile, and optionally a state of the secondary battery may be estimated from the voltage profile by using a voltage estimating model derived from the circuit model.

In order to detect the occurrence of a voltage relaxation, various methods described above may be applied. In addition, the circuit model described above may be easily changed by those skilled in the art by considering that blended anode materials are included in the anode of the secondary battery and a single cathode material is included in the cathode of the secondary battery. In other words, the circuit model used for deriving the voltage estimating model may be replaced with a circuit model including an anode material circuit unit having a first anode material circuit unit and a second anode material circuit unit and a cathode material circuit unit, and the current flowing on each circuit unit and the voltage formed at a circuit element included in each circuit unit may be reinterpreted in light of charging the secondary battery including the blended anode materials, as obvious to those skilled in the art.

In addition, the technical spirit of the present disclosure may also be similarly applied to a case in which blended cathode materials and blended anode materials are respectively included in the cathode and the anode of the secondary battery.

In this case, a voltage relaxation may occur in both the discharge mode and the charge mode. In other words, the voltage relaxation may occur when a secondary battery in the discharge mode comes to an idle state or a no-load state in a voltage range in which a voltage relaxation may occur or when a secondary battery in the charge mode comes to an idle state or a no-load state in a voltage range in which a voltage relaxation may occur.

The voltage relaxation occurring in the discharge mode or the charge mode may be detected by measuring a voltage profile of the secondary battery. In addition, optionally, a state of the secondary battery may be estimated from the measured voltage profile by using the voltage estimating model according to the present disclosure.

The circuit model used for deriving the voltage estimating model may be replaced with a circuit model including an anode material circuit unit having a first anode material circuit unit and a second anode material circuit unit and a cathode material circuit unit having a first cathode material circuit unit and a second cathode material circuit unit, and the current flowing on each circuit unit and the voltage formed at a circuit element included in each circuit unit may be reinterpreted in light of charging or discharging the secondary battery including the blended cathode materials and the blended anode materials.

Advantageous Effects

According to an aspect of the present disclosure, it is possible to quantitatively and qualitatively understand a voltage relaxation phenomenon which is a specific voltage behavior when mixing cathode materials with different operating voltage ranges. Therefore, it is possible to commercially use a blended cathode material in a voltage range where charge/discharge control is not easily implemented due to a distinct voltage behavior caused by the voltage relaxation phenomenon.

According to another aspect of the present disclosure, it is possible to estimate a state of a secondary battery in an intrinsic voltage range where a distinct voltage behavior occurs due to the voltage relaxation. Therefore, cathode materials, which were not capable of blending due to the distinct voltage behavior, may be blended into various combinations. In addition, by selecting two or more cathode materials among various kinds of available cathode materials and blending them into various combinations according to the purpose of a secondary battery, it is possible to provide a blended cathode material most appropriately optimized for the purpose of the secondary battery.

According to another aspect of the present disclosure, the distinct voltage behavior becomes a factor which does not allow various adjustment of a blending ratio of the blended cathode material. However, since the distinct voltage behavior may be accurately interpreted, a mixture ratio of cathode materials included in the blended cathode material may be adjusted in various ways according to the purpose of the secondary battery.

According to another aspect of the present disclosure, it is possible to accurately estimate a state of the secondary battery in the intrinsic voltage range exhibiting the distinct voltage behavior.

According to another aspect of the present disclosure, when a secondary battery comes to an idle state or a no-load state, the state of the secondary battery may be updated by using the state of the secondary battery estimated in the intrinsic voltage range. Therefore, an error accumulated while estimating a state of the secondary battery may be eliminated.

According to another aspect of the present disclosure, since various cathode materials may be blended with various compositions and at various ratios according to the purpose of a secondary battery, it is possible to dynamically deal with the diversification of cathode material or requirements of the technical fields to be recently in the limelight such as electric vehicles or power storage devices.

According to another aspect of the present disclosure, by providing not only the blended cathode material but also a secondary battery having the same, a method for manufacturing the same, and a method and apparatus for estimating a state of a secondary battery having the blended cathode material, it is possible to give a total solution required for commercially using the blended cathode material.

DESCRIPTION OF DRAWINGS

The accompanying drawing illustrates a preferred embodiment of the present disclosure and together with the foregoing disclosure, serves to provide further understanding of the technical spirit of the present disclosure. However, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below are based on cases where the present disclosure is applied to a lithium secondary battery. Here, the lithium secondary battery is a general name of a secondary battery where lithium ions serve as operating ions during charge and discharge to cause electrochemical reactions at a cathode and an anode. The operating ions mean ions participating in electrochemical oxidizing and reducing reactions while the secondary battery is charged or discharged, and may be for example lithium. Therefore, even though secondary batteries are called differently according to the kind of electrolyte or separator used in the lithium secondary battery, the kind of package used for packing the secondary battery, or the internal or external structure of the lithium secondary battery, such secondary batteries should be interpreted as being included in the scope of the lithium secondary battery if lithium ions are used as operating ions.

In addition, the present disclosure may also be applied to kinds of secondary batteries other than the lithium secondary batteries. Therefore, all kinds of secondary batteries should be interpreted as being included in the scope of the present disclosure if the spirit of the present disclosure may be applied even though their operating ion is not a lithium ion. In some embodiments, the term "secondary battery" is used instead of "lithium secondary battery" and in this case, it should be understood that the term has a meaning including various kinds of secondary batteries in the corresponding embodiment.

Moreover, the secondary battery is not limited to the number of its components. Therefore, the secondary battery should be interpreted as including a unit cell having an anode, an electrolyte and a cathode as a basic unit, an assembly of unit cells, a module having a plurality of assemblies connected in series in/or in parallel, a pack having a plurality of modules connected in series in/or in parallel, a battery system having a plurality of packs connected in series in/or in parallel, or the like.

Figure 1:
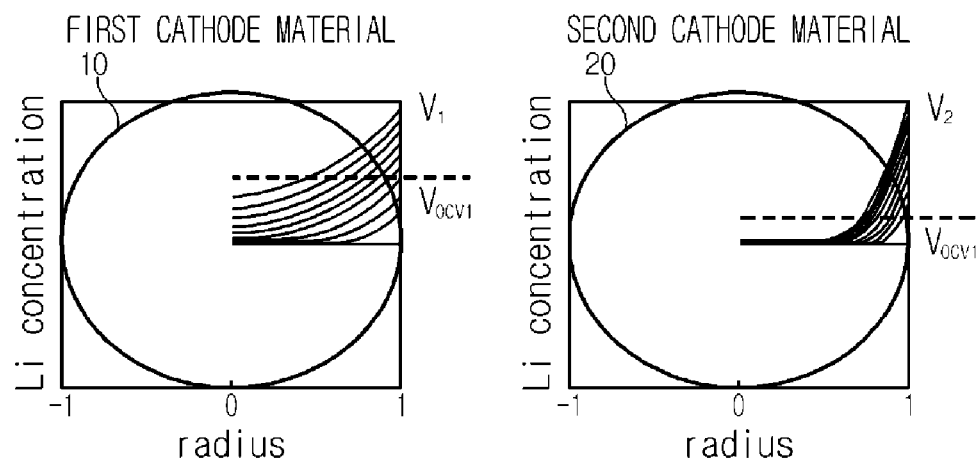
FIG. 1 is a diagram for illustrating a voltage relaxation phenomenon occurring in a secondary battery having a blended cathode material.

FIG. 1 is a diagram for illustrating a voltage relaxation phenomenon occurring in a blended cathode material according to the present disclosure. In detail, FIG. 1 depicts that a voltage relaxation occurs between cathode materials when a secondary battery including a blended cathode material, where two cathode materials having different degrees of reaction with lithium ions serving as operating ions of a lithium secondary battery (namely, having different operating voltage ranges) are blended, is discharged in an intrinsic voltage range and comes to a no-load state while being discharged.

As shown in FIG. 1, while the lithium secondary battery is discharged, lithium ions electrochemically react with a first cathode material 10 and a second cathode material 20. The electrochemical reaction means that the lithium ions are intercalated into the first and second cathode materials 10, 20 or deintercalated therefrom. Since the electrochemical reaction may be varied according to an operating mechanism of the lithium secondary battery, the present disclosure is not limited to a reaction type of operating ions.

The first and second cathode materials 10, 20 have different reaction concentrations of lithium ions reacting therewith according to the change of voltage. In other words, the first and second cathode materials 10, 20 have different operating voltage ranges. For example, under the condition where the secondary battery is discharged, in a certain voltage range, lithium ions may be preferentially intercalated into the first cathode material 10 rather than the second cathode material 20, and at another voltage range, it may be the opposite. As another example, under the condition where the lithium secondary battery is charged, in a certain voltage range, operating ions may be preferentially de-intercalated from the second cathode material 20 rather than the first cathode material 10, and at another voltage range, it may be the opposite.

FIG. 1 shows an example where the concentration of lithium ions reacting with the first cathode material 10 is greater than the concentration of lithium ions reacting with the second cathode material 20 when the lithium secondary battery is discharged. If the voltage of the lithium secondary battery varies, the reaction concentrations of lithium ions reacting with the first and second cathode materials 10, 20 may be reversed.

The lithium ions intercalated into the first and second cathode materials 10, 20 diffuse into the cathode materials, and in this process a lithium ion concentration deviation occurs near and in the surface of the cathode materials. The black solid lines represent the change of lithium concentration inside the cathode materials or near their surfaces, and it may be understood that the concentration of lithium ions is greater near the surface than the inside of the first and second cathode materials 10, 20 in both cases, and the concentration of lithium ions gets smaller from the vicinity of the surface to the inside. The voltage of the secondary battery measured when the lithium secondary battery is discharged is generally determined by the concentration of lithium ions present near the surface of the cathode material. In addition, in view of electric potential, when the lithium secondary battery is in a discharge mode, surface potentials $V_1$, $V_2$ of the first and second cathode materials 10, 20 have no significant difference. In the art, the voltage measured when a lithium secondary battery is discharged is called a dynamic voltage.

Meanwhile, if the lithium secondary battery comes to a no-load state, the reaction of the first and second cathode materials 10, 20 with lithium ions stops, and lithium ions are diffused in the first and second cathode materials 10, 20 due to the deviation of lithium ion concentration. Therefore, if the no-load state is maintained for a predetermined time, the voltage of the lithium secondary battery is determined according to the average concentration of lithium ions present in the first and second cathode materials 10, 20. Further, in view point of electric potential, the potential $V_{OCV1}$ of the first cathode material 10 marked by a dotted line becomes higher than the potential $V_{OCV2}$ of the second cathode material 20 marked by a dotted line, and the difference between the potentials $V_{OCV1}$ and $V_{OCV2}$ increases as the no-load state is maintained longer. Hereinafter, the voltage measured when the secondary battery comes to a no-load state is called a no-load voltage.

In the present disclosure, the no-load state means a state where the secondary battery stops charging or discharging and so the capacity of the secondary battery is substantially not changing or the change is negligible. If the change of the capacity of the secondary battery is negligible when the secondary battery is in an idle state, the idle state may also be regarded as being substantially equivalent to the no-load state.

As described above, if the potentials $V_{OCV1}$ and $V_{OCV2}$ of the first and second cathode materials 10, 20 are different in the condition that the lithium secondary battery is in the no-load state, a potential difference is generated between the first and second cathode materials 10, 20, and if the potential difference increases so much to cause the transfer of lithium ions, lithium ions start to move from the second cathode material 20 to the first cathode material 10. If lithium ions move between the cathode materials, the potential of the second cathode material 20 giving lithium ions increases, and the potential of the first cathode material 10 receiving lithium ions decreases. The second cathode material 20 is charged (the potential increases) as lithium ions escape, and the first cathode material 10 is discharged (the potential decreases) as lithium ions are intercalated. If lithium ions move between the first and second cathode materials 10, 20 as described above, the potential difference between the first and second cathode materials 10, 20 slowly decreases, and at an equilibrium state where lithium ions no longer move further, the first and second cathode materials 10, 20 have identical potential.

In the present disclosure, the concept 'voltage relaxation' may be defined by peculiar electrochemical behaviors of the blended cathode material as described above. In other words, the 'voltage relaxation' may be defined as a following phenomenon: when a lithium secondary battery in a discharg mode comes to an idle state or a no-load state, lithium ions are diffused in the first and second cathode materials 10, 20 included in the blended cathode material, the diffused lithium ions cause a potential difference between the first and second cathode materials 10, 20, and the potential difference causes transfer of lithium ions between the cathode materials, thereby slowly decreasing the potential difference.

However, the voltage relaxation phenomenon is generated in a partial voltage range, not in the entire voltage range where a lithium secondary battery having the blended cathode material is discharged. In other words, when the lithium secondary battery comes to an idle state or a no-load state while being discharged in the partial voltage range, the voltage relaxation phenomenon is generated. The partial voltage range may be changed according to various factors such as the kind or blending ratio of the first and second cathode materials 10, 20, an magnitude of a discharge current, a state (SOC) of the secondary when the secondary battery comes to the idle state or the no-load state, but in view of the blended cathode material, the partial voltage range corresponds to an inherent voltage range of each blended cathode material. Therefore, the partial voltage range where the voltage relaxation phenomenon occurs will be called an 'intrinsic voltage range'.

If the lithium secondary battery is discharged in the intrinsic voltage range, among the first and second cathode materials 10, 20, the first cathode material 10 easily reacting with lithium ions is almost completely reacted with lithium ions. Therefore, in view of lithium ions, it is difficult to react with the first cathode material 10. In other words, if a dynamic voltage is within the intrinsic voltage range while the lithium secondary battery is being discharged, the resistance of the first cathode material 10 rapidly increases, and as a result the resistance of the second cathode material 20 relatively decreases in comparison to the first cathode material 10. Therefore, lithium ions react with the second cathode material 20 having relatively low resistance and start to be intercalated into the second cathode material 20. If this situation is maintained for a predetermined time and then the lithium secondary battery comes to an idle state or a no-load state when the concentration of lithium ions mainly present near the surface of the second cathode material 20 increases to some extent, the voltage relaxation phenomenon described above occurs. In other words, the voltage relaxation phenomenon may be regarded as occurring if the lithium secondary battery comes to the idle state or the no-load state at an early stage where most of the capacity of the first cathode material 10 for intercalation of lithium ions is exhausted and the second cathode material 20 starts reacting with lithium ions.

Figure 2:
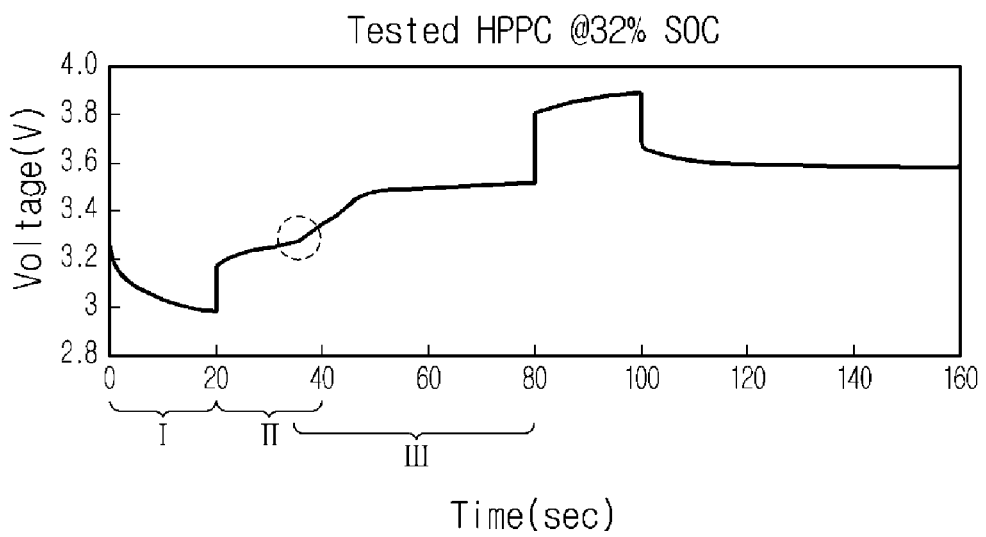
FIG. 2 is a graph showing a voltage change pattern of a secondary battery when the secondary battery comes to a no-load state in an intrinsic voltage range where voltage relaxation occurs.

FIG. 2 is a graph showing the pattern of no-load voltage changing according to time when a lithium secondary battery including a blended cathode material where a lithium transition metal oxide $Li_{1+x}Ni_aCo_bMn_cO_2$ (x≥0; a=b=c=⅓; hereinafter, referred to as an NMC cathode material) having a layered structure as the first cathode material and $LiFePO_4$ (referred to as an LFP cathode material) having an olivine structure as the second cathode material are blended at a ratio of 7:3 (weight ratio) comes to a no-load state while being discharged from 3.2V (SOC 32%) belonging to the intrinsic voltage range near to 3V.

Referring to FIG. 2, the changing pattern of the no-load voltage of the lithium secondary battery may be divided into first to third regions (I, II and III) in general for consideration.

In the first region (I), a dynamic voltage of a lithium secondary battery having a voltage of 3.2V (SOC 32%) slowly decreases while the lithium secondary battery is being discharged near to 3V. If the lithium secondary battery has a dynamic voltage of 3.2V, the capacity of the first cathode material does not have much room for intercalation of lithium ions. Therefore, if the lithium secondary battery is discharged from 3.2V to 3.0V, the lithium ions mostly react with the second cathode material rather than with the first cathode material, and so the concentration of lithium ions near the surface of the second cathode material increases.

In the second region (II), the lithium secondary battery comes to a no-load state while discharging stops near 3.0V, and the no-load voltage of the lithium secondary battery slowly increases as lithium ions are diffused in the first and second cathode materials of the blended cathode material.

Meanwhile, at a border of the first region (I) and the second region (II), the no-load voltage of the lithium secondary battery rapidly increases because an IR drop voltage substantially becomes 0 (zero) as the lithium secondary battery stops discharging. In other words, if the lithium secondary battery stops discharging, a voltage drop caused by the IR drop phenomenon disappears, and the no-load voltage of the lithium secondary battery increases as much as the IR voltage drop.

In the third region (III), as lithium ions are diffused in the first and second cathode materials, a potential difference is generated between the cathode materials, operating ions are transferred between the cathode materials due to the generated potential difference to cause a voltage relaxation phenomenon, and as the voltage relaxation of the cathode materials progresses, the no-load voltage of the lithium secondary battery slowly increases near to 3.5V corresponding to an equilibrium voltage. Here, the equilibrium voltage means a voltage at which the no-load voltage of the lithium secondary battery does not substantially change.

Meanwhile, the second region (II) and the third region (III) are represented to partially overlap each other since operating ions causing voltage relaxation between the cathode materials start transferring before lithium ions are 'completely' diffused in the cathode materials (namely, before the second region ends) and so a border between the second region (II) and the third region (III) may not be clearly distinguished.

In FIG. 2, it should be noted that an inflection point (marked with a dotted circle) is present between the second region (II) and the third region (III). This supports that a dominating electrochemical mechanism causing the increase of a no-load voltage changes before or after the appearance of the inflection point, while the no-load voltage of the lithium secondary battery increases to 3.5V corresponding to the equilibrium voltage after the lithium secondary battery stops discharging. Here, the term 'dominating' means that a certain electrochemical mechanism is superior to other electrochemical mechanism. In other words, it may be regarded that the no-load voltage of the lithium secondary battery generally increases due to the diffusion of lithium ions in the cathode materials before the inflection point appears, and the no-load voltage of the lithium secondary battery generally increases due to voltage relaxation of the cathode materials caused by the transfer of operating ions between the cathode materials after the inflection point appears.

The voltage changing pattern shown in FIG. 2 shows two-stage voltage rises. A first-stage voltage rise occurs before an inflection point appears, and a second-stage voltage rise occurs after the inflection point appears. Therefore, voltage relaxation of a secondary battery including a blended cathode material in a cathode, which exhibits the voltage changing pattern as shown in FIG. 2, may be called two-stage voltage relaxation.

Figure 3:
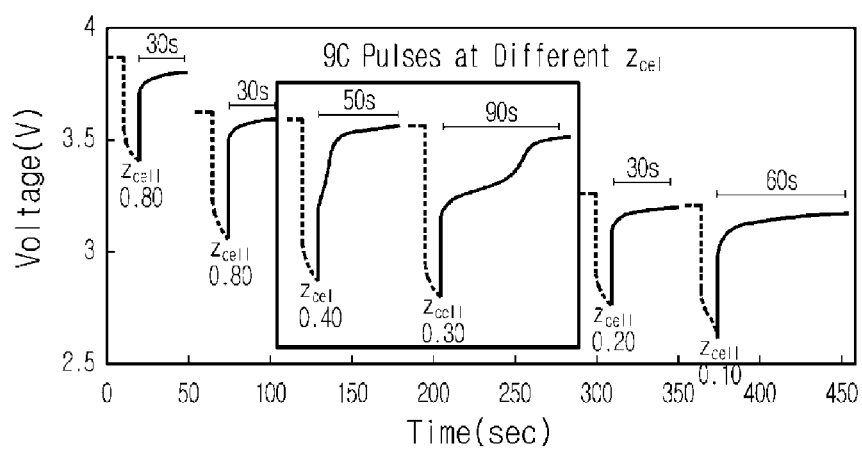
FIG. 3 is a graph showing that the voltage change pattern of the secondary battery exhibited due to the occurrence of voltage relaxation changes according to a state of the secondary battery.

FIG. 3 is a graph showing the change of no-load voltage of the lithium secondary battery under each SOC condition when discharging is stopped after performing 9C pulse discharge within a short time while changing a state $z_{c1}$ of the lithium secondary battery having a blended cathode material where an NMC cathode material and an LFP cathode material are blended at a ratio of 7:3 (weight ratio) variously to 0.90, 0.80, 0.40, 0.30, 0.20 and 0.10. In FIG. 3, $z_{cell}$ represents a state of the lithium secondary battery. In addition, at each voltage profile, a dotted line represents a dynamic voltage measured in a pulse discharge region, and a solid line represents a no-load voltage measured in the no-load state region.

Referring to FIG. 3, it may be understood that the inflection point supporting the occurrence of voltage relaxation starts appearing when a state of the lithium secondary battery decreases to about 0.40, and the voltage relaxation is maintained until the state becomes about 0.20. In other words, the voltage relaxation phenomenon appears when a state of the lithium secondary battery is within the range of 0.2 to 0.4 (marked with a rectangle).

The state of the lithium secondary battery is proportional to the dynamic voltage of the lithium secondary battery. In other words, if the dynamic voltage increases, the state increases, and if the dynamic voltage decreases, the state also decreases. Therefore, the intrinsic voltage range where the voltage relaxation phenomenon appears may be converted into a state range of the lithium secondary battery. For this reason, even though the intrinsic voltage range is converted into a state range of a secondary battery, the state range may be regarded as being substantially equivalent to the intrinsic voltage range, and therefore the state range of 0.2 to 0.4 should be understood as another kind of numerical expression of the intrinsic voltage range. Therefore, the state range of 0.2 to 0.4 may be regarded as an inherent state range corresponding to the intrinsic voltage range.

Meanwhile, it may be understood that, as the state of the lithium secondary battery is nearer to 0.20, the time taken until the occurrence of the inflection point or the time for the voltage of the lithium secondary battery to reach an equilibrium voltage increases. It is estimated that this increase of time is caused by the following reasons. In other words, as the state of the lithium secondary battery becomes nearer to 0.20, the NMC cathode material mostly reacts with lithium ions and so the resistance of the NMC cathode material further increases. In addition, the amount of lithium ions intercalated into the LFP cathode material also further increases. Therefore, in order to transfer the lithium ions intercalated into the LFP cathode material toward the NMC cathode material by means of the voltage relaxation phenomenon, more time is required in proportion to the increase of resistance of the NMC cathode material and the increased amount of lithium ions intercalated into the LFP cathode material.

Figure 4:
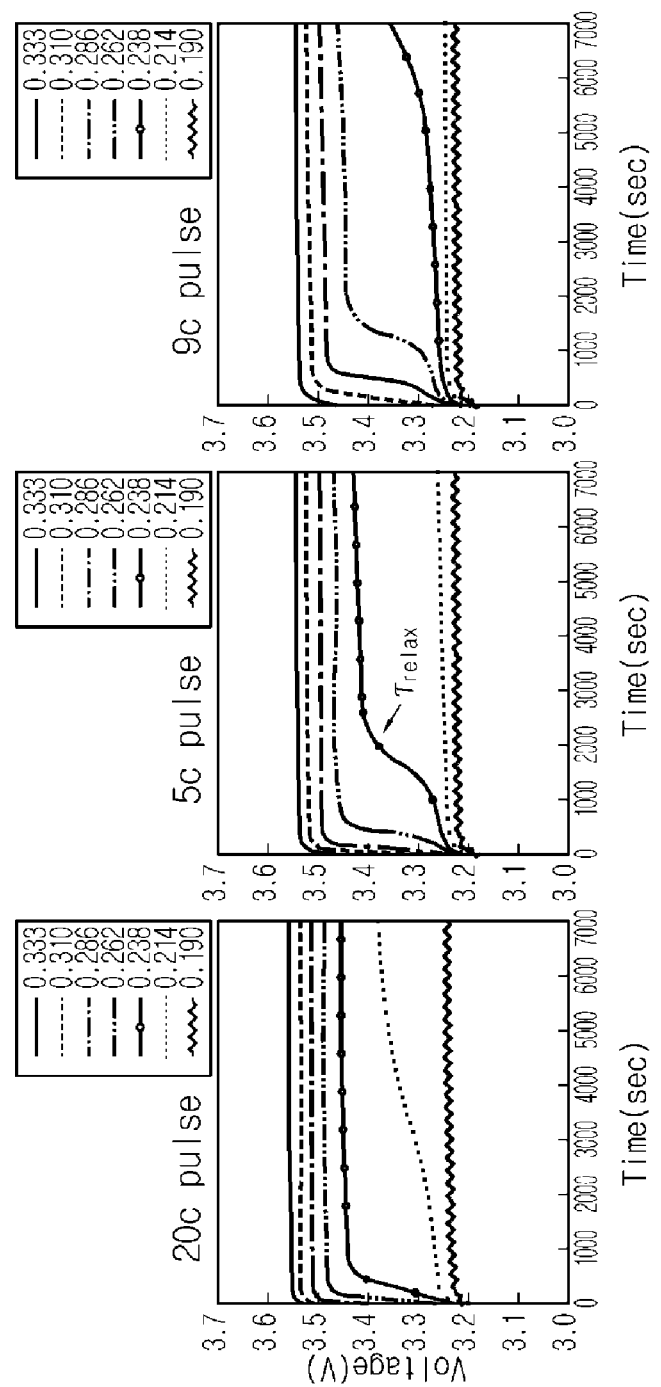
FIG. 4 is a graph showing that the voltage change pattern of the secondary battery exhibited due to the occurrence of voltage relaxation changes according to a discharge condition of the secondary battery.

FIG. 4 is a graph showing results of an experiment which evaluates an influence of the magnitude of a discharge current on the voltage relaxation phenomenon.

The voltage profiles of FIG. 4 show the change of no-load voltage of the lithium secondary battery according to time, when the lithium secondary battery having the same blended cathode material as in the former embodiment stops pulse discharge while being pulse-discharged for 10 seconds at various states (0.190-0.333) and various discharge currents (2c, 5c, 9c) which allow the voltage relaxation phenomenon. Here, 'c' represents c-rate of the discharge current.

In FIG. 4, left, central and right graphs show voltage profiles when pulse discharge is stopped while being performed at 2c, 5c and 9c, respectively.

Referring to FIG. 4, if the discharge current is identical, the lower the state of a secondary battery is, the later an inflection point supporting the occurrence of voltage relaxation appears. If the occurrence of the inflection point is delayed, the point of time when the no-load voltage of the lithium secondary battery reaches an equilibrium state is also delayed.

In addition, when the state of the secondary battery is identical, the higher the discharge current is, the later the inflection point appears in the voltage profile. If comparing three voltage profiles obtained when the state is 0.262, the voltage rapidly changes when the magnitude of the discharge current is 2c, and so the inflection point appears just after the pulse discharge stops and the voltage reaches an equilibrium state within a short time. Meanwhile, it may also be understood that, when the magnitude of the discharge current is 5c and 9c, the voltage changes gradually and the inflection point appears late, and so the time taken until the occurrence of the inflection point is longer in the case where the magnitude of the discharge current is 9c, in comparison to the case where the magnitude of the discharge current is 5c. From these facts, the following may be deduced, and each deduction conforms to the consideration results of the voltage profiles shown in FIG. 4.

First, when the discharge current is identical, the lower the state of the secondary battery is, the greater the amount of lithium ions reacting with the LFP cathode material (a reaction concentration) is. The low state means that the resistance of the NMC cathode material increases that much more and so the possibility that lithium ions supplied by the discharge current reacts with the LFP cathode material increases. The increased amount of lithium ions reacting with the LFP cathode material also increases the time taken for transferring the lithium ions during the voltage relaxation. The increased time may be checked from the phenomenon that the occurrence of the inflection point and the time taken for the no-load voltage of the lithium secondary battery to reach an equilibrium state are delayed as the state of the secondary battery is lower in the voltage profiles of FIG. 4.

In addition, under the condition that the state of the secondary battery is identical, if the discharge current increases, the concentration of lithium ions reacting with the NMC cathode material increases, and the resistance of the NMC cathode material increases that much faster. Therefore, if the discharge current increases under the condition that the state of the secondary battery is identical, the time when lithium ions start reacting with the LFP cathode material is advanced and so an amount of lithium ions intercalated into the LFP cathode material further increases. Therefore, if the voltage relaxation phenomenon occurs, the time for the lithium ions intercalated in the LFP cathode material to be transferred to the NMC cathode material increases in proportion to the amount of lithium ions reacting with the LFP. The increased time may be checked from the fact that the occurrence of the inflection point and the time taken for the no-load voltage of the lithium secondary battery to reach an equilibrium state are delayed in the voltage profiles.

In addition, if considering the above two deductions together, it may also be deduced that the state of a secondary battery where voltage relaxation starts is lowered as the discharge current is lower. In other words, if the discharge current is lowered in the intrinsic voltage range where voltage relaxation occurs, the increase of resistance of the NMC cathode material moderates, and so the possibility that lithium ions additionally react with the NMC cathode material increases. Therefore, lithium ions still react with the NMC cathode material even in a condition that voltage relaxation starts when the discharge current is large. Therefore, under the condition that discharge current is low, the reaction between lithium ions and the LFP cathode material may be initiated only when the state is further lowered.

Next, conditions required for the blended cathode material having the first and second cathode materials to cause voltage relaxation in the intrinsic voltage range will be described in detail.

In an embodiment, the voltage relaxation may occur when, at the measurement of dQ/dV distribution of the first and second cathode materials, the cathode materials are different from each other in locations of their main peaks and/or intensities of the main peaks exhibited in the dQ/dV distribution.

Here, the dQ/dV distribution, as known in the art, represents a capacity characteristic of the cathode material at various operating voltages. The difference in locations of the main peaks may be changed depending on the kinds of the first and second cathode materials. For example, the difference in locations of the main peaks may be 0.1 to 4V.

Figure 5:
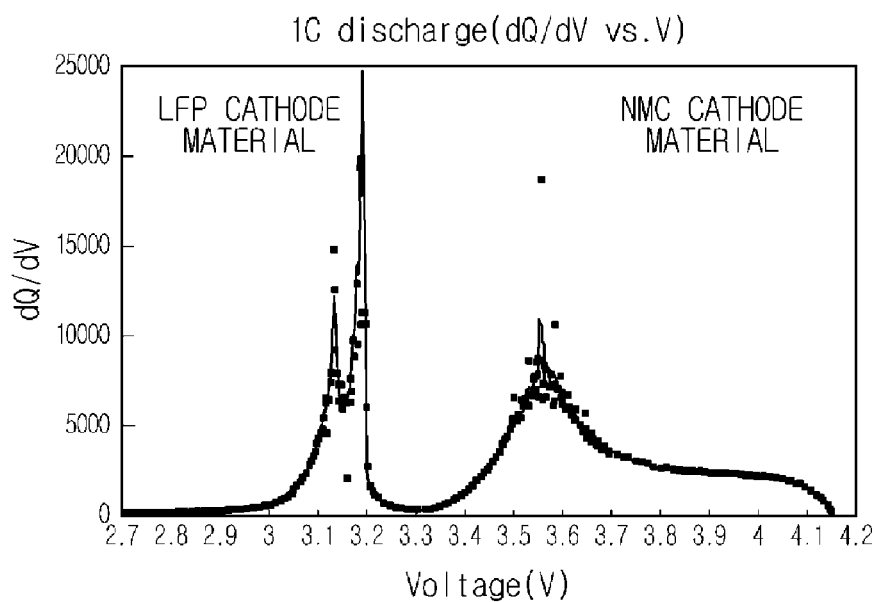
FIG. 5 is a graph showing dQ/dV distribution of a lithium secondary battery having an NMC cathode material and an LFP cathode material.

FIG. 5 is a graph showing measurement results of dQ/dV distribution, obtained by applying 1 c-rate discharge condition to a lithium secondary battery having a blended cathode material where an NMC cathode material and an LFP cathode material are blended at a ratio of 7:3 (weight ratio).

Referring to FIG. 5, two main peaks are present in the dQ/dV distribution, where the left peak corresponds to a main peak of the LFP cathode material and the right peak corresponds to a main peak of the NMC cathode material. In addition, profiles around the main peak of the LFP cathode material are generated as lithium ions react with the LFP cathode material, and profiles around the main peak of the NMC cathode material are generated as lithium ions react with the NMC cathode material. The dQ/dV distribution shown in FIG. 5 supports the fact that the NMC cathode material and the LFP cathode material have different operating voltage ranges.

As shown in FIG. 5, it may be understood that the difference of locations of the main peaks shown in the dQ/dV distribution of the NMC cathode material and the LFP cathode material is about 0.4V, and the intensity of the main peak of the LFP cathode material is about two times greater than that of the NMC cathode material. The NMC cathode material and the LFP cathode material having such dQ/dV characteristic exhibits a voltage relaxation phenomenon in the intrinsic voltage range, as described above with reference to FIG. 2. Therefore, if locations of the main peaks and/or intensities of the main peaks exhibited in the dQ/dV distribution of the first and second cathode materials used for blending are different, namely if the first and second cathode materials have different operating voltage ranges, the blended cathode material where the first and second cathode materials are blended may be regarded as satisfying the condition of causing a voltage relaxation phenomenon in the intrinsic voltage range regardless of the kind of the first and second cathode materials.

In another embodiment, when measuring a discharge resistance of the lithium secondary battery containing the blended cathode material at various SOCs, the voltage relaxation may occur when the discharge resistance profile has a convex pattern or when the discharge resistance profile has two inflection points before and after the top of the convex pattern.

Figure 6:
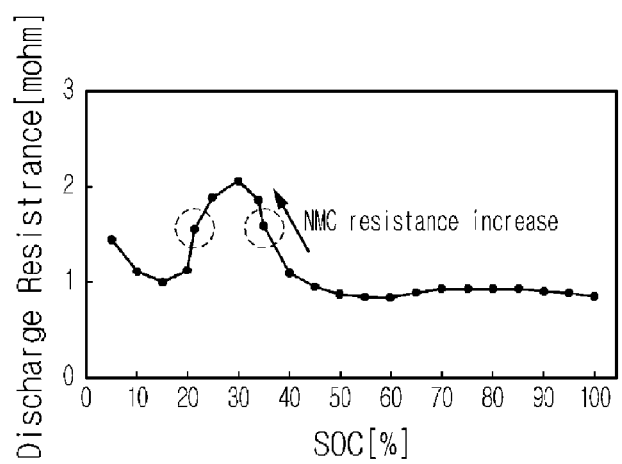
FIG. 6 is a graph showing a discharge resistance profile of a lithium secondary battery having an NMC cathode material and an LFP cathode material.

FIG. 6 is a discharge resistance profile showing measurement results of a discharge resistance according to the change of SOC with respect to a lithium secondary battery including the blended cathode material where an NMC cathode material and an LFP cathode material are blended at a ratio of 7:3 (weight ratio).

Referring to FIG. 6, it may be understood that the discharge resistance profile of the lithium secondary battery including the blended cathode material has a convex pattern when SOC is about 20 to 40%. In addition, it may also be understood that two inflection points (marked by a dotted circle) occurs when SOC is in the range of 20 to 30% and in the range of 30 to 40%, respectively, in the discharge resistance profile. In addition, it may be understood that the discharge resistance of the lithium secondary battery rapidly increases when SOC belongs to the range of 30 to 40%, and this may originate from the fact that the resistance of the NMC cathode material rapidly increases as most of the capacity of the NMC cathode material to which lithium ions may be intercalated is exhausted. The lithium secondary battery including the blended cathode material where the NMC cathode material and the LFP cathode material are blended exhibits a voltage relaxation phenomenon in the intrinsic voltage range as described above with reference to FIG. 2. Therefore, when the discharge resistance profile of the lithium secondary battery has a convex pattern or when the discharge resistance profile has two inflection points before and after the top of the convex pattern, the blended cathode material where the first and second cathode materials are blended may be regarded as satisfying the condition causing a voltage relaxation phenomenon in the intrinsic voltage range regardless of the kinds of the first and second cathode materials.

As another embodiment, the voltage relaxation may occur when the lithium secondary battery having the blended cathode material has a charge or discharge profile with at least one voltage plateau.

Figure 7:
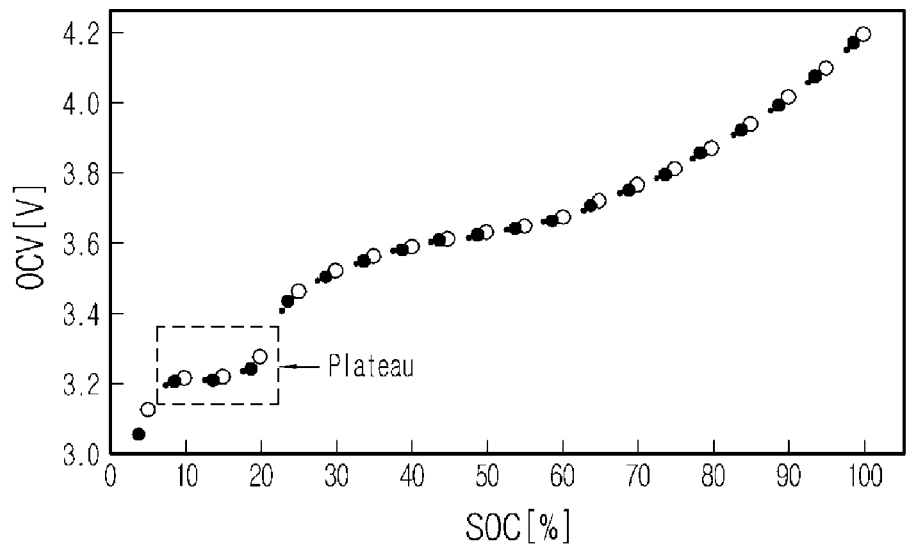
FIG. 7 is a graph showing a discharge profile of a lithium secondary battery having an NMC cathode material and an LFP cathode material.

FIG. 7 is a discharge profile showing measurement results of an open-circuit voltage at various SOCs, obtained while discharging a lithium secondary battery including the blended cathode material where an NMC cathode material and an LFP cathode material are blended at a ratio of 7:3 (weight ratio).

Referring to FIG. 7, it may be understood that the discharge profile of the lithium secondary battery including the blended cathode material has a voltage plateau looking as if there is substantially no voltage change, namely as if the voltage is substantially constant, based on the naked eye, when the open-circuit voltage is about 3.2V. The voltage plateau may be checked identically when measuring an open-circuit voltage at various SOCs while charging the lithium secondary battery including the blended cathode material where an NMC cathode material and an LFP cathode material are blended at a ratio of 7:3 (weight ratio). The lithium secondary battery including the blended cathode material where an NMC cathode material and an LFP cathode material are blended exhibits a voltage relaxation phenomenon in the intrinsic voltage range, as described above with reference to FIG. 2. From this, it may be confirmed that, when the charge or discharge profile of the lithium secondary battery has at least one voltage plateau, the blended cathode material where the first and second cathode materials are blended satisfies the condition of causing a voltage relaxation phenomenon in the intrinsic voltage range regardless of the kinds or blending ratio of the first and second cathode materials.

Figure 8:
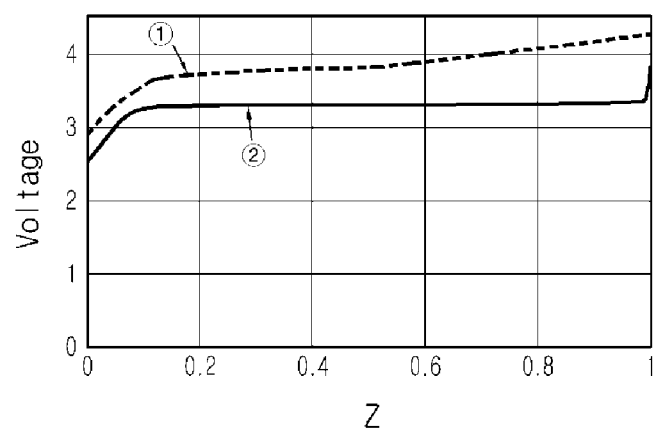
FIG. 8 is a graph showing measurement results of voltage profiles according to states of a half cell manufactured so that an NMC cathode material and a lithium metal are respectively used as a cathode and an anode and a half cell manufactured so that an LFP cathode material and a lithium metal are respectively used as a cathode and an anode.

FIG. 8 is a graph showing measurement results of voltage profiles at a state range of 0-1 with respect to a half cell manufactured so that an NMC cathode material and a lithium metal are respectively used as a cathode and an anode and a half cell manufactured so that an LFP cathode material and a lithium metal are respectively used as a cathode and an anode.

In FIG. 8, graph ① depicts a voltage profile of the half cell including the NMC cathode material and graph ② depicts a voltage profile of the half cell including the LFP cathode material.

Referring to FIG. 8, a voltage plateau is observed in the voltage profile including the LFP cathode material.

This measurement results supports that in a secondary battery using a blended cathode material including an NMC cathode material and a LFP cathode material, at an early stage where the state z starts decreasing from 100%, the NMC cathode material is activated so that lithium ions are mainly intercalated to the NMC cathode material; if the state z decreases so that the voltage of the secondary battery is lowered to the level of the intrinsic voltage range, the LFP cathode material is activated so that lithium ions start being intercalated into the LFP cathode material; and if the state z of the secondary battery comes to 0%, the states z of the NMC cathode material and the LFP cathode material also become 0%, which means that the capacity of each cathode material capable of accommodating a lithium ion is entirely used.

In an aspect, the graph of FIG. 8 supports that when at least one of the first and second cathode materials included in the blended cathode material has a voltage profile with a voltage plateau under the half cell condition, the secondary battery including the blended cathode material exhibits a voltage relaxation in the intrinsic voltage range.

In another aspect, the graph of FIG. 8 supports that when one of the first and second cathode materials included in the blended cathode material has a voltage profile with a voltage plateau under the half cell condition and the other has a voltage profile without a voltage plateau and with a higher voltage in comparison to the voltage profile with a voltage plateau in at least a part of the entire state under the half cell condition, the secondary battery including the blended cathode material exhibits a voltage relaxation in the intrinsic voltage range.

In the present disclosure, the first and second cathode materials may use any material without limitation if it may cause voltage relaxation in the intrinsic voltage range. Therefore, any combination of cathode materials satisfying at least one of the above conditions may be considered as the first and second cathode materials, in addition to the NMC cathode material and the LFP cathode material, as obvious to those skilled in the art.

In an embodiment, the first cathode material may be an alkali metal compound expressed by a general chemical formula $A[A_xM_y]O_{2+z}$, wherein A includes at least one of Li, Na and K; M includes at least one element selected from the group consisting of Ni, Co, Mn, Ca, Mg, Al, Ti, Si, Fe, Mo, V, Zr, Zn, Cu, Al, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the alkali metal compound maintains electrical neutrality.

Alternatively, the first cathode material may be an alkali metal compound expressed by $xLiM^1O_2$-$(1-x)Li_2M^2O_3$ wherein $M^1$ includes at least one element with an average oxidation state of +3; $M^2$ includes at least one element with an average oxidation state of +4; and $0 \leq x \leq 1$, and selectively coated with a carbon layer, an oxide layer and a fluoride layer, which is disclosed in U.S. Pat. No. 6,677,082, U.S. Pat. No. 6,680,143 or the like.

In another embodiment, the second cathode material may be lithium metal phosphate expressed by a general chemical formula $Li_aM^1_xFe_{1-x}M^2_yP_{1-y}M^3_zO_{4-z}$, wherein $M^1$ includes at least one element selected from the group consisting of Ti, Si, Mn, Co, V, Cr, Mo, Fe, Ni, Nd, Al, Mg and Al; $M^2$ includes at least one element selected from the group consisting of As, Sb, Si, Ge, V and S; $M^3$ includes at least one element selected from a halogen group containing F; $0 < a \leq 2$, $0 \leq x \leq 1$, $0 \leq y \leq 1$, $0 \leq z \leq 1$; and a, x, y, z, and stoichiometric coefficients of the components included in $M^1_x$, $M^2_y$, and $M^3_z$ are selected so that the lithium metal phosphate maintains electrical neutrality, or $Li_3M_2(PO_4)_3$ wherein M includes at least one element selected from the group consisting of Ti, Si, Mn, Co, V, Cr, Mo, Ni, Al, Mg and Al.

In another embodiment, the first cathode material may be an alkali metal compound expressed by $Li[Li_aNi_bCo_cMn_d]O_{2+z}$ ($a \geq 0$; $a+b+c+d=1$; at least one of b, c and d is not zero; $-0.1 \leq z \leq 2$). The second cathode material may be at least one selected from the group consisting of $LiFePO_4$, $LiMn_xFe_yPO_4$ ($0 < x+y \leq 1$) and $Li_3Fe_2(PO_4)_3$.

In another embodiment, the first cathode material and/or the second cathode material may include a coating layer. The coating layer may include a carbon layer, or an oxide layer or a fluoride layer containing at least one selected from the group consisting of Ti, Si, Mn, Co, V, Cr, Mo, Fe, Ni, Nd, Al, Mg, Al, As, Sb, Si, Ge, V and S.

In the present disclosure, the kind and blending ratio of the first and second cathode materials may be suitably selected or adjusted in consideration of the use of a secondary battery to be manufactured, an electrochemical design condition for the secondary battery, an electrochemical characteristic of cathode materials required for causing a voltage relaxation between the cathode materials, an intrinsic voltage range where voltage relaxation occurs, or the like.

In an embodiment, if a secondary battery with a good discharge power is desired, a cathode material having a good reactivity with lithium ions may be selected as one of the first and second cathode materials, and a mixture ratio of the corresponding cathode material may be set as high as possible under the condition causing a voltage relaxation (satisfying at least one of the above conditions). For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 5:5.

In another embodiment, if a secondary battery with high-temperature stability is desired, a cathode material with excellent high-temperature stability may be selected as one of the first and second cathode materials, and a mixture ratio of the corresponding cathode material may be set as high as possible under the condition causing a voltage relaxation (satisfying at least one of the above conditions). For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 2:8.

In another embodiment, if a secondary battery with a low production cost is desired, a cathode material with a low production cost may be selected as one of the first and second cathode materials, and a mixture ratio of the corresponding cathode material may be set as high as possible under the condition causing a voltage relaxation (satisfying at least one of the above conditions). For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 1:9.

In another embodiment, if a secondary battery having a good discharge power and excellent high-temperature stability is desired, a cathode material having a good reactivity with operating ions and a cathode material having excellent high-temperature stability may be respectively selected as the first and second cathode materials, and a mixture ratio of the cathode materials may be set in consideration of balancing of the discharge power and the high-temperature stability under the condition causing a voltage relaxation (satisfying at least one of the above conditions). For example, $Li[Ni_{1/3}Mn_{1/3}Co_{1/3}]O_2$ and $LiFePO_4$ may be respectively selected as the first cathode material and the second cathode material, and a mixture ratio of the first cathode material and the second cathode material may be set to be 4:6.

In another embodiment, if a secondary battery having a great capacity per weight is desired, a cathode material having a great capacity per weight may be selected as one of the first and second cathode materials, and a mixture ratio of the corresponding cathode material may be set to be as high as possible under the condition causing a voltage relaxation (satisfying at least one of the above conditions). For example, $Li[Ni_{0.5}Mn_{0.3}Co_{0.2}]O_2$ and $LiFePO_4$ may be respectively selected as the first cathode material and the second cathode material, and a mixture ratio of the first cathode material and the second cathode material may be set to be 9:1.

The selection of the first and second cathode materials and the adjustment of their mixture ratio described above are just examples. Therefore, it is obvious to those skilled in the art that the first and second cathode materials may be suitably selected and a mixture ratio of the cathode materials may be suitably set in consideration of relative weights and balances of electrochemical properties to be endowed to the blended cathode material under the condition of causing voltage relaxation in an intrinsic voltage range.

In addition, the number of kinds of cathode materials included in the blended cathode material is not limited to two. In addition, for enhancing properties of the blended cathode material, other additives such as a conducting agent, a binder or the like may be added to the blended cathode material without special limitation. Therefore, if a blended cathode material includes at least two cathode materials capable of causing voltage relaxation when the secondary battery comes to an idle state or a no-load state in the intrinsic voltage range, this should be understood as belonging to the scope of the present disclosure regardless of the number of cathode materials and the presence of other additives, as obvious to those skilled in the art.

In the present disclosure, the blended cathode material including at least the first and second cathode materials may be used as a cathode material of a secondary battery which is charged or discharged in a voltage range including the intrinsic voltage range in order to utilize the voltage relaxation phenomenon.

The secondary battery may be loaded on various kinds of electric-driven apparatuses which operate with electric energy, and the kind of the electric-driven apparatus is not specially limited.

In an embodiment, the electric-driven apparatus may be a mobile computer device such as a cellular phone, a laptop, and a tablet computer; or a hand-held multimedia device such as a digital camera, a video camera, and an audio/video regenerating device.

In another embodiment, the electric-driven apparatus may be an electric-powered apparatus such as an electric vehicle, a hybrid vehicle, an electric bike, a motor cycle, an electric train, an electric ship, and an electric airplane; or a motor-mounted power tool such as an electric drill and an electric grinder.

In another embodiment, the electric-driven apparatus may be a large power storage device installed at a power grid to store new regeneration energy or surplus energy, or an uninterrupted power supply for supplying power to various information communication devices such as server computers and mobile communication devices in times of emergency such as a blackout.

The blended cathode material described above may be included in a cathode of a secondary battery. The secondary battery may further include an anode and a separator in addition to the cathode. In addition, the secondary battery may be charged or discharged in a voltage range including the intrinsic voltage range where the blended cathode material causes voltage relaxation.

In an embodiment, the cathode may include a thin-plate metallic current collector made of conductive material, and a cathode material coating layer containing the blended cathode material and formed on at least one surface of the metallic current collector.

The metallic current collector is made of material with chemical stability and high conductivity. For example, the metallic current collector may be made of aluminum, stainless steel, nickel, titanium, sintered carbon or the like. As another example, the metallic current collector may be made of aluminum or stainless steel coated with carbon, nickel, titanium, silver or the like on the surface thereof.

The cathode material coating layer may further include additives such as a conducting agent and a binder in addition to the blended cathode material.

The conducting agent is not specially limited if it may improve electric conductivity of the blended cathode material, and may use various conductive carbonaceous materials such as graphite, carbon black, acetylene black, Ketjen black, Super-P, carbon nano tube or the like, without being limited thereto.

The binder is not specially limited if it allows a close physical joint among particles of the blended cathode material and a close interfacial joint between the blended cathode material and the metallic current collector. Various kinds of polymers such as poly(vinylidene fluoride-co-hexafluoropropylene polymer) (PVDF-co-HFP), polyvinylidene fluoride, polyacrylonitrile, polymethyl methacrylate or the like may be used as the binder, without being limited thereto.

In an embodiment, the anode may include a thin-plate metallic current collector made of conductive material, and an anode material coating layer containing anode material and formed on at least one surface of the metallic current collector.

The metallic current collector is made of material with chemical stability and high conductivity. For example, the metallic current collector may be made of copper, aluminum, stainless steel, nickel, titanium, sintered carbon or the like. As another example, the metallic current collector may be made of copper or stainless steel coated with carbon, nickel, titanium, silver or the like on the surface thereof or an aluminum-cadmium alloy.

The anode material is not specially limited if it has a different oxidation/reduction potential (redox potential) from the blended cathode material and allows intercalation of operating ions during the charging process and deintercalation of operating ions during the discharging process.

The anode material may use carbonaceous material, lithium metal, silicon, tin or the like, without being limited thereto, and may also use metal oxides such as $TiO_2$ and $SnO_2$ with a potential lower than 2V. Preferably, the anode material may use carbonaceous material, and the carbonaceous material may use both low crystalline carbon and high crystalline carbon. The low crystalline carbon representatively includes soft carbon and hard carbon, and the high crystalline carbon representatively includes high-temperature sintered carbon such as natural graphite, Kish graphite, pyrolytic carbon, mesophase pitch based carbon fiber, meso-carbon microbeads, mesophase pitches, petroleum derived cokes, and tar pitch derived cokes.

The anode material coating layer may further include additives such as a conducting agent and a binder in addition to the anode material. The conducting agent and the binder may use materials which are available as a conducting agent and a binder included in a cathode material coating layer.

The separator is not specially limited if it has a pore structure for electrically separating the cathode and the anode and allowing the transfer of operating ions.

In an embodiment, the separator may use a porous polymer film, for example a porous polymer film made from polyolefin-based polymer such as ethylene homopolymer, propylene homopolymer, ethylene/butene copolymer, ethylene/hexene copolymer, and ethylene/methacrylate copolymer, or their laminates. As other examples, a common porous non-woven fabric made from, for example, high-melting glass fibers or polyethylene terephthalate fibers may be used.

Meanwhile, at least one surface of the separator may include a coating layer of inorganic particles. In addition, the separator may be made of a coating layer of inorganic particles. The particles of the coating layer may have a structure coupled with a binder so that interstitial volumes are present among adjacent particles. This structure is disclosed in PCT International Publication WO 2006/025662, which may be incorporated herein by reference. The inorganic particles may be made of inorganic material with a dielectric constant of 5 or above. The inorganic materials may include at least one selected from the group consisting of $Pb(Zr,Ti)O_3$ (PZT), $Pb_{1-x}La_xZr_{1-y}Ti_yO_3$ (PLZT), PB $(Mg_3Nb_{2/3})O_3$—$PbTiO_3$ (PMN-PT), $BaTiO_3$, hafnia ($HfO_2$), $SrTiO_3$, $TiO_2$, $Al_2O_3$, $ZrO_2$, $SnO_2$, $CeO_2$, MgO, CaO, ZnO and $Y_2O_3$, without being limited thereto.

The secondary battery may also further include an electrolyte containing operating ions. The electrolyte is not specially limited if it may include operating ions and cause an electrochemical oxidation or reduction reaction at the cathode and the anode by means of the operating ions.

The electrolyte may be a salt having a structure of $A^+B^-$, without being limited thereto. Here, the $A^+$ includes alkali metallic cations such as $Li^+$, $Na^+$, and $K^+$ or their combinations. In addition, $B^-$ includes at least one anion selected from the group consisting of $F^-$, $Cl^-$, $Br^-$, $I^-$, $NO_3^-$, $N(CN)_2^-$, $BF_4^-$, $ClO_4^-$, $AlO_4^-$, $AlCl_4^-$, $PF_6^-$, $SbF_6^-$, $AsF_6^-$, $BF_2C_2O_4^-$, $BC_4O_8^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $C_4F_9SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$, and $(CF_3CF_2SO_2)_2N^-$.

The electrolyte may also be used in a state of being dissolved in an organic solvent. The organic solvent may use propylene carbonate (PC), ethylene carbonate (EC), diethyl carbonate (DEC), dimethyl carbonate (DMC), dipropyl carbonate (DPC), dimethyl sulfoxide, acetonitrile, dimethoxyethane, diethoxyethane, tetrahydrofuran, N-methyl-2-pyrrolidone (NMP), ethyl methyl carbonate (EMC), γ-butyrolactone, or their mixtures.

In an embodiment, the secondary battery may further include a package for sealing the cathode, the anode and the separator. In the case the cathode, the anode and the separator are sealed by the package, the cathode and the anode may be respectively jointed to a cathode terminal and an anode terminal, and the cathode terminal and the anode terminal may be led out of the package. On occasions, in the case the package serves as an electrode terminal, either the cathode terminal or the anode terminal may be replaced with the package. For example, if the anode is electrically connected to the inside of the package, the outer surface of the package may function as an anode. The package is not specially limited if it has chemical stability and may be made of metal, polymer, a flexible pouch film or the like, without being limited thereto. The flexible pouch film may be representatively an aluminum pouch film where a thermal bonding layer, an aluminum layer and an outer protection layer are laminated.

The appearance of the secondary battery is determined by the structure of the package. The package may adopt any structure used in the art and its appearance according to the use of a battery is not specially limited. The package may have structures such as a cylindrical shape, a rectangular shape, a pouch shape, a coin shape, or curved shapes thereof without being limited thereto.

In another embodiment of the present disclosure, the blended cathode material may be preferably used in a cathode forming process, which is included in the secondary battery manufacturing method.

In an embodiment, the secondary battery manufacturing method may include a process of preparing a blended cathode material where at least the first and second cathode materials described above are blended.

The first and second cathode materials are selected to have different concentrations of operating ions reacting therewith according to the change of voltage and allow voltage relaxation by transferring the operating ions between the first and second cathode materials when coming to an idle state or a no-load state in the intrinsic voltage range.

The kinds and mixture ratios of the first and second cathode materials may be determined according to the kind of the secondary battery, and commercially available cathode materials may be used without limitation. In addition, in order to improve the electrochemical characteristic of the blended cathode material, it is not ruled out to add a cathode material other than the first and second cathode materials to the blended cathode material.

The secondary battery manufacturing method may further include a process of forming slurry including the blended cathode material and other additives such as a conducting agent, a binder and an organic solvent. Here, the conducting agent, the binder and the organic solvent may be suitably selected from the materials disclosed above so that the characteristic of the blended cathode material is desirably exhibited.

The secondary battery manufacturing method may further include a process of forming a cathode material coating layer on the metallic current collector by coating the metallic current collector with the slurry on at least one surface thereof, and then drying and compressing the same.

The secondary battery manufacturing method may further include a process of forming an anode and a process of packaging a secondary battery. These additional processes may be selected from various techniques known in the art in consideration of the kind and structure of the secondary battery so that the blended cathode material may manifest the optimal performance. Therefore, the additional processes described below are just examples, not limiting the scope of the present disclosure.

In an embodiment, the secondary battery manufacturing method may further include a process of forming an anode. The anode may be formed by coating at least one surface of the metallic current collector with slurry including anode material and other additives, for example a conducting agent, a binder and an organic solvent and then drying and compressing the same. The anode material, the conducting agent, the binder and the organic solvent may be suitably selected from the materials disclosed above so that the characteristic of the blended cathode material is manifested desirably.

The secondary battery manufacturing method may further include a process of forming an electrode assembly by interposing a separator between the cathode and the anode.

The electrode assembly includes a unit cell having at least a laminated structure of cathode/separator/anode. The unit cell may have various structures known in the art. For example, the unit cell may have a bi-cell structure where outermost electrodes have the same polarity or a full-cell structure where outermost electrodes have opposite polarities. The bi-cell may have a structure of cathode/separator/anode/separator/cathode, for example. The full-cell may have a structure of, for example, cathode/separator/anode/separator/cathode/separator/anode.

The electrode assembly may have various structures known in the art, and for example the electrode assembly may have a simple stack structure where the unit cell and a insulating film are repeatedly laminated from the bottom to the top. In addition, the electrode assembly may have a stack folding structure formed by disposing unit cells on a insulative folding film at regular intervals and then rolling the insulative folding film together with the unit cells in a predetermined direction. In addition, the electrode assembly may have a jelly roll structure formed by placing a unit cell prepared in a sheet shape extending in one direction on a insulative rolling film and then rolling the unit cell and the insulative rolling film together.

The secondary battery manufacturing method may further include a process of forming a secondary battery by sealing the electrode assembly in a package together with an electrolyte. The electrolyte may be suitably selected from the materials disclosed above so that the characteristic of the blended cathode material is manifested desirably. In addition, the electrolyte is not specially limited in its physical phase and so may be used as a solid electrolyte, a liquid electrolyte, a gel electrolyte or the like. The electrolyte may be injected into the package as a separate process when the electrode assembly is loaded in the package or may be immersed in the electrode assembly in advance. In the case the solid electrolyte may be used as the separator, the separator may be replaced with a solid electrolyte film.

The secondary battery manufacturing method may further include a process of activating (forming) the secondary battery to be capable of being charged or discharged in a voltage range including the intrinsic voltage range. The activating process includes a step of performing an initial charge so that the secondary battery may be used in a voltage range including the intrinsic voltage range. The intrinsic voltage range is changed depending on the kind of the blended cathode material. For example, in the case the first and second cathode materials are an NMC cathode material and an LFP cathode material, the intrinsic voltage range includes a range of 2.5 to 4.3V. The activating process may also selectively include a step of discharging gas collected in the package, when the initial charging step is performed.

The secondary battery manufacturing method may further include a process of welding a metallic electrode lead to a tab, if the tab is drawn out of the metallic current collector included in the cathode and the anode. If this process is included, the process of sealing an electrode current collector in the package is preferably performed so that one end of the electrode lead is exposed out.

In another embodiment of the present disclosure, the secondary battery including the blended cathode material may be electrically connected or coupled to a control unit which monitors an electric characteristic caused from the voltage relaxation when coming to an idle state or a no-load state.

Here, the electric connection means that the control unit is electrically coupled to a cathode and an anode of the secondary battery so that an electric characteristic such as voltage and current of the secondary battery may be measured.

The control unit may selectively include processors well known in the art, ASIC (application-specific integrated circuit), other chipsets, logic circuits, registers, communication modems, data processing devices or the like in order to execute various control logics described below. In addition, when the control logic is implemented as software, the control unit may be implemented as an aggregate of program modules. At this time, program modules are stored in a memory and executed by processors. The memory unit may be present in or out of the processor and may be connected to the processor by various means. In addition, the memory may be included in a storage unit (see FIG. 10) of the present disclosure. Moreover, the memory is a general name to call devices storing information, regardless of the kind of devices, without being limited to a specific memory device.

The control unit may be a battery management system (BMS) which may be electrically coupled to a secondary battery, or a control element included in the BMS.

The BMS may be interpreted as meaning a typical BMS system in the art, but in the functional point of view, any system capable of performing at least one function disclosed in this specification may be included in the scope of the BMS.

The control unit may monitor a voltage characteristic of the secondary battery and detect that a voltage relaxation phenomenon occurs between the first and second cathode materials included in the secondary battery. Here, the voltage characteristic is an example and may be voltages of the secondary battery repeatedly measured at time intervals after the secondary battery comes to an idle state or a no-load state. The voltages may configure a voltage profile exhibiting the change of voltages according to time when being considered together with the measurement time.

The control unit may indirectly detect that voltage relaxation occurs in the blended cathode material included in the secondary battery by analyzing the voltage profile.

Figure 9:
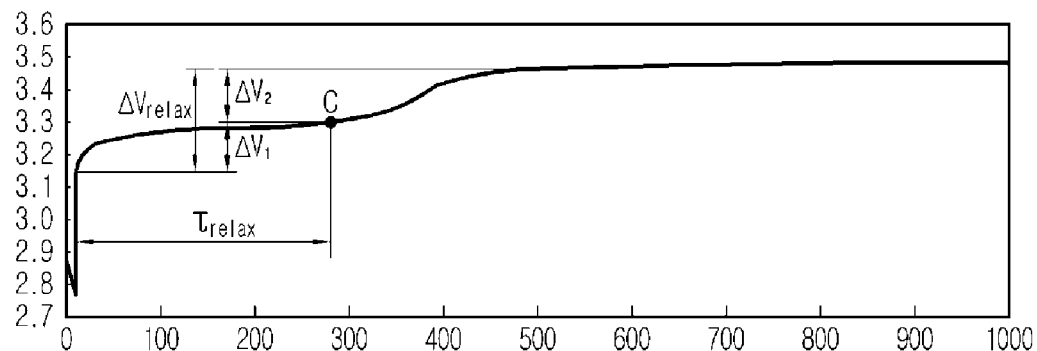
FIG. 9 is a diagram exemplarily showing parameters useable for identifying the occurrence of voltage relaxation.

FIG. 9 is a graph showing an example of the voltage profile exhibited when voltage relaxation occurs, which shows various factors useable for the control unit to detect the occurrence of voltage relaxation.

As shown in FIG. 9, if voltage relaxation occurs, an inflection point C is generated between the time point when the secondary battery comes to an idle state or a no-load state and the time point when the voltage of the secondary battery reaches an equilibrium state. Therefore, whether the inflection point C occurs, and/or whether the time $\tau_{relax}$ taken until the occurrence of the inflection point C belongs to a critical time range, and/or whether the voltage profile slope at the inflection point C belongs to a critical slope range may be considered as factors.

In addition, if the secondary battery stops discharging, a voltage drop effect caused by IR drop disappears. Therefore, just after discharging is stopped, the voltage rapidly increases as much as the IR drop voltage. After that, a first voltage rise $\Delta V_1$ occurs before an inflection point is generated in the voltage profile, and a second voltage rise $\Delta V_2$ occurs after the inflection point is generated. Therefore, whether two voltage rises occur before and after the inflection point, and/or whether a voltage variance amount $\Delta V_{relax}$ obtained by adding the first and second voltage rises belongs to the critical voltage range, or whether the time taken until the occurrence of the voltage rise $\Delta V_1$ and/or $\Delta V_2$ belongs to the critical time range may be considered as factors.

Here, the critical voltage range, the critical slope range, and the critical time range may be determined in advance through experiments, and may be inherently set according to the kind and blending ratio of cathode materials included in the blended cathode material.

According to the present disclosure, the control unit may detect the occurrence of voltage relaxation in the blended cathode material included in the secondary battery by monitoring a voltage characteristic of the secondary battery in consideration of various identifying factors described above, after the secondary battery comes to an idle state or a no-load state.

In an embodiment, the control unit may monitor a voltage variance amount of the secondary battery during a preset measurement time and check whether the voltage variance amount belongs to the critical voltage range, after the secondary battery comes to an idle state or a no-load state while being discharged.

Here, the critical voltage range and the measurement time may be set in advance through experiments. In other words, the critical voltage range and the measurement time may be set by discharging a secondary battery including the blended cathode material in an intrinsic voltage range where voltage relaxation may occur and then stopping discharge so that the secondary battery comes to an idle state or a no-load state, and then analyzing a voltage profile of the secondary battery exhibited at this time. During the experiment procedure, voltage, magnitude of discharge current, SOC or the like when coming to an idle state or a no-load state are variously changed under the condition where voltage relaxation may occur.

The critical voltage range and the measurement time may be changed depending on the blended cathode material included in the secondary battery and may be set in consideration of a plurality of data relating to the voltage variance amount obtained from a plurality of voltage profiles and a plurality of time data taken for detecting the voltage variance amount.

For example, the critical voltage range and the measurement time may be respectively set in the range of 50 to 400 mV and 5 to 100 seconds, without being limited thereto.

In the above embodiment, if a voltage variance amount belonging to the critical voltage range is monitored during the measurement time, the control unit may indirectly detect the occurrence of voltage relaxation in the blended cathode material included in the secondary battery, and optionally quantitatively estimate a state of the secondary battery corresponding to the voltage change of the secondary battery monitored during the measurement time. A method for quantitatively estimating a state of the secondary battery will be described later in detail.

In another embodiment, the control unit may monitor whether an inflection point C is generated in a voltage profile measured during a preset measurement time after the secondary battery comes to an idle state or a no-load state while being discharged, and/or whether a slope of the voltage profile calculated at the inflection point C belongs to a critical slope range, and/or whether the time $\tau_{relax}$ taken until the occurrence of the inflection point C belongs to a critical time range.

Here, the measurement time may be set through experiments similar to the above description. In other words, the measurement time may be set by discharging a secondary battery including the blended cathode material in the intrinsic voltage range where voltage relaxation may occur and stopping the discharge so that the secondary battery comes to an idle state or a no-load state, and then analyzing the time taken until the occurrence of the inflection point C in the voltage profile of the secondary battery. In the experiment procedure, voltage, magnitude of discharge current, SOC or the like when the secondary battery coming to an idle state or a no-load state are variously changed under the condition where voltage relaxation may occur.

In this embodiment, if the occurrence of the inflection point C supporting the occurrence of voltage relaxation in the voltage profile, and/or a voltage profile slope at the inflection point C belonging to the critical slope range, and/or the time of occurrence of inflection point C belonging to the critical time range are checked, the control unit may indirectly detect the occurrence of voltage relaxation in the blended cathode material included in the secondary battery, and optionally quantitatively estimate a state of the secondary battery corresponding to the voltage change of the secondary battery, monitored during the measurement time.

In another embodiment, the control unit may monitor whether two voltage rises $\Delta V_1$, $\Delta V_2$ are detected before and after the inflection point C supporting the occurrence of voltage relaxation in the voltage profile measured for a preset measurement time after the secondary battery comes to an idle state or a no-load state while being discharged, and/or whether a voltage variance amount $\Delta V_{relax}$ obtained by adding two voltage rises belongs to the critical voltage range, and/or and whether the time taken during the voltage variations of $\Delta V_1$ and/or $\Delta V_2$ belongs to the critical time range.

Here, the measurement time may be set through experiments similar to the above description. In other words, the measurement time may be set by discharging a secondary battery including the blended cathode material in the intrinsic voltage range where voltage relaxation may occur and stopping the discharge so that the secondary battery comes to an idle state or a no-load state, and then analyzing a time interval of two detected voltage rises before and after the inflection point C supporting the occurrence of voltage relaxation in the voltage profile of the secondary battery, and/or the time taken for detecting the voltage variance amount $\Delta V_{relax}$, and/or and the time taken during the voltage variations of $\Delta V_1$ and/or $\Delta V_2$. In the experiment procedure, voltage, magnitude of discharge current, SOC or the like when the secondary battery coming to an idle state or a no-load state are variously changed under the condition where voltage relaxation may occur.

In this embodiment, if two voltage rises $\Delta V_1$, $\Delta V_2$ before and after the inflection point C supporting the occurrence of voltage relaxation in the voltage profile, and/or the voltage variance amount $\Delta V_{relax}$ belonging to the critical voltage range, and/or the rises of voltages $\Delta V_1$ and/or $\Delta V_2$ under the time condition belonging to the critical time range are detected, the control unit may indirectly detect the occurrence of voltage relaxation in the blended cathode material included in the secondary battery, and optionally quantitatively estimate a state of the secondary battery corresponding to the voltage change of the secondary battery, monitored during the measurement time.

In another embodiment of the present disclosure, a secondary battery including the blended cathode material having at least the first and second cathode materials and exhibiting a voltage relaxation phenomenon in the intrinsic voltage range may be coupled with a secondary battery managing apparatus which estimates a state of the secondary battery.

Figure 10:
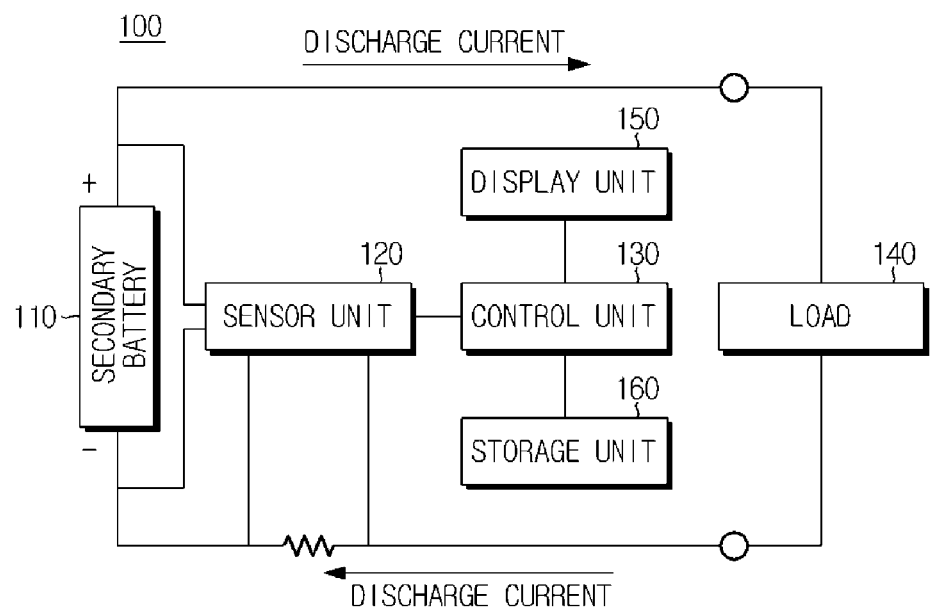
FIG. 10 is a block diagram showing an apparatus for managing a secondary battery according to an embodiment of the present disclosure.

FIG. 10 is a block diagram schematically showing a secondary battery managing apparatus 100 according to an embodiment of the present disclosure.

As shown in FIG. 10, the secondary battery managing apparatus 100 includes a sensor 120 for measuring an electric characteristic of the secondary battery 110 for a predetermined measurement time when the secondary battery 110 comes to an idle state or a no-load state while being discharged, and a control unit 130 for detecting the occurrence of the voltage relaxation based on the measured electric characteristic and optionally estimating a state of the secondary battery 110 corresponding to the voltage relaxation.

Here, the measurement time may be set in different ways depending on the method for the control unit 130 to identify the voltage relaxation. The measurement time setting method may use any one of methods disclosed above in the former embodiments.

The electric characteristic is an example and may include a voltage between the cathode and the anode of the secondary battery 110 and a current of the secondary battery 110.

The electric characteristic may be repeatedly measured at regular intervals during the measurement time. In this case, data relating to repeatedly measured electric characteristic may form a profile.

For example, if the voltage of secondary battery 110 is measured several times for the measurement time as the electric characteristic, the measured voltage data may form a voltage profile. As another example, if the current of the secondary battery 110 is measured several times for the measurement time as the electric characteristic, the measured current data may form a current profile.

The control unit 130 receives a measurement value about the electric characteristic from the sensor 120. The measurement value may be an analog signal or a digital signal. The control unit 130 may prepare a voltage profile and optionally a current profile by using a plurality of voltage and current values obtained from the sensor 120.

The sensor 120 and the control unit 130 configure a battery management system (BMS), and the BMS may be included in the secondary battery managing apparatus 100.

The BMS may be a typical BMS system in the art. However, the present disclosure is not limited thereto, and any system including components performing the same functions as the sensor 120 and the control unit 130 may be included in the scope of the BMS.

Meanwhile, the sensor 120 may not be a component of the BMS. In this case, the BMS may include the control unit 130 as an essential element, and the control unit 130 may be electrically coupled to the sensor 120 in order to obtain a measurement value of the electric characteristic from the sensor 120.

The secondary battery managing apparatus 100 is electrically connected to a load 140. The load 140 may be included in various kinds of electric-driven apparatuses and means an energy-consuming device included in an electric-driven apparatus operated with the electric energy supplied when the secondary battery 110 is discharged. The load may be a rotation-driving device such as a motor, a power-converting device such as an inverter, or the like, but the present disclosure is not limited to specific kinds of loads.

The secondary battery managing apparatus 100 may further include a storage unit 160, selectively. The storage unit 160 is not specially limited if it may serve as a storage medium capable of recording and erasing information. For example, the storage unit 160 may be RAM, ROM, register, hard disk, optical recording medium or magnetic recording medium. The storage unit 160 may be connected to the control unit 130 so as to be accessed by the control unit 130 through, for example, a data bus or the like. The storage unit 160 store and/or update and/or erase and/or transmit program having various control logics executed by the control unit 130 and/or data generated when the control logics are executed. The storage unit 160 may be divided into two or more logic units and may also be included in the control unit 130, without any restriction.

The secondary battery managing apparatus 100 may further include a display unit 150, selectively. The display unit 150 is not specially limited if it may display information generated by the control unit 130 as a graphic interface. For example, the display unit 150 may be a liquid crystal display, an LED display, an OLED display, an E-INK display, a flexible display or the like. The display unit 150 may be connected to the control unit 130 directly or indirectly. When indirect connection is adopted, the display unit 150 may be located in an area physically separated from the area where the control unit 130 is located. In addition, a third control unit (not shown) may be interposed between the display unit 150 and the control unit 130 to receive information, which will be displayed on the display unit 150 by the third control unit, from the control unit 130 and display the information on display unit 150. For this, the third control unit and the control unit 130 may be connected through a communication line.

The control unit 130 is a component capable of executing at least one control logic required for estimating a state of the secondary battery 110 and may estimate a state of the secondary battery 110 by using a predetermined mathematical model, a look-up table or look-up function, or the like, without being limited thereto.

According to an embodiment, the control unit 130 may estimate a state of the secondary battery by using a predetermined voltage estimating model. Preferably, the voltage estimating model may be based on a circuit model.

The voltage estimating model is a mathematical model for estimating a voltage profile which may approximate a voltage profile measured by the sensor 120 after the secondary battery comes to an idle state or a no-load state and may be expressed as a generalized function as shown in Equation (1) below.

$$V_{cell} = V_{cathode}[k] - V_{anode}[k] \quad (1)$$

In Equation (1), $V_{cell}[k]$ represents an estimated voltage of the secondary battery 110, $V_{cathode}[k]$ represents an estimated voltage formed at the cathode of the secondary battery 110, and $V_{anode}[k]$ represents an estimated voltage formed at the anode of the secondary battery 110. In addition, k represents a time index corresponding to the time when the voltage of the secondary battery 110 is measured. For example, if the profile of voltages measured by the sensor 120 has voltage data measured as much as 100 times, k has an integer value belonging to the range of 0 to 99 (including the borders). Hereinafter, unless otherwise noted, terms endowed with k in perenthsis represent terms estimated or calculated at $k^{th}$ times.

In an embodiment, $V_{cathode}[k]$ and $V_{anode}[k]$ may be expressed as generalized functions as shown in Equations (2) and (3) below.

$$V_{cathode}[k]=f(V_{c1}[k],V_{c2}[k],i_{cell}[k],R_{0\_relax},\ldots) \quad (2)$$

$$V_{anode}[k]=g(V_a[k],i_{cell}[k],\ldots) \quad (3)$$

Here, $V_{c1}[k]$, $V_{c2}[k]$ and $V_a[k]$ may be generalized as shown in Equations (4), (5) and (6), without being limited thereto.

$$V_{c1}[k]=OCV_{c1}(z_{c1}[k])+V_{impedance\_c1}[k] \quad (4)$$

$$V_{c2}[k]=OCV_{c2}(z_{c2}[k])+V_{impedance\_c2}[k] \quad (5)$$

$$V_a[k]=OCV_a(z_a[k])+V_{impedance\_a}[k] \quad (6)$$

In Equation (2), the function f represents a function for calculating a voltage of the cathode of the secondary battery 110, and in Equation (3), the function g represents a function for calculating a voltage of the anode of the secondary battery 110. These functions f and g may be derived from a circuit model as an embodiment, as being described later in detail.

In the operation expressions shown in Equations (2) to (6), the subscripts 'c1' and 'c2' respectively represent the first cathode material and the second cathode material included in the blended cathode material, and the subscript 'a' represents the anode material included in the anode. In addition, the subscripts 'impedance_c1' and 'impedance_c2' respectively represent impedance including a resistance component, a capacity component, an inductor component or their combinations, respectively originating from the first cathode material and the second cathode material, and the impedance_a represents impedance including a resistance component, a capacity component, an inductor component or their combinations, originating from the anode material.

Referring to Equation (2), the function f used for calculating the $V_{cathode}[k]$ of the cathode includes at least $V_{c1}[k]$, $V_{c2}[k]$, $i_{cell}[k]$ and $R_{0\_relax}$ as input parameters. In addition, the function g used for calculating the $V_{anode}[k]$ of the anode includes at least $V_a[k]$ and $i_{cell}[k]$ as input parameters. The symbol ' . . . ' included in the functions f and g shows that different parameters may be added as input parameters when necessary.

In the functions f and g, $i_{cell}[k]$ is a common parameter and represents current flowing through the secondary battery 110. The $i_{cell}[k]$ may be detected by the sensor 120. When the secondary battery 110 is discharged, the $i_{cell}[k]$ is a discharge current. If the secondary battery 110 comes to an idle state or a no-load state while being discharged, the $i_{cell}[k]$ becomes substantially 0 (zero) or decreases to a small negligible value.

The functions f and g include various parameters in addition to $i_{cell}[k]$. Hereinafter, the various parameters of each of the function f and g will be taken into consideration.

<Input Parameters of the Function f>

In the function f, $V_{c1}[k]$ is a voltage formed at the first cathode material as a result of reaction of the first cathode material and operating ions and is expressed as a sum of at least $OCV_{c1}(z_{c1}[k])$ and $V_{impedance\_c1}[k]$.

The $OCV_{c1}(z_{c1}[k])$ is an open-circuit voltage component of the first cathode material and changes according to $z_{c1}[k]$ which is a state of the first cathode material. Since $z_{c1}[k]$ decreases from 1 to 0 as operating ions react with the first cathode material, the $OCV_{c1}(z_{c1}[k])$ tends to decrease as $z_{c1}[k]$ decreases. The $OCV_{c1}(z_{c1}[k])$ may be defined in advance by making a half cell with the first cathode material and measuring an open-circuit voltage profile of the half cell while discharging the secondary battery until SOC (namely, $z_{c1}[k]$) changes from 1 to 0.

The $OCV_{c1}(z_{c1}[k])$ may be a look-up table built by storing an open-circuit voltage of each $z_{c1}[k]$ of the open-circuit voltage profile as a table-type database, or a look-up function obtained by numerically analyzing the open-circuit voltage profile as a function, without being limited thereto.

When an entire capacity of the first cathode material where operating ions may be intercalated is $Q_{c1}$, if the operating ions start being intercalated, the $z_{c1}[k]$ decreases from 1 in inverse proportion to a ratio of the capacity of intercalated operating ions in comparison to the $Q_{c1}$ and becomes 0 if all operating ions corresponding to the entire capacity $Q_1$ are intercalated into the first cathode material. In other words, the $z_{c1}[k]$ is a parameter inversely proportional to the amount of operating ions having reacted with the first cathode material and may correspond to SOC of the half cell of the first cathode material mentioned above. Therefore, the $z_{c1}[k]$ may be regarded as a parameter representing a state of the first cathode material.

The $V_{impedance\_c1}[k]$ represents a voltage component formed by impedance including a resistance component, a capacity component, an inductor component or their combinations, originating from the first cathode material. The impedance may be changed according to the kind of the first cathode material, and if there is no impedance in view of the electrochemical characteristic of the first cathode material, it is not excluded that the $V_{impedance\_c1}[k]$ becomes 0. In addition, at least two component included in the impedance may be connected in series and/or in parallel. In addition, the $V_{impedance\_c1}[k]$ is changed with the influence of current generated when the first cathode material reacts with operating ions. Therefore, the $V_{impedance\_c1}[k]$ may be calculated by using an impedance voltage calculation equation derived from a common circuit theory.

In addition, in the function f, $V_{c2}[k]$ is a voltage formed at the second cathode material as a result of reaction between the second cathode material and operating ions and is expressed as a sum of at least $OCV_{c2}(z_{c2}[k])$ and $V_{impedance\_c2}[k]$.

The $OCV_{c2}(z_{c2}[k])$ is an open-circuit voltage component of the second cathode material and changes according to $z_{c2}[k]$ which is a state of the second cathode material. Since $z_{c2}[k]$ decreases from 1 to 0 as operating ions react with the second cathode material, the $OCV_{c2}(z_{c2}[k])$ tends to decrease as $z_{c2}[k]$ decreases. The $OCV_{c2}(z_{c2}[k])$ may be defined in advance by making a half cell with the second cathode material and measuring an open-circuit voltage profile of the half cell while discharging the secondary battery until SOC (namely, $z_{c2}[k]$) changes from 1 to 0.

The $OCV_{c2}(z_{c2}[k])$ may be a look-up table built by storing an open-circuit voltage of each $z_{c2}[k]$ of the open-circuit voltage profile as a table-type database, or a look-up function obtained by numerically analyzing the open-circuit voltage profile as a function, without being limited thereto.

When an entire capacity of the second cathode material where operating ions may be intercalated is $Q_{c2}$, if the operating ions start being intercalated, the $z_{c2}[k]$ decreases from 1 in inverse proportion to a ratio of the capacity of intercalated operating ions in comparison to the $Q_{c2}$ and becomes 0 if all operating ions corresponding to the entire capacity $Q_{c2}$ are intercalated into the secondary cathode material. In other words, the $z_{c2}[k]$ is a parameter inversely proportional to the amount of operating ions having reacted with the second cathode material and may correspond to SOC of the half cell of the second cathode material mentioned above. Therefore, the $z_{c2}[k]$ may be regarded as a parameter representing a state of the second cathode material.

The $V_{impedance\_c2}[k]$ represents a voltage component formed by impedance including a resistance component, a capacity component, an inductor component or their combinations, originating from the second cathode material. The impedance may be changed according to the kind of the second cathode material, and if there is no impedance in view of the electrochemical characteristic of the second cathode material, it is not excluded that the $V_{impedance\_c2}[k]$ becomes 0. In addition, at least two component included in the impedance may be connected in series and/or in parallel. In addition, the $V_{impedance\_c2}[k]$ is changed with the influence of current generated when the second cathode material reacts with operating ions. Therefore, the $V_{impedance\_c2}[k]$ may be calculated by using an impedance voltage calculation equation derived from a common circuit theory.

$R_{0\_relax}$, which is another input parameter included in the function f, represents a resistance component which disturbs movement of operating ions while the operating ions are transferred between the cathode materials when voltage relaxation occurs in the blended cathode material. In other words, since the transfer of operating ions in the cathode materials may be equivalently analyzed with the current flow, $R_{0\_relax}$ may be regarded as representing a series resistance component present on the path of current in view of an electric circuit.

Since the $R_{0\_relax}$ is changed according to an amount of operating ions intercalated into the first and second cathode materials, the behavior of the $R_{0\_relax}$ may be described as follows on the assumption that the first and second cathode materials are respectively a receiver and a donor of operating ions.

Since the $R_{0\_relax}$ corresponds to a resistance component disturbing movement of operating ions in an electric aspect, if the resistance component increases, the time taken for completing the transfer of operating ions, namely a voltage relaxation time, increases. Here, the voltage relaxation time is defined as $\tau_{relax}$ of FIG. 9. Therefore, a factor which increases the voltage relaxation time $\tau_{relax}$ acts as a factor which increases the magnitude of $R_{0\_relax}$, and on the contrary, a factor which decreases the voltage relaxation time $\tau_{relax}$ acts as a factor which decreases the magnitude of $R_{0\_relax}$.

In detail, when the secondary battery comes to an idle state or a no-load state (namely, k=0) in the intrinsic voltage range where voltage relaxation is possible, if the amount of operating ions intercalated into the second cathode material is sufficiently large, the amount of operating ions to be transferred to the first cathode material increases as much, which results in the increase of the voltage relaxation time $\tau_{relax}$. Therefore, when the secondary battery comes to an idle state or a no-load state, as the capacity of operating ions intercalated into the second cathode material is greater, namely, as $z_{c2}[0]$ is smaller, the magnitude of $R_{0\_relax}$ increases, or vice versa. In addition, when the secondary battery comes to an idle state or a no-load state (namely, k=0) in the intrinsic voltage range where voltage relaxation is possible, a residual capacity of the first cathode material where operating ions may be intercalated gives an influence on the magnitude of $R_{0\_relax}$. In other words, if the residual capacity of the first cathode material where operating ions may be intercalated is large, operating ions are transferred that much faster, which shortens the voltage relaxation time $\tau_{relax}$. Therefore, as a residual capacity of the first cathode material where operating ions may be intercalated is greater, namely as $z_{c1}[0]$ is greater, the size of $R_{0\_relax}$ decreases, or vice versa. If taking such behavior of $R_{0\_relax}$ into consideration, $R_{0\_relax}$ may be estimated from a parameter generally expressed by Equation (7) below, without being limited thereto.

$$\frac{(1 - z_{c2}[0])Q_{c1}}{z_{c1}[0]Q_{c2}} \tag{7}$$

<Input Parameters of the Function g>

In the function g, $V_a[k]$ is a voltage formed at the anode material as a result of the reaction of the anode material and operating ions and is expressed as a sum of at least $OCV_a(z_a[k])$ and $V_{impedance\_a}[k]$.

The $OCV_a(z_a[k])$ is an open-circuit voltage component of the anode material and changes according to $z_a[k]$ which is a state of the anode material. $z_a[k]$ decreases as a state of the anode material decreases, namely operating ions are deintercalated from the anode material. For reference, in view of the anode material, the decrease of a state means that operating ions are deintercalated from the anode material. Therefore, $OCV_a(z_a[k])$ tends to increase as $z_a[k]$ decreases. The $OCV_a(z_a[k])$ may be defined by using an open-circuit voltage profile obtained by making a half cell with the anode material and measuring a open-circuit voltage while varying SOC (namely, $z_a[k]$) of the half cell from 1 to 0.

The $OCV_a(z_a[k])$ may be a look-up table built by storing an open-circuit voltage of each $z_a[k]$ of the open-circuit voltage profile as a table-type database, or a look-up function obtained by numerically analyzing the open-circuit voltage profile as a function, without being limited thereto.

When an entire capacity of the anode material where operating ions may be deintercalated is $Q_a$, if the operating ions start being deintercalated, the $z_a[k]$ decreases from 1 in inverse proportion to a ratio of the capacity of deintercalated operating ions in comparison to the $Q_a$ and becomes 0 if all operating ions corresponding to the entire capacity $Q_a$ are deintercalated from the anode material. In other words, the $z_a[k]$ is a parameter inversely proportional to the amount of operating ions deintercalated from the anode material and may correspond to SOC of the half cell of the anode material mentioned above. In addition, since the ratio of operating ions deintercalated from the anode material is identical to the state of the secondary battery, the $z_a[k]$ may correspond to $z_{cell}[k]$ which is a parameter representing a state of the secondary battery.

The $V_{impedance\_a}[k]$ represents a voltage component formed by impedance including a resistance component, a capacity component, an inductor component or their combinations, originating from the anode material. The impedance may be changed according to the kind of the anode material, and if there is no impedance in view of the electrochemical characteristic of the anode material, it is not excluded that the $V_{impedance\_a}[k]$ becomes 0. In addition, at least two component included in the impedance may be connected in series and/or in parallel. In addition, the $V_{impedance\_a}[k]$ is changed with the influence of current generated when the anode material reacts with operating ions. Therefore, the $V_{impedance\_a}[k]$ may be calculated by using an impedance voltage calculation equation derived from a common circuit theory.

From the above equations, $V_{cell}[k]$, $V_{c1}[k]$, $V_{c2}[k]$ and $V_a[k]$ may be arranged again as shown in Equations (8), (9), 10 and (11) below.

$$V_{cell}[k]=f(V_{c1}[k],V_{c2}[k],i_{cell}[k],R_{0\_relax},\ldots)-g(V_a[k],i_{cell}[k],\ldots) \tag{8}$$

$$V_{c1}[k]=OCV_{c1}(z_{c1}[k])+V_{impedance\_c1}[k] \tag{9}$$

$$V_{c2}[k]=OCV_{c2}(z_{c2}[k])+V_{impedance\_c2}[k] \tag{10}$$

$$V_a[k]=OCV_a(z_a[k])+V_{impedance\_a}[k] \tag{11}$$

Hereinafter, a voltage estimating model capable of being derived from a circuit model will be described as a more detailed embodiment. However, the present disclosure is not limited to the embodiment. Meanwhile, the circuit model capable of being used for deriving the voltage estimating model may be modified when necessary according to the kind of blended cathode material included in the secondary battery. Therefore, even though the circuit model is modified according to the modification of the blended cathode material, the modified circuit model should be included in the scope of the circuit model disclosed in the present disclosure.

Figure 11:
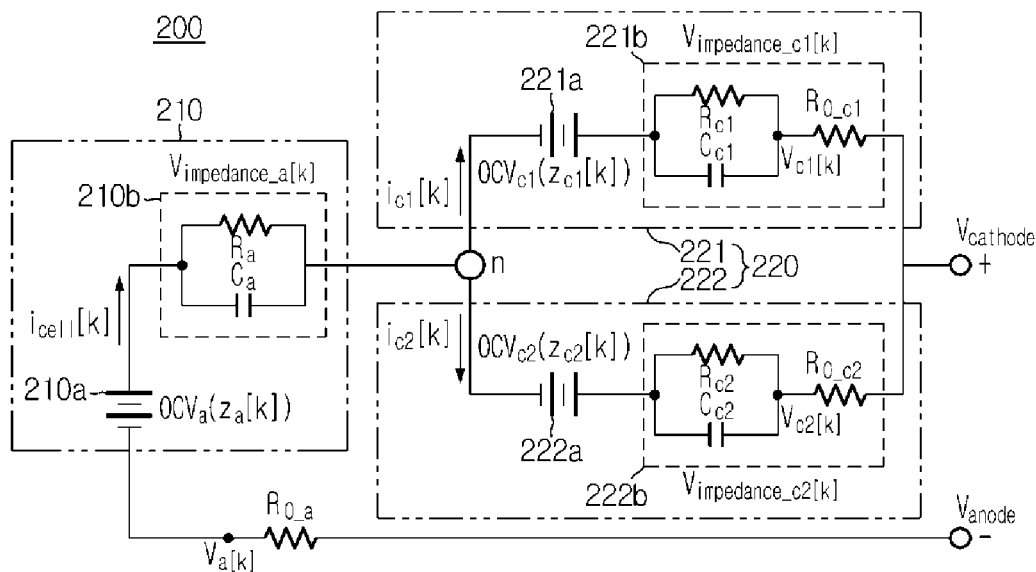
FIG. 11 is a circuit diagram showing a circuit model according to an embodiment of the present disclosure.

FIG. 11 is a circuit diagram exemplarily showing a circuit model 200 capable of inducing a voltage estimating model according to an embodiment of the present disclosure.

Referring to FIG. 11, the circuit model 200 includes an anode circuit unit 210 and a cathode circuit unit 220, and the cathode circuit unit 220 includes at least a first cathode material circuit unit 221 and a second cathode material circuit unit 222.

The anode circuit unit 210 includes an open-circuit voltage component 210a of the anode material and an impedance component 210b relating to electrochemical properties of the anode material. When the secondary battery is discharged, voltage differences respectively corresponding to $OCV_a(z_a[k])$ and $V_{impedance\_a}[k]$ are generated at both terminals of the open-circuit voltage component 210a and the impedance component 210b of the anode material. The $OCV_a(z_a[k])$ and $V_{impedance\_a}[k]$ have been described above with reference to Equation (11).

In an embodiment, the impedance component 210b of the anode material includes an RC circuit having a resistance component $R_a$ and a capacity component $C_a$ connected in parallel as circuit components, and a resistance component $R_{0\_a}$ connected to the RC circuit in series. The resistance component $R_a$ and $R_{0\_a}$ and the capacity component $C_a$ included in the impedance component 210b of the anode material are determined by experiments considering electrochemical properties of at least an anode material and electric properties of a metallic current collector included in the anode. In addition, the resistance component and/or capacity component included in the impedance component 210b of the anode material may be omitted. In addition, the impedance component 210b of the anode material may further include another resistance component, another capacity component, another inductor component, or combinations thereof.

The first cathode material circuit unit 221 includes an open-circuit voltage component 221a of the first cathode material and an impedance component 221b of the first cathode material. When the secondary battery is discharged, voltage differences corresponding to $OCV_{c1}(z_{c1}[k])$ and $V_{impedance\_c1}[k]$ are respectively generated at both ends of the open-circuit voltage component 221a and the impedance component 221b of the first cathode material. The $OCV_{c1}(z_{c1}[k])$ and $V_{impedance\_c1}[k]$ have been described above with reference to Equation (9).

In an embodiment, the impedance component 221b of the first cathode material includes an RC circuit having a resistance component $R_{c1}$ and a capacity component $C_{c1}$ connected in parallel as circuit components, and a resistance component $R_{0\_c1}$ connected to the RC circuit in series. The resistance components $R_{c1}$ and $R_{0\_c1}$ and the capacity component $C_{c1}$ included in the impedance component 221b of the first cathode material are determined by experiments considering electrochemical properties of at least a first cathode material and electric properties of a metallic current collector included in the cathode. In addition, the resistance component and/or capacity component included in the impedance component 221b of the first cathode material may be omitted. In addition, the impedance component 221b of the first cathode material may further include another resistance component, another capacity component, another inductor component, or combinations thereof.

The second cathode material circuit unit 222 includes an open-circuit voltage component 222a and an impedance component 222b of the second cathode material. When the secondary battery is discharged, voltage differences respectively corresponding to $OCV_{c2}(z_{c2}[k])$ and $V_{impedance\_c2}[k]$ are generated at both ends of the open-circuit voltage component 222a and the impedance component 222b of the second cathode material. The $OCV_{c2}(z_{c2}[k])$ and $V_{impedance\_c2}[k]$ have been described above with reference to Equation (10).

In an embodiment, the impedance component 222b of the second cathode material includes an RC circuit having a resistance component $R_{c2}$ and a capacity component $C_{c2}$ connected in parallel as circuit components, and a resistance component $R_{0\_c2}$ connected to the RC circuit in series. The resistance components $R_{c2}$ and $R_{0\_c2}$ and the capacity component $C_{c2}$ included in the impedance component 222b of the second cathode material are determined by experiments considering electrochemical properties of at least a second cathode material and electric properties of a metallic current collector included in the cathode. In addition, the resistance component and/or capacity component included in the impedance component 222b of the second cathode material may be omitted. In addition, the impedance component 222b of the second cathode material may further include another resistance component, another capacity component, another inductor component, or combinations thereof.

Meanwhile, while the secondary battery is being discharged, operating ions are deintercalated from the anode material included in the anode and move to the blended cathode material included in the cathode. The movement of operating ions may be expressed by current flow $i_{cell}$, $i_{c1}$, $i_{c2}$ at the circuit model 200. A single operating ion moving from the anode to the cathode during the discharge of the secondary battery reacts with either the first cathode material or the second cathode material. Therefore, the current flowing form the anode to the cathode is divided into a current $i_{c1}$ flowing toward the first cathode material and a current $i_{c2}$ flowing toward the second cathode material. The current division is shown at a parallel circuit. Therefore, in the circuit model 200, the first cathode material circuit unit 221 and the second cathode material circuit unit 222 are connected in parallel. However, the electric connection between the first cathode material and the second cathode material in the circuit model may be modified in various ways according to the kind of cathode materials of the blended cathode material and an operating mechanism of the secondary battery, as obvious in the art.

In the anode, since the current flowing to the cathode corresponds to the entire current flowing in the secondary battery while the secondary battery is being discharged, the magnitude of the current is identical to the magnitude of $i_{cell}[k]$ which is a discharge current of the secondary battery. Therefore, a current equation may be induced based on the node n shown in the circuit model, like Equation (12) below.

$$-i_{cell}[k]=i_{c1}[k]+i_{c2}[k] \quad (12)$$

In Equation (12), when the secondary battery is being charged, $i_{cell}[k]$ has a negative value and $i_{c1}[k]$ and $i_{c2}[k]$ have positive values. On the contrary, when the secondary battery is being discharged, $i_{cell}[k]$ has a positive value and $i_{c1}[k]$ and $i_{c2}[k]$ have negative values.

Meanwhile, when a voltage difference of both ends of the resistance component $R_{0\_c1}$ is defined as $V_{R0\_c1}[k]$ and a voltage difference of both ends of the resistance component $R_{0\_c2}$ is defined as $V_{R0\_c2}[k]$, due to the Ohm's low, $i_{c1}[k]$ and $i_{c2}[k]$ of Equation (12) may be arranged as shown in Equations (13) and (14) below $$i_{c1}[k] = \frac{V_{R0\_c1}[k]}{R_{0\_c1}} \qquad (13)$$

$$i_{c2}[k] = \frac{V_{R0\_c2}[k]}{R_{0\_c2}} \qquad (14)$$

In addition, if voltages applied to left terminals of the resistance components $R_{0\_c1}$ and $R_{0\_c2}$ are respectively defined as $V^*_{c1}[k]$ and $V^*_{c2}[k]$ and a voltage applied to the cathode terminal is defined as $V_{cathode}[k]$, $V_{R0\_c1}[k]$ and $V_{R0\_c2}[k]$ of Equations (13) and (14) may be respectively arranged like Equations (15) and (16) below.

$$V_{R0\_c1}[k] = V_{cathode}[k] - V^*_{c1}[k] \qquad (15)$$

$$V_{R0\_c2}[k] = V_{cathode}[k] - V^*_{c2}[k] \qquad (16)$$

If Equations (13), (14), (15) and (16) are applied to Equation (12), Equation (12) may be arranged like Equation (17) below.

$$-i_{cell}[k] = i_{c1}[k] + i_{c2}[k] \qquad (17)$$
$$= \frac{V_{cathode}[k] - V^*_{c1}[k]}{R_{0\_c1}} + \frac{V_{cathode}[k] - V^*_{c2}[k]}{R_{0\_c2}}$$

$$V_{cathode}\left(\frac{1}{R_{0\_c1}} + \frac{1}{R_{0\_c2}}\right) = \frac{V^*_{c1}[k]}{R_{0\_c1}} + \frac{V^*_{c2}[k]}{R_{0\_c2}} - i_{cell}[k]$$

$$V_{cathode} = \left(\frac{R_{0\_c1}R_{0\_c2}}{R_{0\_c1} + R_{0\_c2}}\right)\left(\frac{V^*_{c1}[k]}{R_{0\_c1}} + \frac{V^*_{c2}[k]}{R_{0\_c2}} - i_{cell}[k]\right)$$

In addition, if Equations (15), (16) and (17) are applied to Equations (13) and (14), Equations (13) and (14) may be arranged like Equations (18) and (19) below.

$$i_{c1}[k] = \frac{V_{cathode}[k] - V^*_{c1}[k]}{R_{0\_c1}} \qquad (18)$$

$$i_{c1}[k] = \frac{V^*_{c2}[k] - V^*_{c1}[k] - i_{cell}[k]R_{0\_c2}}{R_{0\_c1} + R_{0\_c2}}$$

$$i_{c2}[k] = \frac{V_{cathode}[k] - V^*_{c2}[k]}{R_{0\_c2}} \qquad (19)$$

$$i_{c2}[k] = \frac{V^*_{c1}[k] - V^*_{c2}[k] - i_{cell}[k]R_{0\_c1}}{R_{0\_c1} + R_{0\_c2}}$$

Meanwhile, if considering the node n connecting the first and second cathode materials circuit units 221, 222 as a reference potential, $V^*_{c1}[k]$ and $V^*_{c2}[k]$ may be expressed like Equations (20) and (21) below.

$$V^*_{c1}[k] = OCV_{c1}(z_{c1}[k]) + V_{RC\_c1}[k] \qquad (20)$$

$$V^*_{c2}[k] = OCV_{c2}(z_{c2}[k]) + V_{RC\_c2}[k] \qquad (21)$$

In Equation (20), $OCV_{c1}(z_{c1}[k])$ is a voltage formed by the open-circuit voltage component 2211a of the first cathode material, and $V_{RC\_c1}[k]$ is a voltage formed by the RC circuit included in the impedance component 221b of the first cathode material. Similarly, in Equation (21), $OCV_{c2}(z_{c2}[k])$ is a voltage formed by the open-circuit voltage component 222a of the second cathode material, and $V_{RC\_c2}[k]$ is a voltage formed by the RC circuit included in the impedance component 222b of the second cathode material.

By using Equations (20) and (21), Equations (17), (18) and (19) may be arranged like Equations (22), (23) and (24) below.

$$V_{cathode}[k] = \left(\frac{R_{0\_c1}R_{0\_c2}}{R_{0\_c1} + R_{0\_c2}}\right)\left(\frac{OCV_{c1}(z_{c1}[k]) + V_{RC\_c1}[k]}{R_{0\_c2}} + \frac{OCV_{c2}(z_{c2}[k]) + V_{RC\_c2}[k]}{R_{0\_c2}} - i_{cell}[k]\right) \qquad (22)$$

$$i_{c1}[k] = \frac{(OCV_{c2}(z_{c2}[k]) + V_{RC\_c2}[k]) - (OCV_{c1}(z_{c1}[k]) + V_{RC\_c1}[k]) - i_{cell}[k]R_{0\_c2}}{R_{0\_c1} + R_{0\_c2}} \qquad (23)$$

$$i_{c2}[k] = \frac{(OCV_{c1}(z_{c1}[k]) + V_{RC\_c1}[k]) - (OCV_{c2}(z_{c2}[k]) + V_{RC\_c2}[k]) - i_{cell}[k]R_{0\_c1}}{R_{0\_c1} + R_{0\_c2}} \qquad (24)$$

In Equations (22), (23) and (24), $V_{RC\_c1}[k]$ and $V_{RC\_c2}[k]$ are voltages respectively formed at the RC circuits of the first and second cathode material circuit units 221, 222. Generally, voltage and current of the RC circuit satisfy Differential Equation (25) below as time t changes. Therefore, if Equation (25) is changed into a discrete time equation, Equation (26) below may be obtained, where $\Delta t$ represents a current and voltage measurement interval.

$$\dot{V}(t) = -\frac{1}{RC}V(t) + \frac{1}{C}i(t) \qquad (25)$$

$$V[k+1] = V[k]e^{-\frac{\Delta t}{RC}} + R\left(1 - e^{-\frac{\Delta t}{RC}}\right)i[k] \qquad (26)$$

If Equation (26) corresponding to an RC circuit equation is used, the voltages $V_{RC\_c1}[k]$ and $V_{RC\_c2}[k]$ respectively formed by RC circuits of the first and second cathode materials circuit units 221, 222 may be expressed with a discrete time equation like Equations (27) and (28) below.

$$V_{RC\_c1}[k+1] = V_{RC\_c1}[k]e^{-\frac{\Delta t}{R_{c1}C_{c1}}} + R_{c1}\left(1 - e^{-\frac{\Delta t}{R_{c1}C_{c1}}}\right)i_{c1}[k] \qquad (27)$$

$$V_{RC\_c2}[k+1] = V_{RC\_c2}[k]e^{-\frac{\Delta t}{R_{c2}C_{c2}}} + R_{c2}\left(1 - e^{-\frac{\Delta t}{R_{c2}C_{c2}}}\right)i_{c2}[k] \qquad (28)$$

Equation (27) is a voltage calculation equation for calculating a voltage formed by the RC circuit among impedance components included in the first cathode material circuit unit 221. The impedance of the first cathode material circuit unit 221 further includes a resistance $R_{0\_c1}$. Therefore, the impedance voltage calculation equation for calculating a voltage formed by the impedance of the first cathode material circuit unit 221 may be induced by adding voltage $R_{0\_c1} \cdot i_{c1}[k]$ formed by resistance $R_{0\_c1}$ to Equation (27).

In addition, Equation (28) is a voltage calculation equation for calculating a voltage formed by the RC circuit among impedance components included in the second cathode material circuit unit 222. The impedance of the second cathode material circuit unit 222 further includes a resistance $R_{0\_c2}$. Therefore, the impedance voltage calculation equation for calculating a voltage formed by the impedance of the second cathode material circuit unit 222 may be induced by adding voltage $R_{0\_c2} \cdot i_{c2}[k]$ formed by resistance $R_{0\_c2}$ to Equation (28).

Meanwhile, referring to Equation (22), the voltage $V_{cathode}[k]$ of the cathode terminal is determined by four variables, namely voltages $OCV_{c1}(z_{c1}[k])$ and $OCV_{c2}(z_{c2}[k])$ formed by the open-circuit voltage component of the first and second cathode materials circuit units 221, 222 and voltages $V_{RC\_c1}[k]$ and $V_{RC\_c2}[k]$ formed by the RC circuit.

Among the four variables, $OCV_{c1}(z_{c1}[k])$ and $OCV_{c2}(z_{c2}[k])$ corresponding to $z_{c1}[k]$ and $z_{c2}[k]$ may be defined in advance as a look-up table or a look-up function as described above. Therefore, $OCV_{c1}(z_{c1}[k])$ and $OCV_{c2}(z_{c2}[k])$ may be calculated instantly if $z_{c1}[k]$ and $z_{c2}[k]$ are known.

The $z_{c1}[k]$ and $z_{c2}[k]$ is changed according to $i_{c1}[k]$ and $i_{c1}[k]$ which are currents respectively flowing to the first and second cathode materials during $\Delta t$. Therefore, discrete time equations relating to the $z_{c1}[k]$ and $z_{c2}[k]$ may be expressed like Equations (29) and (30) below.

$$z_{c1}[k+1]=z_{c1}[k]+i_{c1}[k]\Delta t/Q_{c1} \qquad (29)$$

$$z_{c2}[k+1]=z_{c2}[k]+i_{c2}[k]\Delta t/Q_{c2} \qquad (30)$$

In the above, in order to calculate the voltage $V_{cathode}[k]$ of the cathode terminal by using Equations (27), (28), (29) and (30) which are four discrete time equations induced as above, it is required to initialize $V_{RC\_c1}[0]$, $V_{RC\_c2}[0]$, $z_{c1}[0]$, $z_{c2}[0]$, $i_{c1}[0]$, $i_{c2}[0]$ to specific values when k is 0 (zero). However, referring to Equations (23) and (24), since $i_{c1}[0]$ and $i_{c2}[0]$ are eventually determined by $V_{RC\_c1}[0]$, $V_{RC\_c2}[0]$, $z_{c1}[0]$ and $z_{c2}[0]$, the values to be initialized are reduced to $V_{RC\_c1}[0]$, $V_{RC\_c2}[0]$, $z_{c1}[0]$ and $z_{c2}[0]$.

Among the values required to be initialized, $V_{RC\_c1}[0]$ and $V_{RC\_c2}[0]$ are voltages formed at the RC circuits included in the first and second cathode materials circuit units 221, 222 after the secondary battery comes to an idle state or a no-load state. However, in the RC circuit, voltage changes slowly even though current flows through the RC circuit. Therefore, in an embodiment, the $V_{RC\_c1}[0]$ and $V_{RC\_c2}[0]$ may be set to have initial condition values of 0 (zero) as shown in Equations (31) and (32) below. Of course, $V_{RC\_c1}[0]$ and $V_{RC\_c2}[0]$ may be set to have values greater than 0 (zero) depending on the kinds of the blended cathode material included in the secondary battery.

$$V_{RC\_c1}[0]=0 \qquad (31)$$

$$V_{RC\_c2}[0]=0 \qquad (32)$$

As described above, if $V_{RC\_c1}[0]$ and $V_{RC\_c2}[0]$ are initialized, the impedance voltage components $V_{impedance\_c1}[k]$ and $V_{impedance\_c2}[k]$ included in the first cathode material circuit unit 221 and the second cathode material circuit unit 222 may be respectively initialized to $R_{0\_c1} \cdot i_{c1}[0]$ and $R_{0\_c2} \cdot i_{c2}[0]$.

In addition, $z_{c1}[0]$ and $z_{c2}[0]$ exhibits residual capacities of the first and second cathode materials where operating ions may be intercalated, when the secondary battery comes to an idle state or a no-load state. The $z_{c1}[0]$ and $z_{c2}[0]$ may be initialized to values of $OCV^{-1}_{c1}(OCV_{c1}[0])$ and $OCV^{-1}_{c2}(OCV_{c2}[0])$. Here, $OCV^{-1}_{c1}$ and $OCV^{-1}_{c1}$ correspond to an inversely transformed look-up table or an inversely transformed look-up function of $OCV_{c1}(z_{c1}[k])$ and $OCV_{c2}(z_{c2}[k])$, which may be defined in advance. Therefore, the $OCV^{-1}_{c1}$ and $OCV^{-1}_{c1}$ may be regarded as operators for calculating states $z_{c1}[0]$ and $z_{c2}[0]$ of the first and second cathode materials, which may respectively correspond to voltages $OCV_{c1}[0]$ and $OCV_{c2}[0]$ formed at the open-circuit voltage components of the first and second cathode materials circuit units.

Meanwhile, just after the secondary battery comes to an idle state or a no-load state, the values of $OCV_{c1}[0]$ and $OCV_{c2}[0]$ may not be exactly recognized. Therefore, in an embodiment, the $OCV_{c1}[0]$ and $OCV_{c2}[0]$ may be approximately set like Equations (33) and (34) below by using voltage $V_{cell}[0]$ of the secondary battery, measured just after the secondary battery comes to an idle state or a no-load state. However, Equations (33) and (34) may be modified when necessary according to the kinds of the blended cathode material included in the secondary battery and the operating mechanism of the secondary battery.

Supposing $V_{cell}[0] \cong OCV_{c1}(z_{c1}[0])-OCV_a(z_a[0])$ $OCV_{c1}(z_{c1}[0]) \cong V_{cell}[0], z_a[0]=z_{cell}[0]$, $$OCV_{c1}[0] \cong V_{cell}[0]+OCV_a(z_{cell}[0]) \qquad (33)$$

Supposing $V_{cell}[0] \cong OCV_{c2}(z_{c2}[0])-OCV_a(z_a[0])$ $OCV_{c2}(z_{c2}[0]) \cong V_{cell}[0], z_a[0]=z_{cell}[0]$, $$OCV_{c2}[0] \cong V_{cell}[0]+OCV_a(z_{cell}[0]) \qquad (34)$$

In Equations (33) and (34), $z_{cell}[0]$ may be calculated by using inversely transformed $OCV^{-1}_{cell}$ of $OCV_{cell}$ corresponding to a look-up table or a look-up function where an open-circuit voltage of the secondary battery is defined according to a state of the secondary battery. In other words, $z_{cell}[0]$ is $OCV^{-1}_{cell}(V_{cell}[0])$. The look-up table or the look-up function of $OCV_{cell}$ may be easily obtained through an open-circuit voltage measurement experiment for each state of the secondary battery including the blended cathode material. In addition, $OCV_a$ is a look-up table or a look-up function for calculating a voltage formed at the open-circuit voltage component of the anode material circuit unit 210 by using a state of the anode material, namely a residual capacity of the anode material where operating ions may be deintercalated therefrom as an input parameter. This has been described in detail above with reference to Equation (11).

If Equations (33) and (34) are used, initial values of $z_{c1}$ and $z_{c2}$ may be set as in Equations (35) and (36) below.

$$z_{c1}[0]=OCV^{-1}_{c1}(OCV_{c1}[0])=OCV^{-1}_{c1}(V_{cell}[0]+OCV_a(OCV^{-1}_{cell}(V_{cell}[0]))) \qquad (35)$$

$$z_{c2}[0]=OCV^{-1}_{c2}(OCV_{c2}[0])=OCV^{-1}_{c2}(V_{cell}[0]+OCV_a(OCV^{-1}_{cell}(V_{cell}[0]))) \qquad (36)$$

The voltage estimating model described above is focused on estimation of a cathode voltage of the secondary battery including the blended cathode material. However, the above voltage estimating model may also be similarly applied when estimating an anode voltage of the secondary battery.

In other words, in the anode material circuit unit 210 of FIG. 11, when taking the node n as a reference potential, voltage $V^*_a[k]$ applied to the left terminal of the resistance $R_{0\_a}$ may be expressed as a sum of voltages formed at the open-circuit voltage component of the anode material circuit unit 210 and the RC circuit as shown in Equation (37) below.

$$V^*_a[k]=OCV_a(z_a[k])+V_{RC\_a}[k] \qquad (37)$$

In addition, since the voltage $V_{anode}[k]$ of the anode terminal is lower than $V^*_a[k]$ as much as $i_{cell}[k]R_a$, $V_{anode}[k]$ may be expressed like Equation (38) below.

$$V_{anode}[k] = V_a^*[k] - i_{cell}[k]R_{0\_a} \quad (38)$$

$$= OCV_a(z_a[k]) + V_{RC\_a}[k] - i_{cell}[k]R_{0\_a}$$

In addition, a state $z_a[k]$ of the anode material and a voltage applied to the RC circuit of the anode material circuit unit 210 may be expressed as discrete time equations like Equations (39) and (40) below, similar to Equations (27) and (29).

$$z_a[k+1] = z_a[k] - i_a[k]\Delta t/Q_a = z_a[k] - i_{cell}[k]\Delta t/Q_a \quad (39)$$

$$V_{RC\_a}[k+1] = V_{RC\_a}[k]e^{-\frac{\Delta t}{R_a C_a}} + R_a\left(1 - e^{-\frac{\Delta t}{R_a C_a}}\right)i_a[k] \quad (40)$$

$$= V_{RC\_a}[k]e^{-\frac{\Delta t}{R_a C_a}} + R_a\left(1 - e^{-\frac{\Delta t}{R_a C_a}}\right)i_{cell}[k]$$

Equation (40) is a voltage calculation equation formed by the RC circuit, among the impedance components included in the anode material circuit unit 210. The impedance of the anode material circuit unit 210 further includes resistance $R_{0\_a}$. Therefore, the impedance voltage calculation equation for calculating a voltage formed by the impedance of the anode material circuit unit 210 may be induced by adding voltage $R_{0\_a} \cdot i_{cell}[k]$ formed by resistance $R_{0\_a}$ to Equation (40).

In addition, in order to use the discrete time equations (39) and (40), in an embodiment, initial conditions $V_{RC\_a}[0]$ and $z_a[0]$ may be set as in Equations (41) and (42).

$$V_{RC\_a}[0]=0 \quad (41)$$

$$z_a[0]=z_{cell}[0]=OCV^{-1}_{cell}(V_{cell}[0]) \quad (42)$$

In Equations (41) and (42), the initial condition of $V_{RC\_a}[0]$ is set to be 0 (zero) because voltage at the RC circuit slowly changes according to the change of current even though the secondary battery comes to an idle state or a no-load state and causes a current change at the RC circuit.

In addition, the initial condition of $z_a[0]$ is set to be identical to $z_{cell}[0]$ because a state of the anode material is substantially identical to the state of the secondary battery when the secondary battery comes to an idle state or a no-load state.

Meanwhile, if the $V_{RC\_a}[0]$ is initialized as in Equation (41), the impedance voltage component $V_{impedance\_a}[k]$ included in the anode material circuit unit 210 may be initialized to $R_{0\_a} \cdot i_{cell}[0]$. However, if the secondary battery comes to a no-load state, $i_{cell}[0]$ is 0 or near to 0. Therefore, the initial condition $V_{impedance\_a}[0]$ may be regarded as being 0 or near to 0.

Hereinafter, a method for the control unit 130 to estimate a voltage of the secondary battery whenever time $\Delta t$ passes just after the secondary battery comes to an idle state or a no-load state will be described in detail by using the voltage estimating model described above.

First, the control unit 130 initializes values of $V_{RC\_c1}[0]$, $V_{RC\_c2}[0]$, $z_{c1}[0]$, and $z_{c2}[0]$ corresponding to initial conditions of the cathode and values of $V_{RC\_a}[0]$ and $z_a[0]$ corresponding to initial conditions of the anode by using the voltage $V_{cell}[0]$ measured just after the secondary battery comes to an idle state or a no-load state.

$$V_{RC\_c2}[0]=V_{RC\_c2}[0]=V_{RC\_a}[0]=0 \quad (65)$$

$$z_{c1}[0]=OCV^{-1}_{c1}(V_{cell}[0]+OCV_a(OCV^{-1}_{cell}(V_{cell}[0])))$$

$$z_{c2}[0]=OCV^{-1}_{c2}(V_{cell}[0]+OCV_a(OCV^{-1}_{cell}(V_{cell}[0])))$$

$$z_a[0]=z_{cell}[0]=OCV^{-1}_{cell}(V_{cell}[0])$$

After that, the control unit 130 calculates $i_{c1}[0]$ and $i_{c2}[0]$ by applying the initial conditions and the value of $i_{cell}[0]$ to Equations (23) and (24) relating to the cathode. Here, if the secondary battery comes to an idle state or a no-load state, value of $i_{cell}[0]$ is substantially 0 or a constant having a small value near to 0.

$$i_{c1}[0] = \frac{(OCV_{c2}(z_{c2}[0]) + V_{RC\_c2}[0]) - (OCV_{c1}(z_{c1}[0]) + V_{RC\_c1}[0]) - i_{cell}[0]R_{0_{c2}}}{R_{0_{c1}} + R_{0_{c2}}}$$

$$i_{c2}[0] = \frac{(OCV_{c1}(z_{c1}[0]) + V_{RC\_c1}[0]) - (OCV_{c2}(z_{c2}[0]) + V_{RC\_c2}[0]) - i_{cell}[0]R_{0\_c1}}{R_{0\_c1} + R_{0\_c2}}$$

If the $i_{c1}[k]$ and $i_{c2}[k]$ are calculated and time passes as much as $\Delta t$ (k=1), the control unit calculates and obtains parameters required for estimating $V_{cathode}[1]$ and $V_{anode}[1]$.

In other words, the control unit 130 obtains $V_{RC\_c1}[1]$, $V_{RC\_c2}[1]$, $z_{c1}[1]$ and $z_{c2}[1]$ by putting values of $V_{RC\_c1}[0]$, $V_{RC\_c2}[0]$, $i_{c1}[0]$ and $i_{c2}[0]$ to Equations (27), (28), (29) and (30) with respect to the cathode, and obtains $V_{RC\_a}[1]$, $z_a[1]$ by putting $V_{RC\_a}[0]$ and $i_{cell}[0]$ to Equations (40) and (39) with respect to the anode, respectively.

$$V_{RC\_c1}[1] = V_{RC\_c1}[0]e^{-\frac{\Delta t}{R_{c1} C_{c1}}} + R_{c1}\left(1 - e^{-\frac{\Delta t}{R_{c1} C_{c1}}}\right)i_{c1}[0]$$

$$V_{RC\_c2}[1] = V_{RC\_c2}[0]e^{-\frac{\Delta t}{R_{c2} C_{c2}}} + R_{c2}\left(1 - e^{-\frac{\Delta t}{R_{c2} C_{c2}}}\right)i_{c2}[0]$$

$$z_{c1}[1] = z_{c1}[0] + i_{c1}[0]\Delta t/Q_{c1}$$

$$z_{c2}[1] = z_{c2}[0] + i_{c2}[0]\Delta t/Q_{c1}$$

$$V_{RC\_a}[1] = V_{RC\_a}[0]e^{-\frac{\Delta t}{R_a C_a}} + R_a\left(1 - e^{-\frac{\Delta t}{R_a C_a}}\right)i_{cell}[0]$$

$$z_a[1] = z_a[0] - i_{cell}[0]\Delta t/Q_a$$

After that, the control unit 130 calculates $V_{cathode}[1]$, $i_{c1}[1]$ and $i_{c2}[1]$ by inputting the obtained parameters and $i_{cell}[1]$ measured when $\Delta t$ passes to Equations (22), (23) and (24) relating to the cathode. In addition, the control unit 130 calculates $V_{anode}[1]$ by inputting the obtained parameters and $i_{cell}[1]$ to Equation (38) relating to the anode. If the calculation is completed, the control unit 130 may estimate a voltage $V_{cell}[1]$ of the secondary battery when $\Delta t$ passes once (namely, k=1) by subtracting $V_{anode}[1]$ from $V_{cathode}[1]$ $$V_{cathode}[1] = \left(\frac{R_{0_{c1}} R_{0_{c2}}}{R_{0_{c1}} + R_{0_{c2}}}\right)\left(\frac{OCV_{c1}(z_{c1}[1] + V_{RC_{c1}}[1])}{R_{0_{c1}}} + \frac{OCV_{c2}(z_{c2}[1]) + V_{RC_{c2}}[1]}{R_{0_{c2}}} - i_{cell}[1]\right)$$

$$i_{c1}[1] = \frac{(OCV_{c2}(z_{c2}[1]) + V_{RC\_c2}[1]) - (OCV_{c1}(z_{c1}[1]) + V_{RC\_c2}[1]) - i_{cell}[1]R_{0\_c1}}{R_{0\_c1} + R_{0\_c2}}$$

$$i_{c2}[1] = \frac{(OCV_{c1}(z_{c1}[1]) + V_{RC\_c1}[1]) - (OCV_{c2}(z_{c2}[1]) + V_{RC\_c2}[1]) - i_{cell}[1]R_{0\_c1}}{R_{0\_c1} + R_{0\_c2}}$$

-continued $$V_{anode}[1] = OCV_a(z_a[1]) + V_{RC\_a}[1] - i_{cell}[1]R_{0\_a}$$

$$V_{cell}[1] = V_{cathode}[1] - V_{anode}[1]$$

The control unit 130 estimates $V_{cathode}[k]$ by updating $V_{RC\_c1}[k]$, $V_{RC\_c2}[k]$, $z_{c1}[k]$ and $z_{c2}[k]$ with respect to the cathode whenever $\Delta t$ passes and estimates $V_{anode}[k]$ by updating $V_{RC\_a}[k]$ and $z_a[k]$ with respect to the anode, substantially identical to the above. In addition, the control unit 130 repeats the operation for estimating $V_{cathode}[k]$ and $V_{anode}[k]$ until the time index k reaches a preset number after the secondary battery comes to an idle state or a no-load state. Therefore, the control unit 130 may obtain an estimated voltage profile of the secondary battery according to time during a preset measurement time.

Meanwhile, in the voltage estimating model described above, the point when the time index k becomes 0 is not limited to a point just before and after the secondary battery comes to an idle state or a no-load state. Therefore, in a broad sense, $V_{cell}[0]$ should be interpreted as a voltage measured for setting an initial condition when estimating a voltage of the secondary battery by using the voltage estimating model, regardless of the fact that the secondary battery is being discharged or discharging is stopped when measuring the voltage, as obvious to those skilled in the art.

Figure 12:
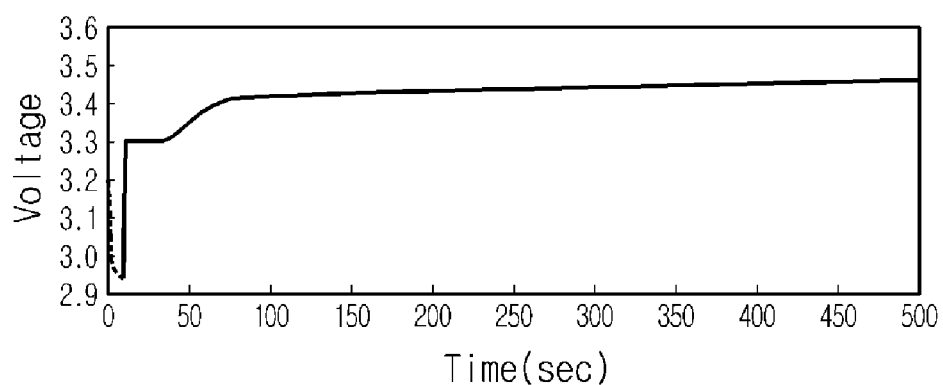
FIG. 12 is a graph showing a voltage profile of a secondary battery, estimated using a voltage estimating model according to an embodiment of the present disclosure.

FIG. 12 shows an example of a voltage profile estimated by the control unit 130, when a secondary battery including a blended cathode material where an NMC cathode material and an LFP cathode material are mixed at a ratio of 7:3 (weight ratio) comes to a no-load state while being pulse-discharged in 5c discharge current for 10 seconds in the intrinsic voltage range where voltage relaxation occurs.

In FIG. 12, a dotted line and a solid line represent voltage profiles respectively estimated in a pulse discharge area and in a no-load state area by using the voltage estimating model described above. When applying the voltage estimating model, initial conditions required for calculating $V_{cathode}[k]$ and $V_{anode}[k]$ are set by using $V_{cell}[0]$ measured when initiating the pulse discharge. In addition, $i_{cell}[k]$ is a pulse current value before the no-load state and is set to be 0 after coming to the no-load state. In addition, $\Delta t$ is set to be 1 second.

Referring to FIG. 12, the voltage profile of the no-load state area includes an inflection point which supports the occurrence of voltage relaxation in the secondary battery. In addition, it may be found that a voltage change pattern exhibited on the voltage profile is similar to a voltage change pattern exhibited when voltage relaxation occurs. This result supports that, when the secondary battery including the blended cathode material comes to an idle state or a no-load state in the intrinsic voltage range, the voltage estimating model according to the present disclosure may be usefully utilized to estimate a voltage change of the secondary battery.

Meanwhile, if the secondary battery including the blended cathode material comes to an idle state or a no-load state while being discharged in the intrinsic voltage range, operating ions are transferred between the first and second cathode materials included in the blended cathode material to generate a voltage relaxation phenomenon. Therefore, in the case the secondary battery comes to an idle state or a no-load state in the intrinsic voltage range, it is needed to add a resistance component $R_{0\_relax}$ to the circuit model described above in order to model a current flow generated during the voltage relaxation. If the resistance component $R_{0\_relax}$ is not added, the inflection point supporting the occurrence of voltage relaxation on the voltage profile estimated by the voltage estimating model appears earlier than the actual appearance time. This will be described later with reference to FIG. 16.

Figure 13:
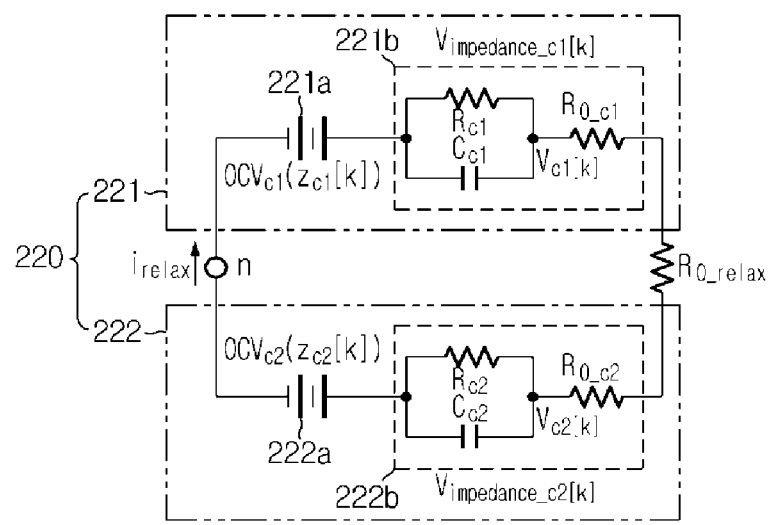
FIGS. 13 to 15 are circuit diagrams exemplarily showing various connection manners of a resistance component ($R_{0\_relax}$) which is a factor disturbing the transfer of operating ions when the voltage relaxation occurs in the secondary battery.
Figure 14:
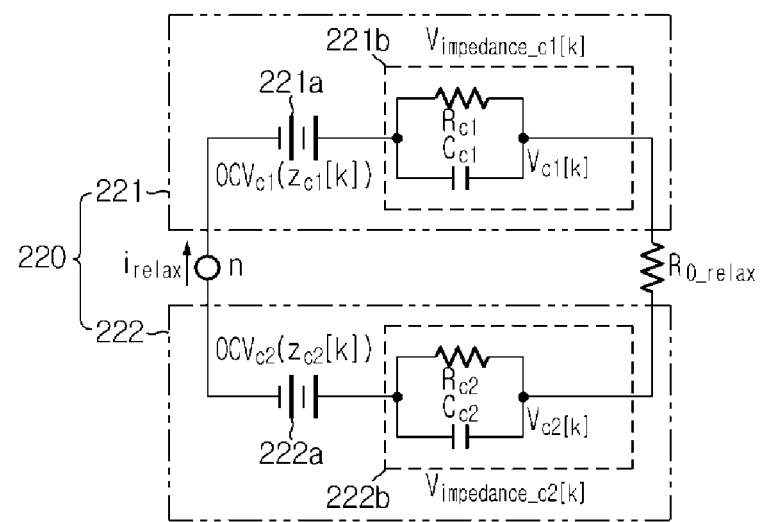
Figure 15:
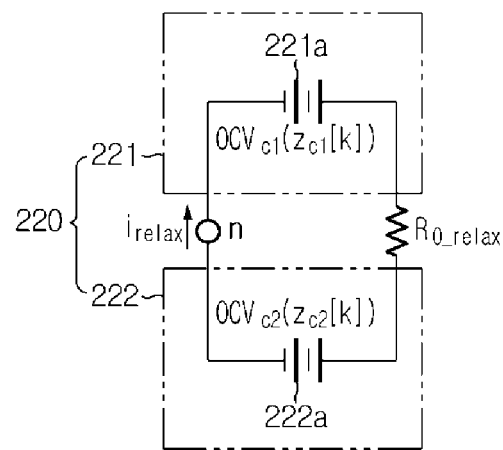

FIGS. 13 to 15 are circuit diagrams exemplarily showing various connection methods of the resistance component $R_{0\_relax}$ in a circuit model for deriving the voltage estimating model.

Referring to FIG. 13, the resistance component $R_{0\_relax}$ may be connected in series between the first and second cathode materials circuit units 221, 222. At this time, the resistance component $R_{0\_relax}$ may be included in the circuit model as a separate resistance component from the resistance components $R_{0\_c1}$ and $R_{0\_c2}$ included in the first and second cathode materials circuit units 221, 222.

Referring to FIG. 14, the resistance component $R_{0\_relax}$ may be connected in series between the first and second cathode materials circuit units 221, 222 and may be included in the circuit model as a resistance component comprising both the resistance components $R_{0\_c1}$ and $R_{0\_c2}$ included in the first and second cathode materials circuit units 221, 222.

Referring to FIG. 15, in the case the first and second cathode materials circuit units 221, 222 do not include an RC circuit, the resistance component $R_{0\_relax}$ may be connected in series between the open-circuit voltage components of the first and second cathode materials circuit units 221, 222.

Meanwhile, the connection method of the resistance component $R_{0\_relax}$ is not limited to the above. Therefore, if the kind of the blended cathode material included in the secondary battery or the configuration of the circuit model changes, the connection method of the resistance component $R_{0\_relax}$ may also be changed, as obvious to those skilled in the art.

Figure 16:
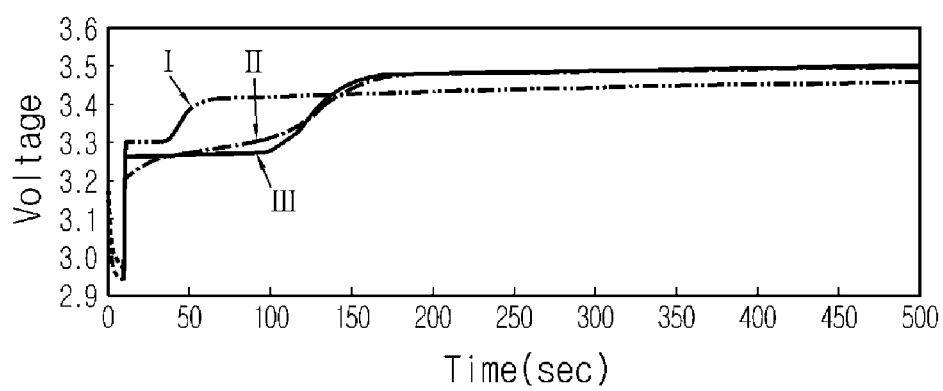
FIG. 16 is a graph showing that a voltage profile estimated by the voltage estimating model may be closely matched with an actual voltage profile when the resistance component ($R_{0\_relax}$) is reflected to the circuit model.

FIG. 16 is a comparative experiment result showing that the accuracy of the voltage estimating model is improved when the resistance component $R_{0\_relax}$ is added to the circuit model.

In FIG. 16, three voltage profiles I, II and III are depicted. The voltage profile I is a voltage profile exemplarily shown in FIG. 12, the voltage profile II is a measured voltage profile of the secondary battery, and the voltage profile III is a voltage profile estimated by using the voltage estimating model derived from a circuit model having the resistance component $R_{0\_relax}$.

Since the resistance component $R_{0\_relax}$ is a resistance component connected in series between the first and second cathode materials circuit units 221, 222, in the equations of the voltage estimating model, if the size of $R_{0\_c1}$ and/or $R_{0\_c2}$ increases in proportion to the resistance component $R_{0\_relax}$, the effects obtained by the addition of the resistance component $R_{0\_relax}$ may be instantly reflected on various equations according to the present disclosure. Therefore, the equations used for obtaining the voltage profile I are used as they are when estimating the voltage profile III, but only the magnitudes of $R_{0\_c1}$ and $R_{0\_c2}$ are suitably increased corresponding to the size of the resistance component $R_{0\_relax}$. In addition, if voltage relaxation occurs, the resistance of the first cathode material rapidly increases. Therefore, when reflecting $R_{0\_relax}$ on $R_{0\_c1}$ and/or $R_{0\_c2}$, the increase of $R_{0\_c1}$ included in the first cathode material circuit unit 221 is set to be greater than the increase of $R_{0\_c2}$. In addition, the increase conditions of $R_{0\_c1}$ and/or $R_{0\_c2}$ applied when estimating the voltage profile III are determined by means of trial and error so as to minimize estimation error of the voltage profile III.

Referring to FIG. 16, it may be found that the voltage profile I is not matched with the voltage profile II but the voltage profile III is very similarly matched with the voltage profile II. This result supports that the accuracy of the voltage estimating model may be improved by adding the resistance component $R_{0\_relax}$ to the circuit model in order to consider the voltage relaxation phenomenon induced when the secondary battery comes to an idle state or a no-load state in the intrinsic voltage range.

Figure 17:
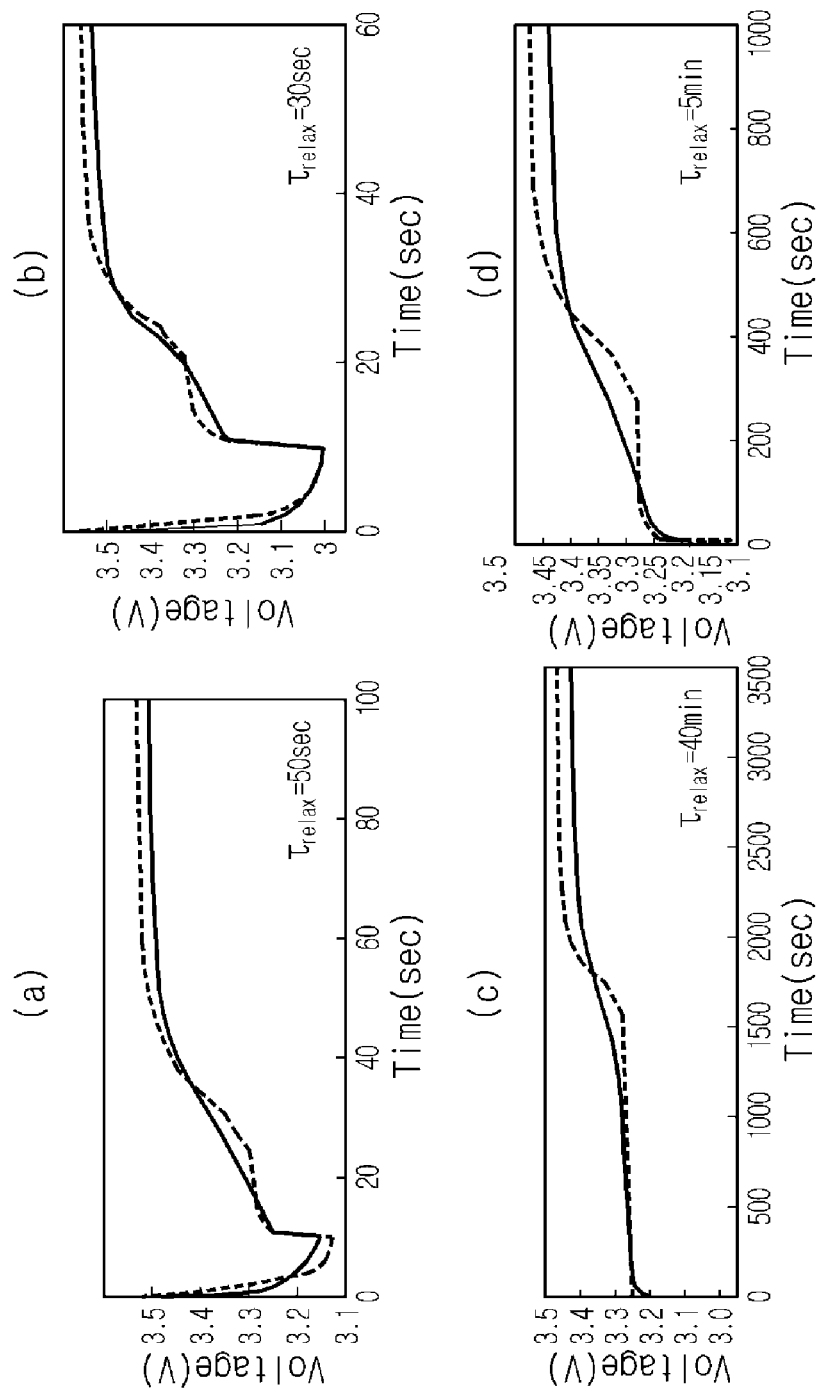
FIG. 17 is a graph showing that a voltage profile matched with various voltage change patterns may be estimated by changing the magnitude of $R_{0\_relax}$ even though the voltage change pattern exhibited due to the occurrence of voltage relaxation varies according to a state or a discharge condition of the secondary battery.

FIG. 17 shows that the voltage profile estimated by the voltage estimating model may be easily matched with an actual voltage profile of the secondary battery even though a voltage relaxation phenomenon is generated at different states or discharge conditions of the secondary battery, if the magnitude of the resistance component $R_{0\_relax}$ is adjusted so as to minimize the estimation error of the voltage profile.

Graphs (a) to (d) shown in FIG. 17 are obtained by applying the following conditions.

graph (a): the secondary battery comes to the no-load state while being pulse-discharged in 2c-rate under the condition that a state of the secondary battery is 0.25 before the pulse-discharging.

graph (b): the secondary battery comes to the no-load state while being pulse-discharged in 5c-rate under the condition that a state of the secondary battery is 0.30 before the pulse-discharging.

graph (c): the secondary battery comes to the no-load state while being pulse-discharged in 5c-rate under the condition that a state of the secondary battery is 0.20 before the pulse-discharging.

graph (d): the secondary battery comes to the no-load state while being pulse-discharged in 2c-rate under the condition that a state of the secondary battery is 0.20 before the pulse-discharging.

In the graphs (a) to (d), dotted lines correspond to estimated voltage profiles of the secondary battery obtained by using the voltage estimating model, and solid lines correspond to measured voltage profiles of the secondary battery.

When obtaining a profile depicted with a dotted line by using the voltage estimating model, the size of $R_{0\_relax}$ is adjusted by increasing $R_{0\_c1}$ and/or $R_{0\_c2}$. In addition, the increase conditions of $R_{0\_c1}$ and/or $R_{0\_c2}$ are determined by means of trial and error.

The graphs (a) to (d) shows that an estimated voltage profile of the secondary battery may be easily matched with a measured profile if the magnitude of $R_{0\_relax}$ is suitably adjusted, even though a state or a discharge condition of the secondary battery changes and so the appearance time (see $\tau_{relax}$) of the inflection point supporting the occurrence of voltage relaxation and the voltage change pattern are changed differently. Therefore, it may be understood that $R_{0\_relax}$ is one of important factors determining the accuracy of the voltage estimating model in the intrinsic voltage range where voltage relaxation occurs.

Meanwhile, as described above with reference to Equation (7), based on a time point just after the secondary battery comes to an idle state or a no-load state (namely, k=0) in the intrinsic voltage range, $R_{0\_relax}$ is proportional to a capacity $(1-z_{c2}[0])$ of operating ions intercalated into the second cathode material and inversely proportional to a residual capacity $(z_{c1}[0])$ of the first cathode material capable of receiving operating ions.

Therefore, $R_{0\_relax}$ may be expressed like Equation (44) below as a function of a parameter $X_{relax}$ which may be expressed by Equation (43) below.

$$X_{relax} = \frac{(1 - z_{c2}[0])Q_{c1}}{z_{c1}[0]Q_{c2}} \quad (43)$$

$$R_{0\_relax} = H(X_{relax}) \quad (44)$$

Assuming that a function using the $X_{relax}$ as an input parameter is H, an embodiment of the function H may be obtained through an experiment below.

First, a measured voltage profile $M_i$ of the secondary battery is obtained for each of a plurality of $SOC_i$ conditions which cause voltage relaxation. After that, an estimated profile $E_i$ capable of being most closely matched with the measured profile $M_i$ is identified by means of trial and error while variously changing the initial conditions $z_{c1}[0]$ and $z_{c2}[0]$ and the resistance component $R_{0\_relax}$ of the voltage estimating model. After that, $\bar{z}_{c1}[0]_i$, $\bar{z}_{c2}[0]_i$, and $\bar{R}_{0\_relax,i}$ used for obtaining the identified estimated profile $E_i$ are determined.

Here, the symbol '-' and the subscript 'i' affixed to the letters of the state parameter z and the resistance parameter R represent that each parameter is an optimal parameter used for obtaining the estimated profile $E_i$. If $\bar{z}_{c1}[0]_i$, $\bar{z}_{c2}[0]_i$, and $\bar{R}_{0\_relax,i}$ are identified as described above, data set $(X_{relax}, R_{0\_relax})_i$ may be obtained for each $SOC_i$ by using Equation (43). If a number of $SOC_i$ sampled in the intrinsic voltage range is n, data sets $(X_{relax}, R_{0\_relax})_i$ [k=1, 2, 3, . . . , n−1, n] may be obtained and the function H may be obtained by numerically analyzing the data sets.

Figure 18:
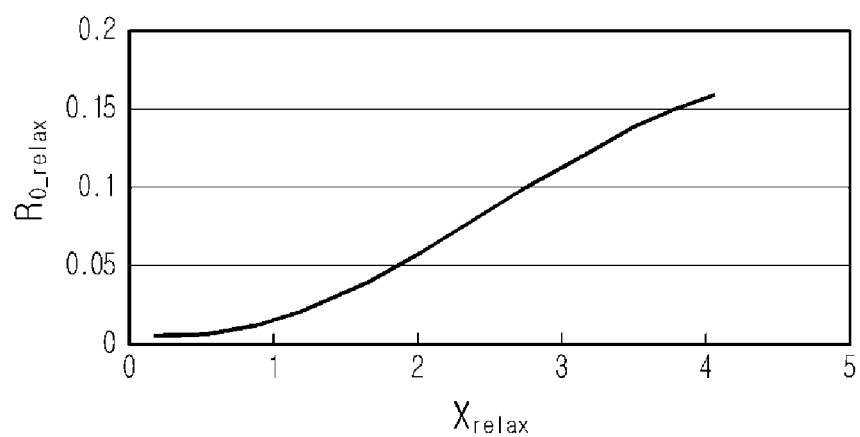
FIG. 18 is a graph showing that the magnitude of the resistance component ($R_{0\_relax}$) may be estimated by using a parameter ($X_{relax}$) defined by states ($z_{c1}$, $z_{c2}$) of first and second cathode materials.

FIG. 18 is a graph showing a changing pattern of an H function, after obtaining the H function with respect to a secondary battery including a blended cathode material where an NMC cathode material and an LFP cathode material are mixed at a ratio of 7:3 (weight ratio). The H function shown in FIG. 18 is a polynomial function which may be expressed like Equation (45) below.

$$R_{0\_relax} = a X_{relax}^3 + b X_{relax}^2 + c X_{relax}^1 + d \quad (45)$$

Constants a, b, c and d of the polynomial function may be specified by numerically analyzing data sets $(X_{relax}, R_{0\_relax})_i$ [k=1, 2, 3, . . . , n−1, n] and may be changed as desired according to the kind of the blended cathode material included in the secondary battery and the circuit model used for deriving the voltage estimating model. In addition, since the H function may be expressed in a way different from the polynomial function according to the numerical analysis method, the present disclosure is not limited to a specific example of the H function. In addition, since the data sets $(X_{relax}, R_{0\_relax})_i$ [k=1, 2, 3, . . . , n−1, n] may be made in a form of a look-up table, the H function should be interpreted as including the look-up table, as obvious to those skilled in the art.

Referring to FIG. 18, it may be understood that $X_{relax}$ and $R_{0\_relax}$ have the same changing tendency. In other words, if $X_{relax}$ increases, $R_{0\_relax}$ also increases, or vice versa. This supports once more that the parameter $R_{0\_relax}$ is proportional to a capacity $(1-z_{c2}[0])$ of operating ions intercalated into the second cathode material and inversely proportional to a residual capacity $(z_{c1}[0])$ of the first cathode material capable of receiving operating ions when the secondary battery comes to an idle state or a no-load state.

Hereinafter, a method for the secondary battery managing apparatus to estimate a state of a secondary battery in the intrinsic voltage range by using a voltage estimating model on which the resistance component $R_{0\_relax}$ is reflected will be described in detail.

Figure 19:
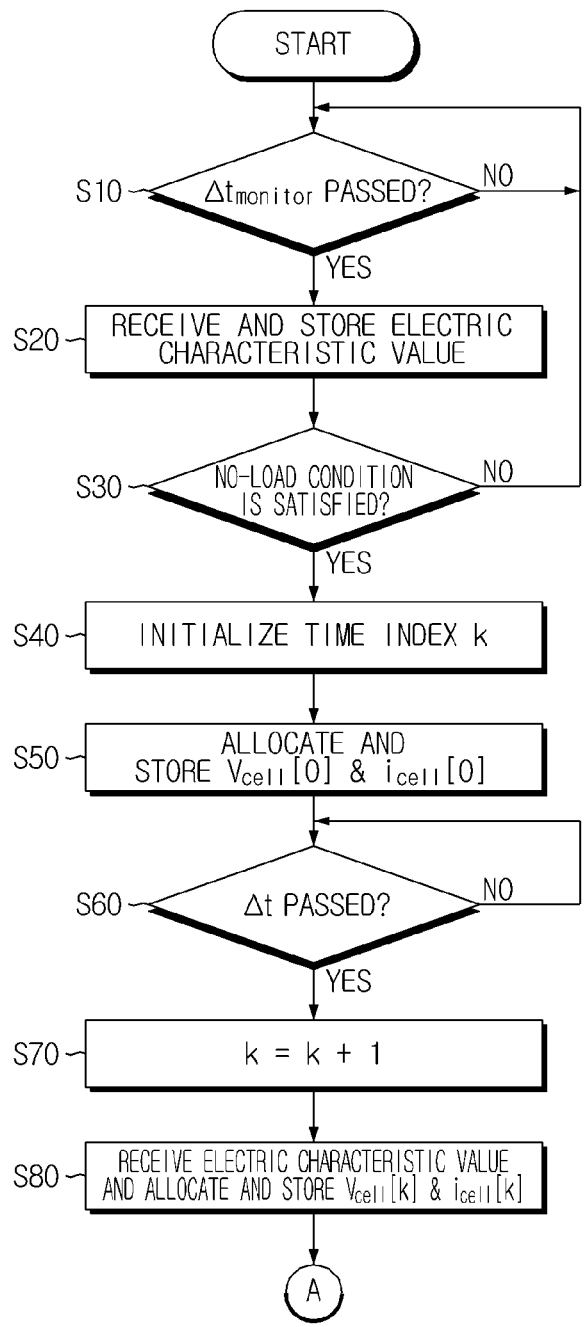
FIGS. 19 and 20 are flowcharts for illustrating a method for managing a secondary battery according to an embodiment of the present disclosure.
Figure 20:
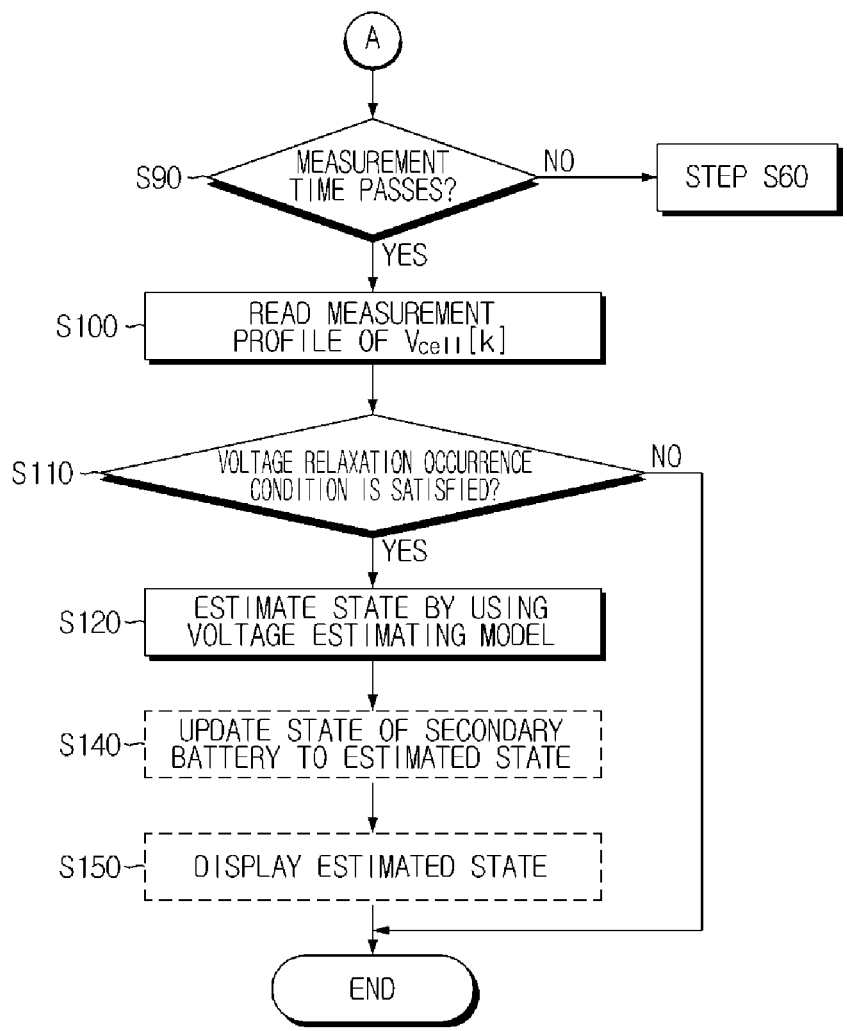

FIGS. 19 and 20 are flowcharts for illustrating a process for the secondary battery managing apparatus to estimate a state of a secondary battery.

Referring to FIGS. 19 and 20 together with FIG. 10, the process of estimating a state of the secondary battery 110 is performed by the sensor 120, the control unit 130 and the storage unit 160 included in the secondary battery managing apparatus.

First, if the secondary battery 110 starts being discharged, the control unit 130 determines whether $\Delta t_{monitor}$ has passed (S10). Here, the $\Delta t_{monitor}$ represents a time interval in which the control unit 130 monitors an electric characteristic of the secondary battery 110 when the secondary battery is being discharged. If it is determined that $\Delta t_{monitor}$ has passed, the control unit 130 receives an electric characteristic of the secondary battery 110, measured by the sensor 120, from the sensor 120 and stores the electric characteristic in the storage unit 160 together with time stamps (S20). Here, the electric characteristic includes at least voltage $V_{cell}$ and discharge current $i_{cell}$ of the secondary battery. In addition, the time stamp means time when the control unit 130 receives the electric characteristic from the sensor 120 or time when data relating to the electric characteristic is stored in the storage unit 160. This concept will be identically used below.

After Step S20, the control unit 130 determines whether the secondary battery 110 comes to an idle state or a no-load state, by using the electric characteristic stored in the storage unit 160 (S30). This determination may be made by using the magnitude of the discharge current $i_{cell}$ of the secondary battery. In other words, if the magnitude of the discharge current $i_{cell}$ decreases substantially to 0 or less than a preset size (for example, several mA), the secondary battery 110 may be regarded as coming to an idle state or a no-load state. Here, when it is determined that the idle or no-load condition is satisfied, the voltage and the discharge current of the secondary battery 110 stored in the storage unit 160 are respectively designated as an initial voltage and an initial current. If it is determined that the idle or no-load condition is not satisfied, the control unit 130 returns the process to Step S10 and then repeats the process of receiving an electric characteristic from the sensor 120 when $\Delta t_{monitor}$ passes and storing the electric characteristic in the storage unit 160. Therefore, if the idle or no-load condition is not satisfied, whenever $\Delta t_{monitor}$ passes, the control unit 130 repeats the process of receiving an electric characteristic of the secondary battery 110 from the sensor 120 and storing the electric characteristic in the storage unit 160 together with a time stamp.

Meanwhile, if it is determined that the idle or no-load condition is satisfied, the control unit 130 executes the next step to initialize a time index k used at the voltage estimating model to 0 (S40). After that, the control unit 130 allocates the initial voltage and the initial current to $V_{cell}[0]$ and $i_{cell}[0]$ and stores the same in the storage unit 160 together with a time stamp (S50).

Subsequently, the control unit 130 determines whether $\Delta t$ has passed. Here, the $\Delta t$ represents a time interval in which the control unit 130 monitors an electric characteristic of the secondary battery 110 after the secondary battery 110 comes to an idle state or a no-load state. If it is determined that $\Delta t$ has passed, the control unit 130 increases the time index k as much as 1 (S70). After that, the control unit 130 receives the electric characteristic of the secondary battery 110, measured by the sensor 120, from the sensor 120, allocates the voltage and current of the secondary battery respectively to $V_{cell}[k]$ and $i_{cell}[k]$ (at the present, k is 1), and then stores the same in the storage unit 160 together with a time stamp (S80).

After that, the control unit 130 determines whether the preset measurement time has passed (S90). In addition, if it is determined that the measurement time has not passed, the control unit 130 returns the process to Step S60 and then repeat the processes of increasing the time index k, receiving the electric characteristic from the sensor 120, allocating the voltage and current of the secondary battery 110 to $V_{cell}[k]$ and $i_{cell}[k]$, and storing the same in the storage unit 160 together with a time stamp, whenever $\Delta t$ passes. Therefore, a plurality of data sets of $V_{cell}[k]$ and $i_{cell}[k]$ are stored in the storage unit 160 together with time stamps before the measurement time passes. Here, a plurality of $V_{cell}[k]$ and time stamps constitute a voltage profile of the secondary battery. Likewise, a plurality of $i_{cell}[k]$ and time stamp constitute a current profile of the secondary battery.

Meanwhile, if it is determined that the preset measurement time has passed in Step S90, the control unit 130 performs the next step to read the measured voltage profile from the storage unit 160 (S100). Here, reading the voltage profile means that a plurality of $V_{cell}[k]$ and time stamps are read out from the storage unit 160 by the control unit 130. After that, the control unit 130 analyzes the voltage profile to determine whether the voltage relaxation occurrence condition described above may be satisfied (S110).

If the voltage relaxation occurrence condition is satisfied, the control unit 130 estimates a state of the secondary battery by using the voltage estimating model described above (S120).

In an embodiment, the control unit 130 may estimate a state of the secondary battery by means of iteration. Here, the term 'iteration' means a method for estimating a state of the secondary battery, in which a plurality of estimated voltage profiles of the secondary battery are obtained while changing parameters $z_{c1}[0]$ and $z_{c2}[0]$ of the initial condition of the voltage estimating model according to the present disclosure and a parameter $R_{0\_relax}$ which should be added to the circuit model when voltage relaxation occurs, an estimated profile most closely matched with the voltage profile read in Step S100 is identified from the plurality of obtained estimated profiles, and initial conditions $z^*_{c1}[0]$ and $z^*_{c2}[0]$ used for obtaining the identified estimated profile are used to estimate a state of the secondary battery by using Equation (46) below.

$$z_{cell} = z^*_{c1}[0]Q^*_{c1} + z^*_{c2}[0]Q^*_{c2} \quad (46)$$

Figure 21:
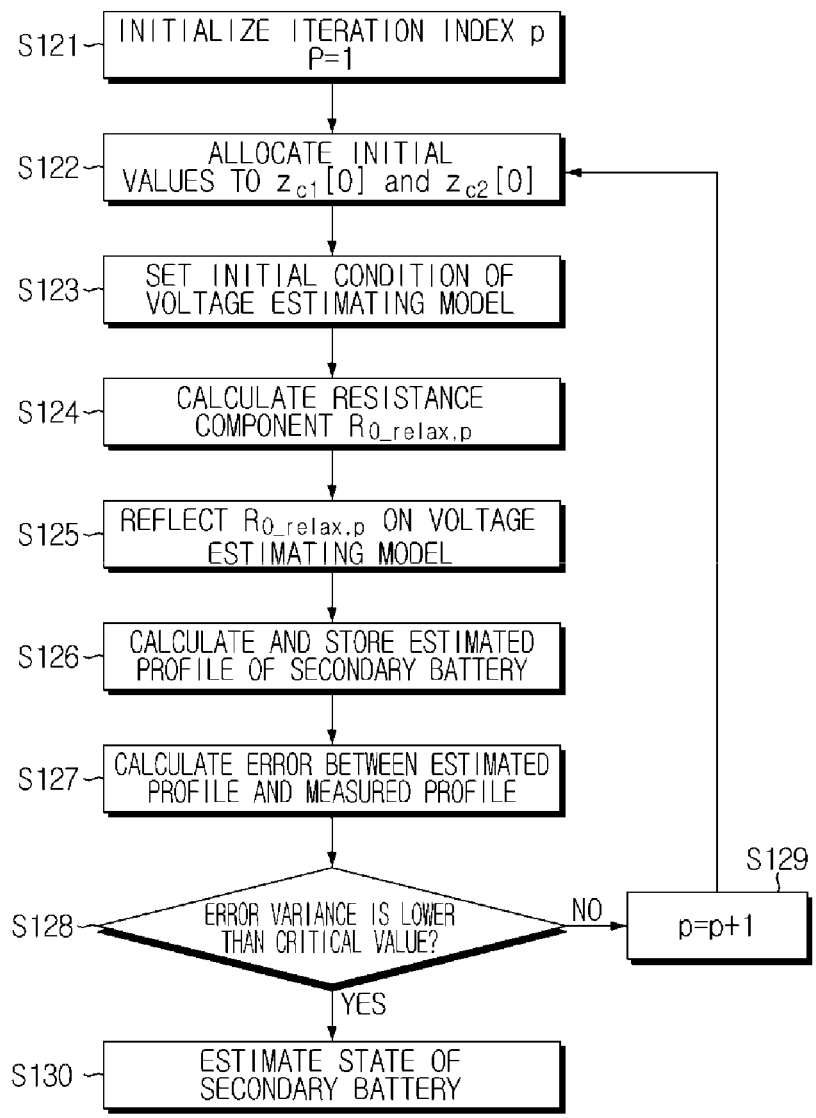
FIG. 21 is a flowchart for illustrating a method for estimating a state of a secondary battery by means of iteration.

FIG. 21 is a flowchart for illustrating a process of estimating a state of the secondary battery by means of iteration according to an embodiment of the present disclosure in more detail.

First, if the process for estimating a state of the secondary battery starts, the control unit 130 initializes an iteration index p to 1 (S121). After that, the control unit 130 allocates initial values $\alpha_1$ and $\beta_1$ to parameters $z_{c1}[0]$ and $z_{c2}[0]$ relating to an amount of operating ions having reacted with the first and second cathode materials, among the initial conditions used for obtaining estimated voltage profiles of the secondary battery by using the voltage estimating model (S122). Subscripts affixed to $\alpha$ and $\beta$ represent iteration indexes.

The $\alpha_1$ and $\beta_1$ may be set arbitrarily. However, considering that the voltage relaxation phenomenon occurs in an early stage when a capacity of the first cathode material capable of reacting with operating ions is significantly used and the second cathode material starts reacting with operating ions, a value very close to 1, for example 0.98, is set to $\beta_1$. In addition, when defining that the state of the secondary battery just before coming to an idle state or a no-load state is $z_{cell\_discharge}$, the control unit 130 may calculate $z_{cell\_discharge}$ by integrating discharge current by means of ampere counting from the time when the secondary battery 110 starts being discharged and may maintain the value in the storage unit 160. In addition, $z_{cell}$ to be estimated by the control unit 130 has a value near to $Z_{cell\_discharge}$. Therefore, $\alpha_1$ is preferably set to be slightly higher or lower than a value which may be obtained as a solution when inputting preset $\beta_1$ and $z_{cell\_discharge}$ to Equation (46) respectively as $z^*_{c2}[0]$ and $z_{cell}$. If $\alpha_1$ is set to be greater than the solution and then a value allocated to $z_{c1}[0]$ is gradually decreased from the next iteration period or if $\alpha_1$ is set to be lower than the solution and then a value allocated to $z_{c1}[0]$ is gradually increased from the next iteration period, the estimated voltage profile of the secondary battery calculated by the voltage estimating model becomes closer to an actually measured voltage profile, and so an approximate estimated profile capable of being matched with the measured voltage profile may be easily identified.

After allocating initial values to $z_{c1}[0]$ and $z_{c2}[0]$, the control unit 130 sets the initial condition of the voltage estimating model as follows (S123). The method of deriving an initial condition of the voltage estimating model has been described above, and not described in detail here.

$$V_{RC\_c2}[0]=V_{RC\_c2}[0]=V_{RC\_a}[0]=0$$

$$z_{c1}[0]=\alpha_1$$

$$z_{c2}[0]=\beta_1$$

$$z_a[0]=z_{cell}[0]=\alpha_1 Q^*_{c1}+\beta_1 Q^*_{c2}$$

In order to reflect a resistance component $R_{0\_relax}$ appearing when voltage relaxation occurs on the voltage estimating model, the control unit 130 calculates $X_{relax,p=1}$ according to Equation (47) below, and quantitatively calculates $R_{0\_relax,p=1}$ by Equation (48) below (S124).

$$X_{relax,p=1} = \frac{(1-\beta_1)Q_{c1}}{\alpha_1 Q_{c2}} \quad (47)$$

$$R_{0_{relax},p=1} = H(X_{relax}) \quad (48)$$

Subsequently, the control unit 130 reflects the resistance component, exhibited when voltage relaxation occurs by increasing the size of resistance component $R_{0\_c1}$ and/or $R_{0\_c2}$ among the parameters included in the equations of the voltage estimating model according to the size of $R_{0\_relax,p=1}$, on the voltage estimating model (S125). The method of reflecting the resistance component on the voltage estimating model has been described above and is not described in detail here.

After that, the control unit 130 calculates an estimated voltage profile of the secondary battery by estimating the voltage $V_{cell}[k]$ of the secondary battery whenever $\Delta t$ passes while increasing the time index k as much as 1 during a predetermined estimation time by using the equations of the voltage estimating model where $R_{0\_relax,p=1}$ is reflected and the initial condition set in S123, and stores the estimated voltage profile in the storage unit 160 (S126). Here, the estimation time and $\Delta t$ parameters may be set to be substantially identical to the measurement time and $\Delta t$ which are parameters used for obtaining a measured voltage profile of the secondary battery. In addition, the method of calculating the estimated profile while increasing the time index k has been described above and is not described in detail here.

After that, the control unit 130 calculates an error present between the measured voltage profile of the secondary battery obtained through Steps S50 to S80 and the estimated voltage profile of the secondary battery obtained in Step S126 (S127). The error may be calculated by using, for example, a root mean square of differences between the measured voltage profile and the estimated voltage profile.

Subsequently, the control unit 130 determines whether an error variance is lower than a critical value (S128). At the present, since the iteration index p is 1, it is impossible to calculate the error variance. Therefore, the error variance is calculated from the point that the iteration index p is 2.

The critical value is set to be a value near to 0. If the error variance decreases lower than the critical value near to 0, this means that an estimated voltage profile of the secondary battery most closely matched with the measured voltage profile is obtained. In other words, an error present between the estimated voltage profile of the secondary battery and the measured voltage profile converges towards a minimal value.

If it is determined that the error variance is not lower than the critical value, the control unit 130 increases the iteration index p as much as 1 (S129). After that, the control unit 130 executes Step S122 to allocate initial values $\alpha_2$ and $\beta_2$ to the parameters $z_{c1}[0]$ and $z_{c2}[0]$ again (S122). Subscripts affixed to $\alpha$ and $\beta$ represent iteration indexes.

Here, the values of $\alpha_2$ and $\beta_2$ may be set based on the values of $\alpha_1$ and $\beta_1$. In an embodiment, the value of $\beta_2$ may be fixed to the value of $\beta_1$, and the value of $\alpha_2$ may be decreased by a predetermined value based on $\alpha_1$. For example, if $\alpha_1$ and $\beta_1$ are respectively 0.30 and 0.98, values of $\alpha_2$ and $\beta_2$ may be respectively set to be 0.295 and 0.98.

The method of setting the values of $\alpha_2$ and $\beta_2$ is not limited to the above. In other words, changing breadth and changing direction of $\alpha_2$ and $\beta_2$ based on $\alpha_1$ and $\beta_1$ may be modified in various ways. In a modified embodiment, the values of $\alpha_2$ and $\beta_2$ may be increased or decreased by a certain value from the values of $\alpha_1$ and $\beta_1$. For example, if the values of $\alpha_1$ and $\beta_1$ are respectively 0.30 and 0.98, the values of $\alpha_2$ and $\beta_2$ may be respectively set to be 0.295 and 0.981. In another modified embodiment, the value of $\alpha_2$ may be fixed to the value of $\alpha_1$, the value of $\beta_2$ may be increased by a predetermined value from the value of 31. For example, if the values of $\alpha_1$ and $\beta_1$ are respectively 0.30 and 0.98, the values of $\alpha_2$ and $\beta_2$ may be respectively set to be 0.30 and 0.981.

If setting the initial values $\alpha_2$ and $\beta_2$ to $z_{c1}[0]$ and $z_{c2}[0]$, the control unit 130 calculates the resistance component $R_{0\_relax,p=2}$ in Step S124 by using the method described above, reflects $R_{0\_relax,p=2}$ on the voltage estimating model in Step S125, obtains an estimated voltage profile of the secondary battery in S126 by using the voltage estimating model where $R_{0\_relax,p=2}$ is reflected, calculates an error between the estimated voltage profile of the secondary battery and the measured voltage profile in Step S127, determines whether the error variance is lower than the critical value in Step S128, increases the iteration index p as much as 1 in S129 if the error variance is not lower than the critical value, and performs the next process loop in the same way as above so that the above procedure is repeated. The error variance decreases as the process loop repeats, and if the iteration loop repeats sufficiently, the error variance decreases to a value near to 0 and eventually lower than the critical value. If the error variance is close to 0, an error present between the estimated voltage profile of the secondary battery and the measured voltage profile becomes minimal, and an estimated voltage profile of the secondary battery approximately matched with the measured voltage profile is obtained.

If it is determined that the error variance decreases lower than the critical value, the control unit 130 considers the estimated profile at this time as an approximate estimated profile most closely matched with the measured voltage profile of the secondary battery, and estimates a state $z_{cell}$ of the secondary battery according to Equation (49) below by using $\alpha_{p^*}$ and $\beta_{p^*}$ allocated to $z_{c1}[0]$ and $z_{c2}[0]$ when obtaining the approximate estimated profile (S130). Here, the subscript 'p*' represents that the values $\alpha$ and $\beta$ are parameters used when obtaining the approximate estimated voltage profile.

$$z_{cell}=\alpha_{p^*}Q^*_{c1}+\beta_{p^*}Q^*_{c2} \quad (49)$$

In an embodiment, if $\alpha_{p*}$ and $\beta_{p*}$ are respectively 0.105 and 0.98 and $Q^*_{c1}$ and $Q^*_{c2}$ are respectively 0.8 and 0.2, the state $z_{cell}$ of the secondary battery becomes 0.28 (28%).

Meanwhile, the control unit 130 may also obtain an approximate estimated profile by using a modified method below, different from the above.

In other words, the control unit 130 may obtain corresponding $R_{0\_relax,p}$ from a plurality of $\alpha_p$ and $\beta_p$ values, obtain the corresponding estimated voltage profiles of the secondary battery by using a plurality of parameters $\alpha_p$, $\beta_p$ and $R_{0\_relax,p}$, identify an approximate estimated profile having a minimal error with the measured voltage profile of the secondary battery from the plurality of obtained estimated profiles, and calculate an estimated value of the state of the secondary battery from the $\alpha_{p*}$ and $\beta_{p*}$ values used for calculating the identified approximate estimated profile. At this time, the method of changing $\alpha_p$ and $\beta_p$ values may adopt the methods employed in the former embodiments, and preferably, values where the $\alpha_p$ and/or $\beta_p$ start and stop changing and the changing width are suitably set so that an approximate estimated profile whose error is near to 0 may be included in the plurality of the estimated profiles.

Figure 22:
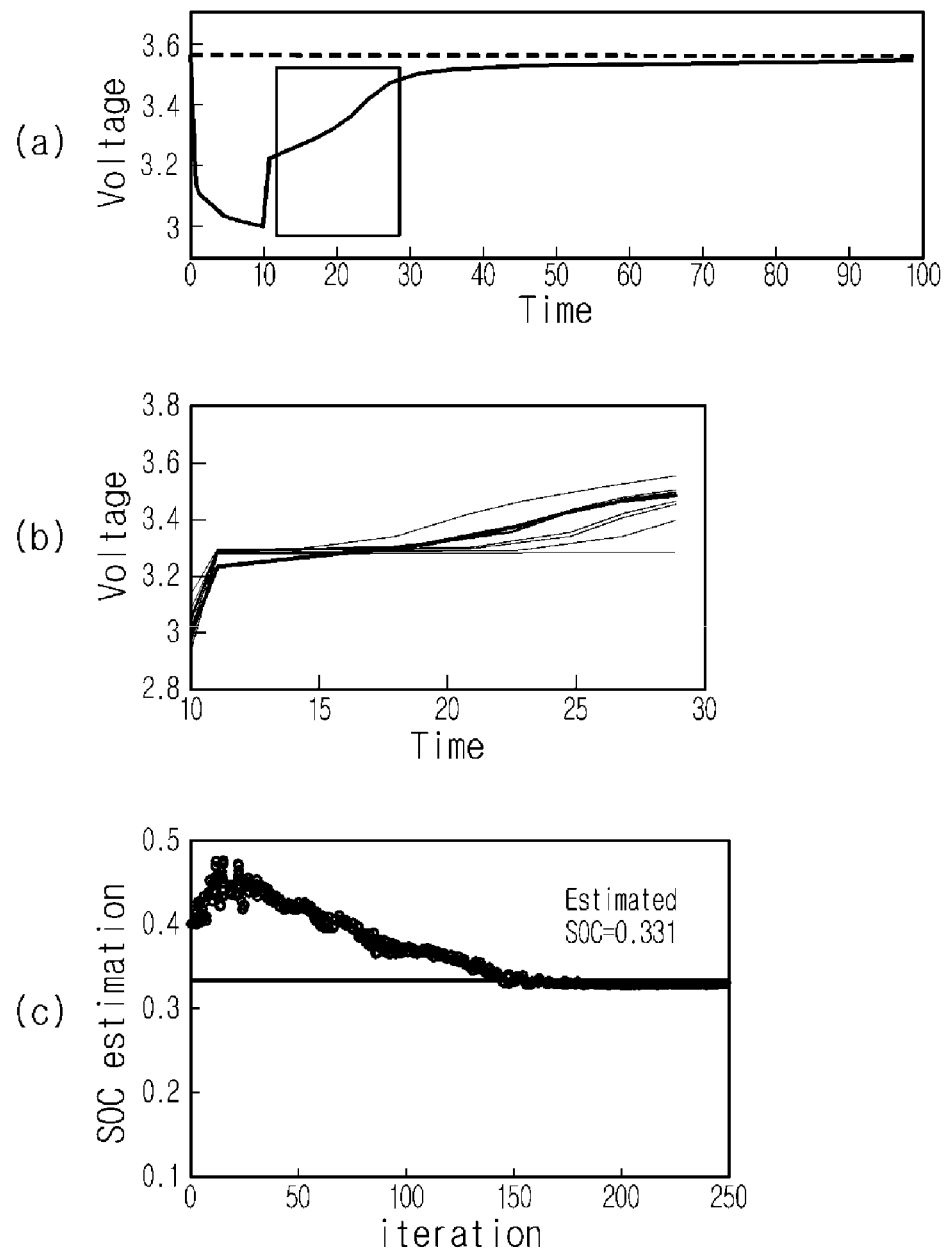
FIG. 22 is a graph showing that the state of a secondary battery estimated according to an embodiment of the present disclosure is closely matched with an actual state of the secondary battery.

FIG. 22 is an experiment result showing that the state of a secondary battery estimated according to the state estimating method as described above may be closely matched with an actual state of the secondary battery.

In this experiment, a secondary battery including a cathode having a blended cathode material where an NFC cathode material and an LFP cathode material are blended at a ratio of 7:3 (weight ratio) and an anode having a carbonaceous anode material was used. The secondary battery was charged until the state $z_{cell}$ becomes 1. After that, the secondary battery was discharged until the state of the secondary battery becomes 0.30 where voltage relaxation may occur. The state of 0.30 is calculated by means of the ampere-counting method. Subsequently, after the secondary battery was left alone for 24 hours, an open-circuit voltage (OCV) was measured and an actual state of the secondary battery was calculated with reference to an OCV-state look-up table. As a result, the secondary battery was checked to have an actual state of 0.333, which has an error of 0.033 (about 10%) from a state value calculated by means of the ampere-counting method. This error is a traditional problem of the ampere-counting method and is caused because measurement errors generated when measuring a discharge current of the secondary battery is accumulated while counting the discharge current.

After checking an actual state of the secondary battery as described above, 5c pulse discharge was performed to the secondary battery for 10 seconds and then stopped so that the secondary battery comes to a no-load state, and the no-load state was maintained after 100 seconds passed. When this no-load shifting experiment was being performed, a voltage of the secondary battery was measured for 100 seconds from the point that the pulse discharge was initiated. The measured voltages are shown as a voltage profile in (a) section of FIG. 22. Referring to the voltage profile, the following features may be checked.

- An inflection point supporting the occurrence of voltage relaxation is located near 20 seconds.
- Since the inflection point is present at the voltage profile, the secondary battery may be regarded as coming to the no-load state in the intrinsic voltage range where voltage relaxation occurs.
- Just after the secondary battery comes to the no-load state, voltage rapidly rises to 3.2V over several seconds, and two voltage rises are made before and after the inflection point. In detail, after the rapid voltage rise, a voltage variance of 250 mV during the two voltage rises is observed for about 20 seconds.
- About 60 seconds are consumed until the voltage of the secondary battery reaches an equilibrium voltage of about 3.5V.
- If a state of the secondary battery is estimated from a OCV-state look-up table while regarding the voltage measured when 30 seconds pass after the starting of the no-load state as an open-circuit voltage of the secondary battery, the estimated state value is 0.27. This state value has a great deviation from an actual state value. Therefore, the state may not be exactly estimated if being calculated by using a voltage of the secondary battery measured at the no-load state, unless the secondary battery maintains the no-load state for a sufficient time.

In this experiment, a plurality of estimated voltage profiles of the secondary battery were obtained by applying the voltage estimation method shown in FIGS. 19 and 20.

The section (b) of FIG. 22 is a graph showing estimated voltage profiles of the secondary battery, calculated while increasing the iteration index p by 1, together with an actually measured voltage profile. In addition, the section (c) of FIG. 22 shows the change of an estimated state of the secondary battery corresponding to each estimated profile according to the increase of the iteration index p, in comparison to the actual state (0.333) of the secondary battery.

As shown in FIG. 22, it may be found that the estimated profiles gradually converge towards the measured voltage profile as the iteration index p increases. In addition, it may also be found that the estimated state corresponding to each estimated profile converges towards the actual state as the iteration index (140 or above) increases. In this experiment, the estimated state converges towards 0.331, and the converging value has an error of just 0.6% in comparison to the actual state of 0.333. This experiment result shows that the present disclosure may accurately estimate a state of a secondary battery substantially in the same level as an actual state.

Figure 23:
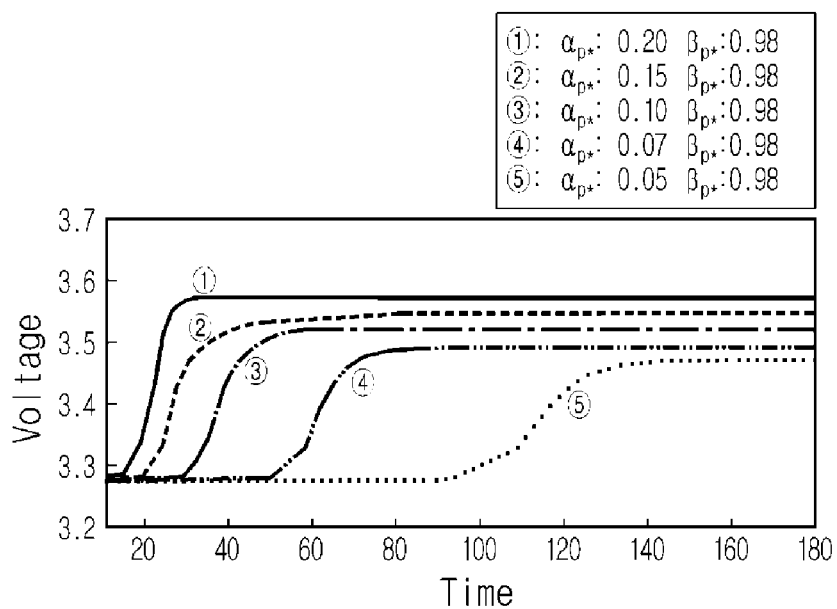
FIG. 23 is a graph showing that initial conditions for states of the first and second cathode materials are important parameters greatly influencing the magnitude of the resistance component ($R_{0\_relax}$) when the state of the secondary battery is estimated according to an embodiment of the present disclosure.

FIG. 23 shows another experiment result supporting the robustness of the state estimating method according to the present disclosure. In this experiment, five actual states of the secondary battery different from each other are reliably measured by using an OCV-state look-up table as described above. Thereafter, initial conditions $\alpha_{p*}$ and $\beta_{p*}$ with respect to each of the five actual states are determined by the method as described above. Here, each of the initial conditions $\alpha_{p*}$ and $\beta_{p*}$ is capable of estimating a state to be matched with an actual state. The five determined $\alpha_{p*}$ and $\beta_{p*}$ values and the estimated voltage profiles of the secondary battery obtained by using the $\alpha_{p*}$ and $\beta_{p*}$ values are shown in FIG. 23. In addition, an estimated SOC value, $SOC_{estimate}$, calculated from each $\alpha_{p*}$ and $\beta_{p*}$ by using the Equation (49), an actual SOC value, $SOC_{real}$, and an error between them are listed in Table 1 below.

TABLE 1

| $\alpha_p^*$ | $\beta_p^*$ | $SOC_{estimate}$ | $SOC_{real}$ | error |
|---|---|---|---|---|
| 0.20 | 0.98 | 0.356 | 0.356 | 0 |
| 0.15 | 0.98 | 0.316 | 0.316 | 0 |
| 0.10 | 0.98 | 0.276 | 0.276 | 0 |
| 0.07 | 0.98 | 0.252 | 0.252 | 0 |
| 0.05 | 0.98 | 0.236 | 0.236 | 0 |

Referring to Table 1, it may be understood that the estimated state value of the secondary battery is closely matched with the actual state value. Therefore, when estimating a state of the secondary battery by using the voltage estimating model described above, it may be understood that $z_{c1}[0]$ and $z_{c2}[0]$ corresponding to initial conditions are important parameters in determining a state of the secondary battery.

In addition, referring to FIG. 23, when $\beta_{p*}$ is fixed to 0.98, it may be understood that the point when an inflection point occurs in the estimated voltage profile of the secondary battery is delayed as $\alpha_{p*}$ decreases. This is because the resistance component $R_{0\_relax}$ increases due to the decrease of $\alpha_{p*}$. When voltage relaxation occurs between the first and second cathode materials, if a residual capacity of operating ions capable of being intercalated into the first cathode material to which operating ions are transferred decreases, the resistance component $R_{0\_relax}$ increases, as described above. Therefore, the changing pattern of the estimated profiles shown in FIG. 23 experimentally supports that the presumption of $R_{0\_relax}$ being inversely proportional to $z_{c1}[0]$ is reasonable.

Meanwhile, according to another embodiment, the control unit 130 may estimate a state of the secondary battery by using a look-up table previously stored in the storage unit 160, instead of the voltage estimating model to which iteration should be applied.

The look-up table may have a data structure which may refer to a state $SOC_{estimate}$ of the secondary battery by a reference parameter. The reference parameter may be at least one parameter selected from the group consisting of a voltage V* of an inflection point occurring in the voltage profile when the secondary battery comes to an idle state or a no-load state in the intrinsic voltage range, time T* taken until the occurrence of the inflection point, a voltage variance amount ΔV* obtained by adding voltage changes during a predetermined time period before and after the inflection point and a first-order differential value $$\left.\frac{dV}{dt}\right)_{t=T^*}$$

calculated at the inflection point.

In order to make the look-up table, a plurality of discharging experiments for the secondary battery is performed in different discharge currents while varying a state of the secondary battery in the intrinsic voltage range. In the experiments, voltage profiles including an inflection point are obtained and then reference parameters V*, T*, ΔV*, $$\left.\frac{dV}{dt}\right)_{t=T^*}$$

of each voltage profile are calculated and stored in the look-up table.

The reference parameter is an element defining a shape of the voltage profile including the inflection point. Therefore, the greater the number of reference parameters are, the shape of the voltage profile may be defined more accurately. Therefore, if the number of reference parameters used for estimating a state of the secondary battery increases, the state of the secondary battery may be estimated more accurately.

Meanwhile, any parameter capable of defining a shape of a voltage profile including an inflection point may be considered as the reference parameter without restriction. For example, a value obtained by integrating a voltage profile between predetermined two points before and after the inflection point, or a first-order or a second-order differential value of voltage profiles calculated at a predetermined point before and/or after the inflection point may also be considered as a reference parameter. Therefore, it should be understood that the present disclosure is not limited to the specific kind or number of reference parameters.

In case of estimating a state of the secondary battery by using the look-up table, the control unit 130 reads the measured voltage profile of the secondary battery stored in the storage unit 160 in Step S100 of FIG. 20, and then calculates at least one reference parameter from the measured voltage profile. Here, the reference parameter includes at least one selected from the group of V*, T, ΔV* and $$\left.\frac{dV}{dt}\right)_{t=T^*}.$$

If the reference parameter is calculated, the control unit 130 estimates a state of the secondary battery corresponding to the reference parameter with reference to the look-up table.

In another embodiment of the present disclosure, correlations between the reference parameters included in the look-up table and states of the secondary battery may be converted into a look-up function. The look-up function means a function which uses at least one reference parameter and a state of the secondary battery corresponding thereto as an input parameter and an out parameter, respectively.

In an embodiment, the look-up function may be expressed like Equation (50) below.

$$SOC_{estimate} = \text{Look\_up}\left(\text{combination}\left\{V^*, T^*, \Delta V^*, \left.\frac{dV}{dt}\right)_{t=T^*}, \ldots \right\}\right) \quad (50)$$

In Equation (50), an operator "combination { }" within the equation (50) is a function which selects at least one of the reference parameters as an input parameter of "Look_up function", and "Look_up function" is a function which outputs a state of the secondary battery corresponding to the reference parameters selected by the operator "combination{ }". The "Look_up function" may be defined differently according to the kind and number of input parameter(s) selected by the operator "combination{ }" and may be derived by numerical analysis of data included in the look-up table. For example, assuming V* and T* as input parameters and $SOC_{estimate,n}$ as an output parameter, if a plurality of data sets for V*, T*, $SOC_{estimate}$ are numerically analyzed, "Look_up function" capable of calculating $SOC_{estimate}$ from V* and T* may be derived.

In case of estimating a state of the secondary battery by using the look-up function, the control unit 130 reads the measured voltage profile of the secondary battery stored in the storage unit 160 in Step S100 of FIG. 20, and then calculates at least one reference parameter from the measured voltage profile. Here, the reference parameter may include at least one selected from the group of V*, T, ΔV* and $$\left.\frac{dV}{dt}\right)_{t=T^*}.$$

After that, the control unit 130 may obtain a state of the secondary battery as an output value by inputting the reference parameter to the look-up function.

If the control unit 130 estimates a state of the secondary battery by using the look-up table or the look-up function, the state of the secondary battery may be accurately estimated in a simple way in comparison to the case where the voltage estimating model is used.

According to another embodiment of the present disclosure, the control unit 130 may analyze a changing pattern of the voltage measured by the sensor 120 in real time by calculating an inflection point parameter whenever the voltage is measured, and then, if the calculated inflection point parameter corresponds to a condition under which voltage relaxation is detected, the control unit may estimate a state of the secondary battery by using the calculated inflection point parameter at that time, a voltage measured when the condition under which voltage relaxation is detected is established, a time when the voltage is measured, or the like.

For example, whenever a voltage is measured by the sensor 120, the control unit 130 may receive the voltage value from the sensor 120 and calculate a first-order differential value or a second-order differential value of the voltage value with respect to the measurement time as an inflection point parameter, and then, if a condition under which the first-order differential value becomes maximum or the second-order differential value becomes zero is established, the control unit may determine the maximum value of the first-order differential value and/or the time taken until the condition is established and/or a voltage when the condition is established as a reference parameter and estimate a state of the secondary battery by using a look-up table or a look-up function defining the relations between a state of the secondary battery and a reference parameter regarding the inflection point in advance. Of course, the look-up table and the look-up function may be obtained by experiments as described above.

Here, the inflection point parameter represents a parameter by which an inflection point may be identified in real time in the changing pattern of a voltage, and the above descriptions are just examples. Therefore, any parameter by which an inflection point occurring in the changing pattern of the voltage measured by the sensor 120 may be identified in real time may be determined as the inflection point parameter.

Meanwhile, in another embodiment of the present disclosure, the control unit 130 may update the state of the secondary battery, estimated before the secondary battery comes to an idle state or a no-load state and stored in the storage unit 160, to the state of the secondary battery estimated according to the method of the present disclosure. This process may be selectively added as Step S140 after Step S120 of FIG. 20. Step S140 is depicted with a dotted line because this step is optional.

As described above, the ampere-counting method widely used for estimating a state of a secondary battery has a measurement error and the error increases as time passes. This problem is not limited to the ampere-counting method, and other kinds of methods for stating a state of a secondary battery known in the art also have similar problems. Therefore, when a secondary battery comes to an idle state or a no-load state in an intrinsic voltage range, the state of the secondary battery may be corrected to a more accurate value by accurately estimating a state of the secondary battery according to the present disclosure and then updating a state value estimated before the secondary battery comes to the idle state or the no-load state to the accurately estimated state value. For example, if an electric vehicle driven by a secondary battery temporarily stops at a traffic signal, which results in the secondary battery shifting to an idle state or a no-load state, a state of the secondary battery may be estimated according to the present disclosure, and a state of the secondary battery estimated by using an ampere-counting method may be updated to the newly estimated state.

In another embodiment of the present disclosure, the control unit 130 may be electrically connected to the display unit 150, and the state of the secondary battery estimated at the idle state or the no-load state may be displayed through the display unit 150, for example as a graphic interface. This process may be selectively added as Step S150 after Step S120 of FIG. 20. Step S150 is depicted with a dotted line because this step is optional.

The display unit 150 may not be included in the secondary battery managing apparatus according to the present disclosure and alternatively may be included in another device connected to the secondary battery managing apparatus. In the latter case, the display unit 150 and the control unit 130 are not directly connected but indirectly connected to the display unit via a control unit included in another device. Therefore, the electric connection between the display unit 150 and the control unit 130 should be understood as including such an indirect connection.

Meanwhile, if the state of the secondary battery estimated by the control unit 130 according to the present disclosure may not be directly displayed through the display unit 150, the state value may be provided to another device including the display unit 150. In this case, the control unit 130 may be connected to another device for allowing data transmission, and another device may receive the state of the secondary battery from the control unit 130 and display the received state value as a graphic interface through the display unit 150 connected thereto.

Figure 24:
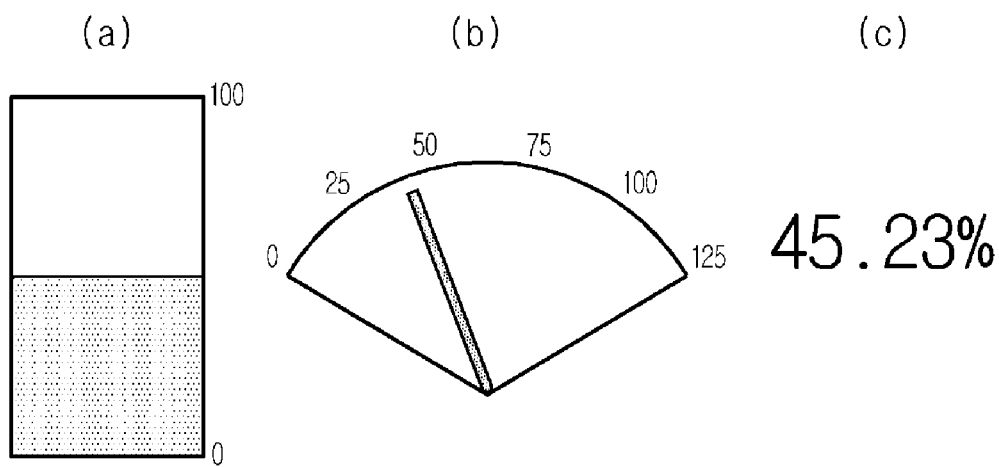
FIG. 24 is a diagram showing various examples of a useable graphic interface to display the state of a secondary battery, estimated according to an embodiment of the present disclosure.

The graphic interface is not specially limited if it may display the state of the secondary battery to the user. FIG. 24 shows various examples of the graphic interface.

As shown in FIG. 24, the graphic interface may adopt (a) displaying the state of the secondary battery with the length of a bar graph, (b) displaying the state of the secondary battery with gauge pointers, (c) displaying the state of the secondary battery with numerals, or the like.

Meanwhile, any combinations of various control logics of the control unit 130 may become embodiments of the secondary battery managing method of the present disclosure. Therefore, the secondary battery managing method will not be described in detail here.

In addition, any combinations of various control logics of the control unit 130 may be composed in computer-readable program codes and recorded in a computer-readable recording medium. The recording medium is not specially limited if it may be accessed by a processor included in a computer. For example, the recording medium includes at least one selected from the group consisting of ROM, RAM, register, CD-ROM, magnetic tape, hard disk, floppy disk and optical data storage. The computer-readable codes may be modulated into carrier signals and included in a communication carrier at a specific time and also be distributed to, stored in and executed by computers connected by a network. The program codes for implementing the combined control logics may be easily inferred by programmers in the art.

All embodiments of the present disclosure may be similarly applied to a case in which the cathode has a single cathode material and the anode has two or more anode materials. In this case, the voltage relaxation may occur when a secondary battery comes to an idle state or a no-load state while being charged in an intrinsic voltage range.

In an embodiment, the anode of the secondary battery may include a first anode material and a second anode material having different operating voltage ranges.

For example, when the secondary battery is in the charge mode, if the secondary battery has a low voltage, operating ions may be mainly intercalated into the second anode material, while if the secondary battery has a high voltage on the contrary, operating ions may be mainly intercalated into the first anode material. In addition, when the secondary battery is in the discharge mode, if the secondary battery has a high voltage, operating ions may be deintercalated from the first anode material, while if the secondary battery has a low voltage on the contrary, operating ions may be deintercalated from the second anode material.

In this case, if the state of a secondary battery in the charge mode starts increasing from 0%, operating ions are mainly intercalated into the second anode material. In addition, if the state of the secondary battery increases until the capacity of the second anode material to which operating ions may be intercalated is mostly used, the resistance of the second anode material rapidly increases, and operating ions start being intercalated into the first anode material. If the secondary battery comes to an idle state or a no-load state after operating ions are intercalated into the first anode material to some extent, a potential difference is created between the first anode material and the second anode material, which may cause a voltage relaxation in which the operating ions intercalated into the first anode material are transferred to the second anode material.

Generally, if the charging process stops, the voltage of the secondary battery exhibit a decreasing pattern while converging toward the open-circuit voltage. However, if a voltage relaxation occurs, the voltage of the secondary battery converges toward the open-circuit voltage while making a voltage profile including an inflection point.

Therefore, if a voltage profile of a secondary battery is measured when the secondary battery in a charge mode shifts to an idle state or a no-load state, a voltage relaxation may be identified from the voltage profile, and optionally a state of the secondary battery may be estimated from the voltage profile by using a voltage estimating model derived from the circuit model.

In order to identify the occurrence of a voltage relaxation, various methods described above may be applied. In addition, the circuit model described above may be easily changed by those skilled in the art in consideration that blended anode materials are included in the anode of the secondary battery and a single cathode material is included in the cathode of the secondary battery. In other words, the circuit model used for deriving the voltage estimating model may be replaced with a circuit model including an anode material circuit unit having a first anode material circuit unit and a second anode material circuit unit and a cathode material circuit unit, and the current flowing on each circuit unit and the voltage formed at a circuit element included in each circuit unit may be reinterpreted in light of charging the secondary battery, as obvious to those skilled in the art.

Further, all embodiments of the present disclosure may also be similarly applied to a case in which blended cathode materials and blended anode materials are respectively included in the cathode and the anode of the secondary battery.

In this case, a voltage relaxation may occur in both the discharge mode and the charge mode. In other words, the voltage relaxation may occur when a secondary battery in the discharge mode comes to an idle state or a no-load state in a voltage range in which a voltage relaxation may occur or when a secondary battery in the charge mode comes to an idle state or a no-load state in a voltage range in which a voltage relaxation may occur.

The voltage relaxation occurring in the discharge mode or the charge mode may be detected by measuring a voltage profile of the secondary battery. In addition, optionally, a state of the secondary battery may be estimated from the measured voltage profile by using the voltage estimating model according to the present disclosure.

The circuit model used for deriving the voltage estimating model may be replaced with a circuit model including an anode material circuit unit having a first anode material circuit unit and a second anode material circuit unit and a cathode material circuit unit having a first cathode material circuit unit and a second cathode material circuit unit, and the current flowing on each circuit unit and the voltage formed at a circuit element included in each circuit unit may be reinterpreted in light of charging or discharging the secondary battery, as obvious to those skilled in the art.

In various embodiments of the present disclosure, components named 'unit' should be understood as functionally distinguishable elements and not physically distinguishable elements. Therefore, each component may be integrated with another component, selectively, or each component may be divided into sub complements for efficient execution of control logic(s). However, even though components are integrated or divided, such integrated or divided components should be interpreted as being within the scope of the present disclosure if their functions are recognized as having substantially the same identity with the present disclosure, as obvious to those skilled in the art.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A battery system, comprising:
   (1) a battery management system (BMS); and
   (2) a secondary battery, comprising: (a) a cathode comprising a first cathode active material and a second cathode active material, wherein the first and second cathode active materials have different operating voltage ranges; (b) an anode; and (c) a separator,
   wherein the BMS is electrically connected to the secondary battery and is configured to detect a voltage relaxation during operation of the battery system, said voltage relaxation including a transfer of operating ions between the first and second cathode active materials when the secondary battery comes to an idle state or a no-load state.

2. The battery system according to claim 1, wherein a constant current or substantially constant current is drawn from the secondary battery when the secondary state comes to an idle state or a no-load state.

3. The battery system according to claim 1, wherein a current less than 1 c-rate is drawn from the secondary battery when the secondary state comes to an idle state or a no-load state.

4. The battery system according to claim 1, wherein a current less than 0.5 c-rate is drawn from the secondary battery when the secondary state comes to an idle state or a no-load state.

5. The battery system according to claim 1, wherein a current less than 0.1 c-rate is drawn from the secondary battery when the secondary state comes to an idle state or a no-load state.

6. The battery system according to claim 1,
wherein the BMS comprises a circuit model, and
wherein the circuit model includes:
an anode material circuit unit comprising an open-circuit voltage component and optionally an impedance voltage component of the anode material; and
a cathode material circuit unit comprising a first cathode material circuit unit comprising an open-circuit voltage component and an impedance voltage component of the first cathode material and a second cathode material circuit unit comprising an open-circuit voltage component and an impedance voltage component of the second cathode material.

7. The battery system according to claim 6, wherein the anode material circuit unit and the cathode material circuit unit are connected to each other in series, and the first and second cathode material circuit units are connected to each other in parallel.

8. The battery system according to claim 6, wherein each impedance voltage component comprises a circuit element selected from the group consisting of one or more resistance component, one or more capacity component, one or more inductor component and combinations thereof.

9. The battery system according to claim 6,
wherein each impedance voltage component includes a plurality of circuit elements, and
wherein the plurality of circuit elements are connected in series and/or in parallel.

10. The battery system according to claim 6, wherein the anode material includes at least one impedance voltage component.

11. The battery system according to claim 6, wherein each impedance voltage component comprises one or more circuit component selected from the group consisting of at least one RC circuit and at least one resistor.

12. The battery system according to claim 11, wherein each impedance voltage component comprises a RC circuit and a resistor connected thereto in series.

13. The battery system according to claim 11, wherein the voltage component formed by the RC circuit is calculated from the following equation expressed as a discrete time equation:

$$V[k+1] = V[k]e^{-\frac{\Delta t}{RC}} + R(1-e^{-\frac{\Delta t}{RC}})i[k]$$

wherein k is a time index, R and C are a resistance and a capacitance of a resistor and a capacitor included in the RC circuit, respectively, and V and i are a voltage and a current of the RC circuit, respectively.

14. The battery system according to claim 1, wherein at least one of the first and second cathode materials has a voltage profile with a plateau portion, wherein said plateau portion has a substantially constant voltage.

15. The battery system according to claim 1,
wherein the first cathode material comprises an alkali metal compound expressed by a general chemical formula $A[A_xM_y]O_{2+z}$ wherein A is at least one of Li, Na and K; M is at least one element selected from the group consisting of Ni, Co, Mn, Ca, Mg, Al, Ti, Si, Fe, Mo, V, Zr, Zn, Cu, Al, Mo, Sc, Zr, Ru and Cr; $x\geq 0$, $1\leq x+y\leq 2$, $-0.1\leq z\leq 2$; and x, y, z and stoichiometric coefficients of components included in M are selected so that the alkali metal compound maintains electrical neutrality or $xLiM^1O_2\text{—}(1-x)LiM^2O_3$ wherein $M^1$ includes at least one element with an average oxidation state of +3; $M^2$ includes at least one element with an average oxidation state of +4; and $0\leq x\leq 1$, and selectively coated with a carbon layer, an oxide layer or a fluoride layer.

16. The battery system according to claim 15,
wherein the first cathode material comprises an alkali metal compound expressed by $Li[Li_aNi_bCo_cMn_d]O_{2+z}$ ($a\geq 0$; $a+b+c+d=1$; at least one of b, c and d is not zero; $-0.1\leq z\leq 2$) and selectively coated with a carbon layer, an oxide layer or a fluoride layer.

17. The battery system according to claim 1,
wherein the second cathode material comprises lithium metal phosphate expressed by a general chemical formula $Li_aM^1{}_xFe_{1-x}M^2{}_yP_{1-y}M^3{}_zO_{4-z}$ wherein $M^1$ is at least one element selected from the group consisting of Ti, Si, Mn, Co, V, Cr, Mo, Fe, Ni, Nd, Al, Mg and Al; $M^2$ is at least one element selected from the group consisting of Ti, Si, Mn, Co, V, Cr, Mo, Fe, Ni, Nd, Al, Mg, Al, As, Sb, Si, Ge, V and S; $M^3$ is at least one element selected from a halogen group containing F; $0<a\leq 2$, $0\leq x\leq 1$, $0\leq y\leq 1$, $0\leq z\leq 1$; and a, x, y, z, and stoichiometric coefficients of components included in $M^1$, $M^2$, and $M^3$ are selected so that the lithium metal phosphate maintains electrical neutrality or $Li_3M_2(PO_4)_3$ wherein M is at least one element selected from the group consisting of Ti, Si, Mn, Fe, Co, V, Cr, Mo, Ni, Al, Mg and Al, and selectively coated with a carbon layer, an oxide layer or a fluoride layer.

18. The secondary battery according to claim 17,
wherein the second cathode material comprises at least one selected from the group consisting of $LiFePO_4$, $LiMn_xFe_yPO_4$ ($0<x+y\leq 1$), $Li_3Fe_2(PO_4)_3$, $LiFePO_4$ coated with a carbon layer, an oxide layer or a fluoride layer, $LiMn_xFe_yPO_4$ ($0<x+y\leq 1$) coated with a carbon layer, an oxide layer or a fluoride layer, and $Li_3Fe_2(PO_4)_3$ coated with a carbon layer, an oxide layer or a fluoride layer.

19. A battery system, comprising:
(1) a battery management system (BMS); and
(2) a secondary battery, comprising: (a) a cathode comprising a first cathode material and a second cathode material, wherein the first and second cathode materials have different operating voltage ranges; (b) an anode; and (c) a separator,
wherein the BMS is electrically connected to the secondary battery and is configured to detect a two-stage voltage relaxation from the change of voltage of the secondary battery during operation of the battery system when the secondary battery comes to an idle state or a no-load state.

20. The battery system according to claim 19, wherein the BMS monitors the voltage of the secondary battery according to time and detects the two-stage voltage relaxation when the occurrence of an inflection point is identified in a changing pattern of the voltage.

21. The battery system according to claim 20, wherein the BMS identifies the occurrence of an inflection point by analyzing a voltage profile of the secondary battery.

22. The battery system according to claim 20, wherein the BMS identifies the occurrence of an inflection point by analyzing the changing pattern of the voltage of the secondary battery in real time.

23. The battery system according to claim 20, wherein the BMS identifies the occurrence of an inflection point by using a first-order differential value or a second-order differential value of the voltage of the secondary battery with respect to time.

24. The battery system according to claim 20,
wherein the BMS determines a reference parameter including a voltage corresponding to the inflection point, a time corresponding to the inflection point, a first-order differential value with respect to time calculated at the inflection point, a value obtained by integrating the voltage profile between predetermined two points before and after the inflection point, a first-order differential value or second-order differential value of the voltage profile calculated at a predetermined point before and/or after the inflection point with respect to time, or combinations thereof, and
wherein a state of the secondary battery corresponding to the determined reference parameter is estimated by using a predetermined relationship between the reference parameter and the state of the secondary battery.

25. The battery system according to claim 24, wherein the predetermined relationship is a look-up table which is capable of mapping a state of the secondary battery by means of at least one reference parameter.

26. The battery system according to claim 24, wherein the predetermined relationship is a look-up function where at least one reference parameter and a state of the secondary battery corresponding thereto are respectively defined as an input parameter and an output parameter.

* * * * *